(12) United States Patent
Kobayashi et al.

(10) Patent No.: US 10,964,902 B2
(45) Date of Patent: Mar. 30, 2021

(54) FILM PRODUCTION METHOD

(71) Applicant: Sumitomo Chemical Company, Limited, Tokyo (JP)

(72) Inventors: Satoshi Kobayashi, Tsukuba (JP); Makoto Anryu, Tokyo (JP); Mika Shirasaki, Tsukuba (JP); Hiroyuki Hayasaka, Osaka (JP); Toshiaki Sasada, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 130 days.

(21) Appl. No.: 16/069,571

(22) PCT Filed: Jan. 19, 2017

(86) PCT No.: PCT/JP2017/001722
§ 371 (c)(1),
(2) Date: Jul. 12, 2018

(87) PCT Pub. No.: WO2017/130828
PCT Pub. Date: Aug. 3, 2017

(65) Prior Publication Data
US 2019/0019970 A1    Jan. 17, 2019

(30) Foreign Application Priority Data
Jan. 28, 2016 (JP) .............................. JP2016-014050

(51) Int. Cl.
*H01L 51/50* (2006.01)
*C09K 11/06* (2006.01)
*H01L 51/00* (2006.01)
*H05B 33/10* (2006.01)

(52) U.S. Cl.
CPC .......... *H01L 51/5012* (2013.01); *C09K 11/06* (2013.01); *H01L 51/0007* (2013.01); *H01L 51/50* (2013.01); *H01L 51/5056* (2013.01); *H01L 51/5072* (2013.01); *H05B 33/10* (2013.01); *C09K 2211/1007* (2013.01); *C09K 2211/1029* (2013.01); *C09K 2211/1059* (2013.01); *C09K 2211/185* (2013.01)

(58) Field of Classification Search
CPC ............. H01L 51/0012; H01L 51/0085; H01L 51/0087
See application file for complete search history.

(56) References Cited

U.S. PATENT DOCUMENTS 8,568,183 B2 * 10/2013 Tanaka ................ H01L 51/0005
445/24
2009/0066223 A1    3/2009 Yabe et al.
2011/0204344 A1 *  8/2011 Kakimoto ........... H01L 51/0007
257/40
2013/0043784 A1 *  2/2013 Tanaka ................ H01L 51/0005
313/504
2017/0237036 A1    8/2017 Ueoka et al.

FOREIGN PATENT DOCUMENTS

| EP | 2557898 A1 | 2/2013 |
|---|---|---|
| EP | 3136462 A1 | 3/2017 |
| JP | 2002170677 A | 6/2002 |
| JP | 2005135734 A | 5/2005 |
| JP | 2005324165 A | 11/2005 |
| JP | 2006257409 A | 9/2006 |
| JP | 2010184876 A | 8/2010 |
| JP | 2011165658 A | 8/2011 |
| JP | 2011233516 A | 11/2011 |
| JP | 2013147551 A | 8/2013 |
| JP | 2013147551 A * | 8/2013 |
| JP | 2015063662 A | 4/2015 |
| JP | 2015110751 A | 6/2015 |
| WO | 2012043774 A1 | 4/2012 |
| WO | 2014203540 A1 | 12/2014 |
| WO | 2015163174 A1 | 10/2015 |
| WO | 2016021520 A1 | 2/2016 |

OTHER PUBLICATIONS

JP2013147551, Machine Translation. (Year: 2013).*
Extended European Search Report dated Jul. 2, 2019 in EP Application No. 17744058.3.
Office Action dated Jul. 24, 2019 in JP Application No. 2018141011.
Int'l Search Report dated Mar. 28, 2017 in Int'l Application No. PCT/JP2017/001722.
Int'l Preliminary Report on Patentability dated Jul. 31, 2018 in Int'l Application No. PCT/JP2017/001722.
Notice of Opposition dated Jul. 14, 2020 in JP Application No. 2020700447.
Office Action dated Aug. 6, 2020 in TW Application No. 106102392.
Office Action issued Sep. 7, 2020 in JP Application No. 2020700447.

* cited by examiner

*Primary Examiner* — Robert A Vetere
(74) *Attorney, Agent, or Firm* — Panitch Schwarze Belisario & Nadel LLP

(57) ABSTRACT

A method of producing a film having excellent external quantum efficiency when used in a light emitting layer of a light emitting device is provided. A method of film production includes preparing an ink containing a specific metal complex, storing the ink for 3 days or more under light shielding, and forming a film by using the stored ink. The total content of metal complexes having a molecular weight larger by 16, 32 or 48 than that of the specific metal complex according to an area percentage value determined by liquid chromatography is 0.6 or less when the content of the specific metal complex is taken as 100.

6 Claims, No Drawings

FILM PRODUCTION METHOD

CROSS-REFERENCE TO RELATED APPLICATION

This application is a Section 371 of International Application No. PCT/JP2017/001722, filed Jan. 19, 2017, which was published in the Japanese language on Aug. 3, 2017 under International Publication No. WO 2017/130828 A1, which claims priority under 35 U.S.C. § 119(b) to Japanese Application No. 2016-014050, filed Jan. 28, 2016, the disclosures of which are incorporated herein by reference in their entirety.

TECHNICAL FIELD

The present invention relates to a film production method using an ink comprising a metal complex and an organic solvent, and the like.

BACKGROUND ART

Light emitting devices such as an organic electroluminescent device can be suitably used in applications of display and illumination because of properties such as high external quantum efficiency and low voltage driving. As the light emitting material used for a light emitting layer of a light emitting device, for example, a phosphorescent metal complex which shows light emission from the triplet excited state is known.

As a method of forming a film to be a light emitting layer of a light emitting device, an application method using a solvent is advantageous from the standpoint of simplification of a production process for a large area device and reduction of the production cost. On the other hand, it is known that if oxygen is present in an ink comprising a phosphorescent metal complex used in an application method, the light emitting property is deteriorated (Patent Document 1).

PRIOR ART DOCUMENT

Patent Document

[Patent Document 1] Japanese Unexamined Patent Publication No. 2002-170677

SUMMARY OF THE INVENTION

Problem to be Solved by the Invention

Depending on the phosphorescent metal complex, however, even if oxygen contained in the ink is only reduced by an deoxygenation treatment, the external quantum efficiency of a light emitting device comprising a film (light emitting layer) obtained by using the ink is not sufficient.

Then, the present invention is intended to provide a method of producing a film excellent in the external quantum efficiency when used in a light emitting layer of a light emitting device, and the like.

Means for Solving the Problem

The present invention provides the following [1] to [15].
[1] A film production method comprising an ink preparation step of preparing an ink comprising a metal complex represented by the formula (1-A) or the formula (1-B), and an organic solvent, an ink storage step of storing the ink prepared in the ink preparation step for 3 days or more under light shielding, and a film formation step of forming a film by an application method using the ink stored in the ink storage step and in which the total content of metal complexes having a molecular weight larger by 16, 32 or 48 than that of the metal complex represented by the formula (1-A) or the formula (1-B) according to the area percentage value determined by liquid chromatography is 0.6 or less when the content of the metal complex represented by the formula (1-A) or the formula (1-B) according to the area percentage value determined by liquid chromatography is taken as 100:

[Chemical Formula 1]

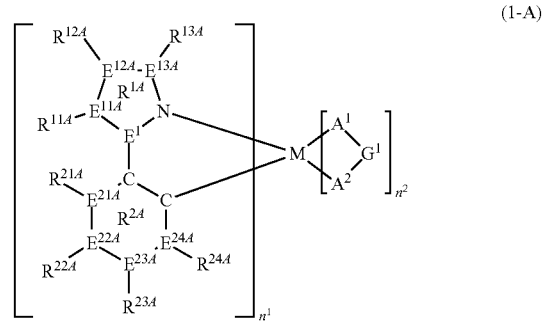

(1-A)

[wherein,

M represents an iridium atom or a platinum atom.

$n^1$ represents an integer of 1 or more, $n^2$ represents an integer of 0 or more, and $n^1+n^2$ is 2 or 3. $n^1+n^2$ is 3 when M is an iridium atom, while $n^1+n^2$ is 2 when M is a platinum atom.

$E^1$ represents a carbon atom or a nitrogen atom. When a plurality of $E^1$ are present, they may be the same or different. $E^{11A}$, $E^{12A}$, $E^{13A}$, $E^{21A}$, $E^{22A}$, $E^{23A}$ and $E^{24A}$ each independently represent a nitrogen atom or a carbon atom. When a plurality of $E^{11A}$, $E^{12A}$, $E^{13A}$, $E^{21A}$, $E^{22A}$, $E^{23A}$ and $E^{24A}$ are present, they may be the same or different at each occurrence. When $E^{11A}$ is a nitrogen atom, $R^{11A}$ may be either present or not present. When $E^{12A}$ is a nitrogen atom, $R^{12A}$ may be either present or not present. When $E^{13A}$ is a nitrogen atom, $R^{13A}$ may be either present or not present. When $E^{21A}$ is a nitrogen atom, $R^{21A}$ is not present. When $E^{22A}$ is a nitrogen atom, $R^{22A}$ is not present. When $E^{23A}$ is a nitrogen atom, $R^{23A}$ is not present. When $E^{24A}$ is a nitrogen atom, $R^{24A}$ is not present.

$R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, or $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each are combined together to form an aromatic ring together with the atoms to which they are attached. The group represented by $R^{11A}$, $R^{12A}$, $R^{13A}$, $R^{21A}$, $R^{22A}$, $R^{23A}$ or $R^{24A}$ optionally has a substituent. When a plurality of $R^{13A}$, $R^{12A}$, $R^{13A}$, $R^{21A}$, $R^{22A}$, $R^{23A}$ and $R^{24A}$ are present, they may be the same or different at each occurrence. $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with the atoms to which they are attached.

The ring $R^{1A}$ represents a diazole ring or a triazole ring constituted of a nitrogen atom, $E^1$, $E^{1A}$, $E^{12A}$ and $E^{13A}$.

The ring $R^{2A}$ represents a benzene ring, a pyridine ring or a diazine ring constituted of two carbon atoms, $E^{23A}$, $E^{2A}$, $E^{23A}$ and $E^{24A}$.

$A^1$-$G^1$-$A^2$ represents an anionic bidentate ligand, $A^1$ and $A^2$ each independently represent a carbon atom, an oxygen atom or a nitrogen atom, and these atoms each may be an atom constituting a ring. $G^1$ represents a single bond or an atomic group constituting the bidentate ligand together with $A^1$ and $A^2$. When a plurality of $A^1$-$G^1$-$A^2$ are present, they may be the same or different.]

[Chemical Formula 2]

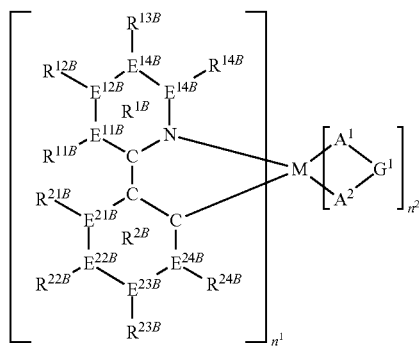

(1-B)

[wherein,

M, $n^1$, $n^2$ and $A^1$-$G^1$-$A^2$ represent the same meaning as described above.

$E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom. When a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence. When $E^{11B}$ is a nitrogen atom, $R^{11B}$ is not present. When $E^{12B}$ is a nitrogen atom, $R^{12B}$ is not present. When $E^{13B}$ is a nitrogen atom, $R^{13B}$ is not present. When $E^{14B}$ is a nitrogen atom, $R^{14B}$ is not present. When $E^{21B}$ is a nitrogen atom, $R^{21B}$ is not present. When $E^{22B}$ is a nitrogen atom, $R^{22B}$ is not present. When $E^{23B}$ is a nitrogen atom, $R^{23B}$ is not present. When $E^{24B}$ is a nitrogen atom, $R^{24B}$ is not present.

$R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, or $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each are combined together to form an aromatic ring together with the atoms to which they are attached. The group represented by $R^{11B}$, $R^{12B}$, $R^{13B}$, $R^{14B}$, $R^{21B}$, $R^{22B}$, $R^{23B}$ or $R^{24B}$ optionally has a substituent. When a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence. $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with the atoms to which they are attached.

The ring $R^{1B}$ represents a pyridine ring or a diazine ring constituted of a nitrogen atom, a carbon atom, $E^{11B}$, $E^{12B}$, $E^{13B}$ and $E^{14B}$.

The ring $R^{2B}$ represents a benzene ring, a pyridine ring or a diazine ring constituted of two carbon atoms, $E^{21B}$, $E^{22B}$, $E^{23B}$ and $E^{24B}$.]

[2] The film production method according to [1], wherein the ink storage step is performed under the condition of 0° C. to 50° C.

[3] The film production method according to [1] or [2], wherein the ink storage step is performed under an inert gas atmosphere.

[4] The film production method according to any one of [1] to [3], wherein the metal complex (1-A) is a metal complex represented by the formula (1-A1), a metal complex represented by the formula (1-A2), a metal complex represented by the formula (1-A3) or a metal complex represented by the formula (1-A4):

[Chemical Formula 3]

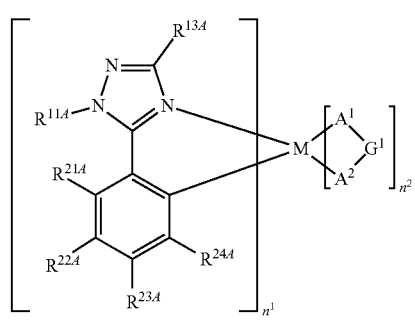

(1-A1)

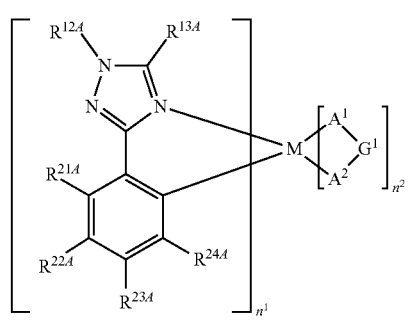

(1-A2)

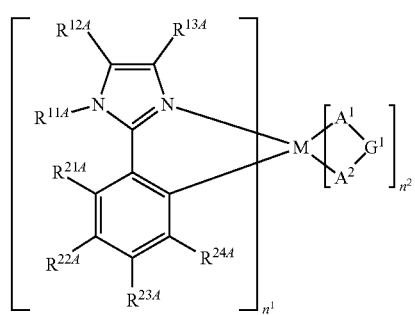

(1-A3)

-continued

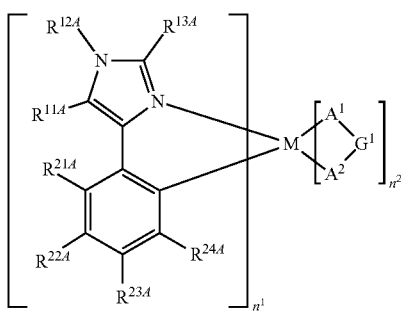
(1-A4)

[wherein,

M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.].

[5] The film production method according to any one of [1] to [3], wherein the metal complex (1-B) is a metal complex represented by the formula (1-B1), a metal complex represented by the formula (1-B2) or a metal complex represented by the formula (1-B3):

[Chemical Formula 4]

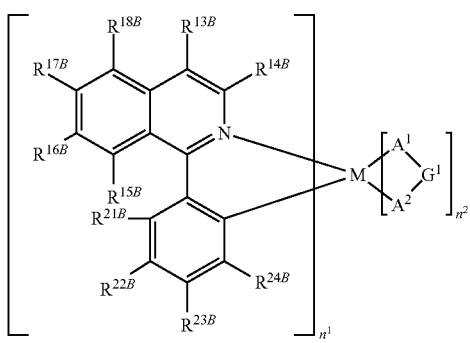
(1-B1)

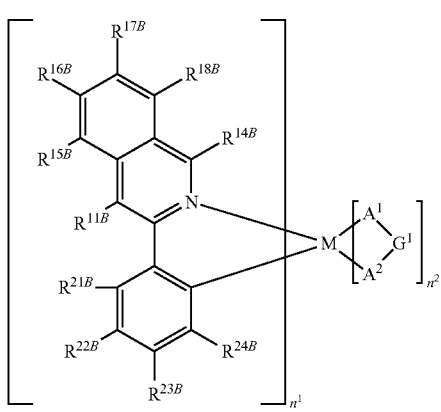
(1-B2)

-continued

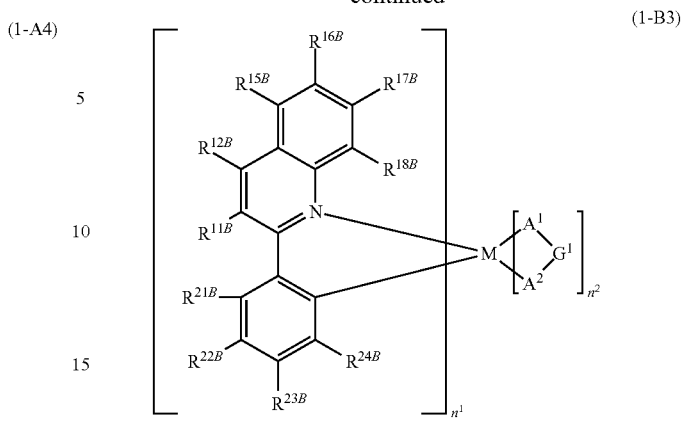
(1-B3)

[wherein,

M, $n^1$, $n^2$, $R^{11B}$, $R^{12B}$, $R^{13B}$, $R^{14B}$, $R^{21B}$, $R^{22B}$, $R^{23B}$, $R^{24B}$ and $A^1$-$G^1$-$A^2$ represent the same or meaning as described above.

$R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality of $R^{15B}$, $R^{16B}$, $R^{17B}$ and $R^{18B}$ are present, they may be the same or different at each occurrence.].

[6] The film production method according to any one of [1] to [5], wherein the ink further comprises a compound represented by the formula (H-1):

[Chemical Formula 5]

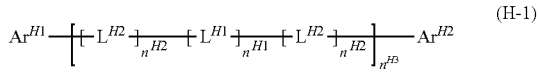
(H-1)

[wherein, $Ar^{H1}$ and $Ar^{H2}$ each independently represent an aryl group or a monovalent heterocyclic group, and these groups each optionally have a substituent.

$n^{H1}$ and $n^{H2}$ each independently represent 0 or 1. When a plurality of $n^{H1}$ are present, they may be the same or different. The plurality of $n^{H2}$ may be the same or different.

$n^{H3}$ represents an integer of 0 to 10.

$L^{H1}$ represents an arylene group, a divalent heterocyclic group or a group represented by —[C($R^{H11}$)$_2$]$n^{H11}$-, and these groups each optionally have a substituent. When a plurality of $L^{H1}$ are present, they may be the same or different.

$n^{H11}$ represents an integer of 1 to 10. $R^{H11}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{H11}$ may be the same or different and may be combined together to form a ring together with the carbon atoms to which they are attached.

$L^{H2}$ represents a group represented by —N(-$L^{H21}$-$R^{H21}$)—. When a plurality of $L^{H2}$ are present, they may be the same or different.

$L^{H21}$ represents a single bond, an arylene group or a divalent heterocyclic group, and these groups each optionally have a substituent. $R^{H21}$ represents a hydrogen atom, an alkyl group, a cycloalkyl group, an aryl group or a monovalent heterocyclic group, and these groups each optionally have a substituent.].

[7] The film production method according to any one of [1] to [5], wherein the ink further comprises a polymer compound comprising a constitutional unit represented by the formula (Y):

[Chemical Formula 6]

 (Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.].

[8] An ink storage method comprising
an ink preparation step of preparing an ink comprising a metal complex represented by the above-described formula (1-A) or the above-described formula (1-B), and an organic solvent, and
a storage step of storing the ink prepared in the above-described ink preparation step for 3 days or more,
wherein the content of the metal complex represented by the above-described formula (1-A) or formula (1-B) in the ink immediately after preparation of the ink preparation step is defined as Cb[M], the total content of metal complexes having a molecular weight larger by 16, 32 or 48 than that of the metal complex represented by the above-described formula (1-A) or formula (1-B) in the ink immediately after the preparation is defined as Cb[M+16n], the content of the metal complex represented by the above-described formula (1-A) or formula (1-B) in the ink immediately after storage of the storage step is defined as Ca[M], and the total content of metal complexes having a molecular weight larger by 16, 32 or 48 than that of the metal complex represented by the above-described formula (1-A) or formula (1-B) in the ink immediately after the storage is defined as Ca[M+16n], satisfying the formulae (1) and (2):

$$0.1 \leq (Ca[M+16n]/Ca[M])/(Cb[M+16n]/Cb[M]) \leq 20 \quad (1)$$

$$0 < Ca[M+16n]/Ca[M] \leq 0.006 \quad (2).$$

[9] The ink storage method according to [8], wherein the storage step is performed under light shielding.

[10] The ink storage method according to [8] or [9], wherein the storage step is performed under the condition of 0° C. to 50° C.

[11] The ink storage method according to any one of [8] to [10], wherein the storage step is performed under an inert gas atmosphere.

[12] The ink storage method according to any one of [8] to [11], wherein the above-described metal complex (1-A) is a metal complex represented by the above-described formula (1-A1), a metal complex represented by the above-described formula (1-A2), a metal complex represented by the above-described formula (1-A3) or a metal complex represented by the above-described formula (1-A4).

[13] The ink storage method according to any one of [8] to [12], wherein the above-described metal complex (1-B) is a metal complex represented by the above-described formula (1-B1), a metal complex represented by the above-described formula (1-B2) or a metal complex represented by the above-described formula (1-B3).

[14] The ink storage method according to any one of [8] to [13], wherein the ink further comprises a compound represented by the above-described formula (H-1).

[15] The ink storage method according to any one of [8] to [13], wherein the ink further comprises a polymer compound comprising a constitutional unit represented by the above-described formula (Y).

Effect of the Invention

According to the film production method of the present invention or the like, a film excellent in the external quantum efficiency when used for a light emitting layer of a light emitting device is obtained.

Modes for Carrying Out the Invention

Suitable embodiments of the present invention will be illustrated in detail below.

Explanation of Common Term

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

A solid line representing a bond to a central metal in a formula representing a metal complex denotes a covalent bond or a coordinate bond.

"Polymer compound" denotes a polymer having molecular weight distribution and having a polystyrene-equivalent number average molecular weight of $1 \times 10^3$ to $1 \times 10^8$.

A polymer compound may be any of a block copolymer, a random copolymer, an alternating copolymer and a graft copolymer, and may also be another embodiment.

An end group of a polymer compound is preferably a stable group because if a polymerization active group remains intact at the end, when the polymer compound is used for fabrication of a light emitting device, the light emitting property or luminance life possibly becomes lower. This end group is preferably a group having a conjugated bond to the main chain, and includes, for example, groups bonding to an aryl group or a monovalent heterocyclic group via a carbon-carbon bond.

"Low molecular weight compound" denotes a compound having no molecular weight distribution and having a molecular weight of $1 \times 10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 7 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidyl group, a quinolinyl group, an isoquinolinyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.

[Chemical Formula 7]

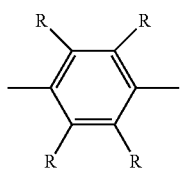
(A-1)

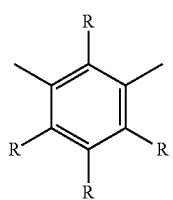
(A-2)

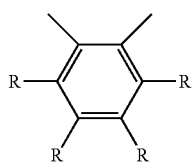
(A-3)

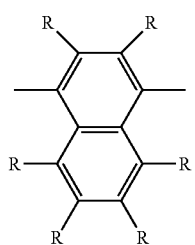
(A-4)

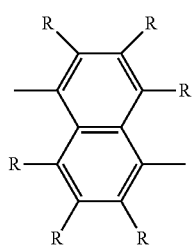
(A-5)

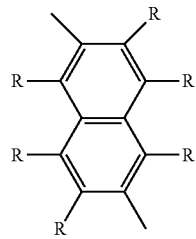
(A-6)

[Chemical Formula 8]

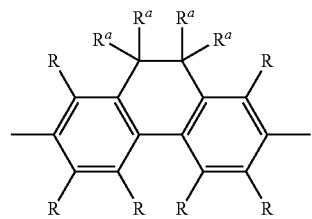
(A-7)

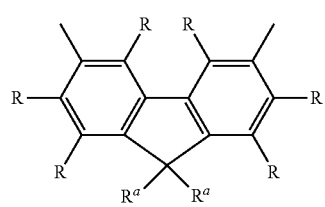
(A-8)

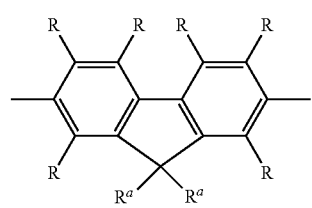
(A-9)

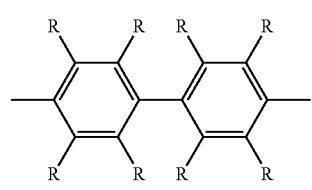
(A-10)

[Chemical Formula 9]

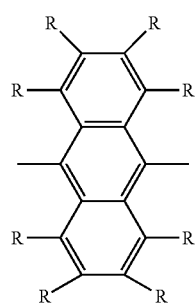
(A-11)

(A-12) 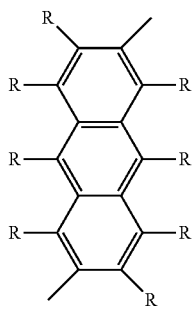

(A-13) 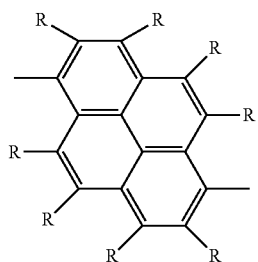

(A-14) 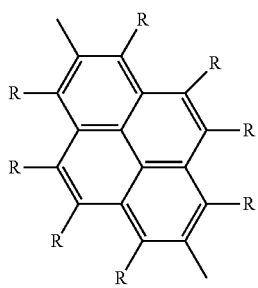

(A-15) 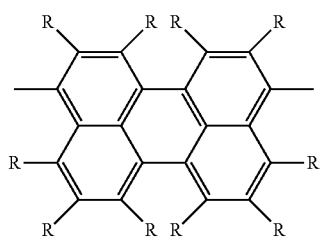

[Chemical Formula 10]

(A-16) 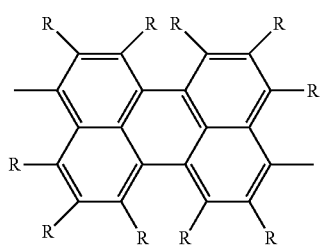

(A-17) 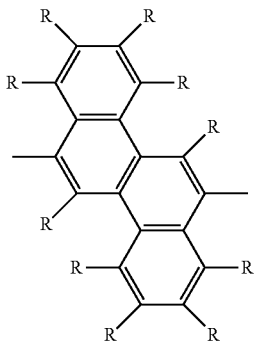

(A-18) 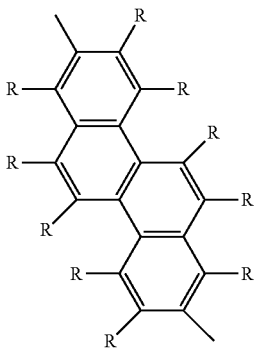

(A-19) 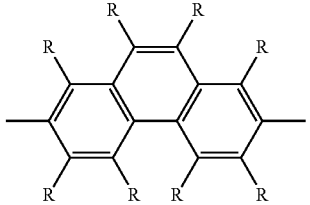

(A-20) 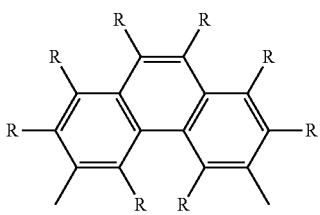

[wherein, R and $R^a$ each independently represent a hydrogen atom, an alkyl group, a cycloalkyl group, an aryl group or a monovalent heterocyclic group. The plurality of R and $R^a$ each may be the same or different, and groups $R^a$ may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.
[Chemical Formula 11]
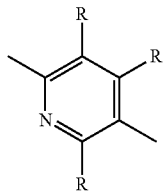
(AA-1)
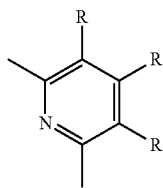
(AA-2)
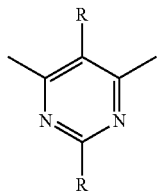
(AA-3)
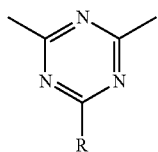
(AA-4)
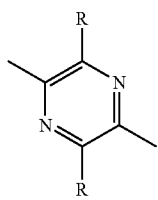
(AA-5)
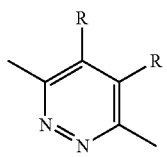
(AA-6)
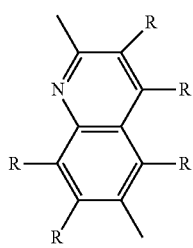
(AA-7)
[Chemical Formula 12]
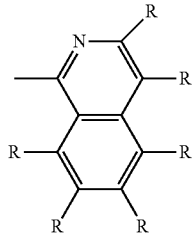
(AA-8)
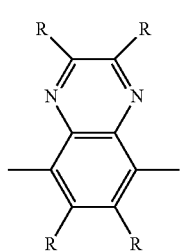
(AA-9)
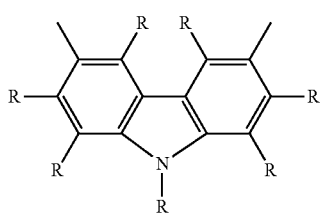
(AA-10)
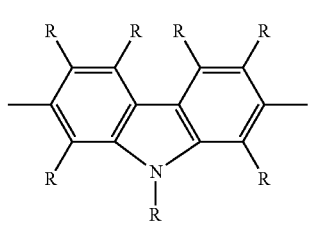
(AA-11)
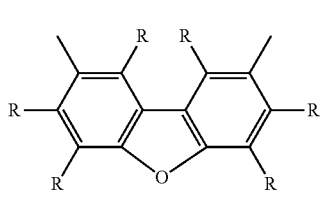
(AA-12)
[Chemical Formula 13]
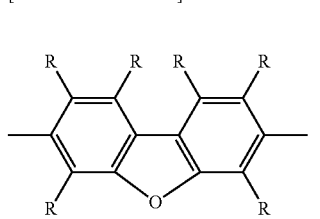
(AA-13)
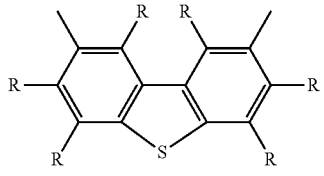
(AA-14)

(AA-15)
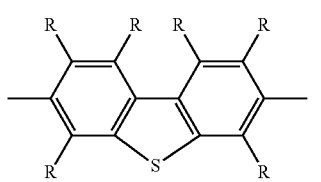
(AA-16)
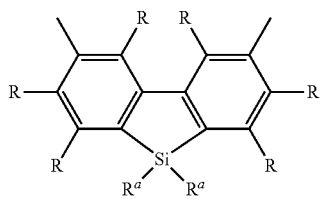
[Chemical Formula 14]
(AA-17)
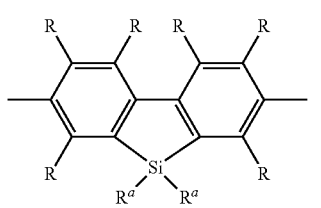
(AA-18)
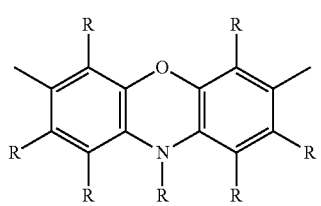
(AA-19)
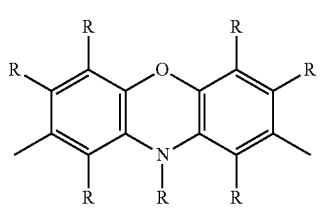
(AA-20)
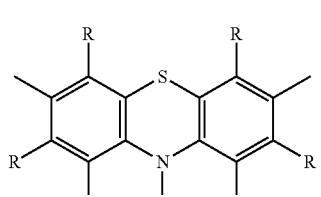
[Chemical Formula 15]
(AA-21)
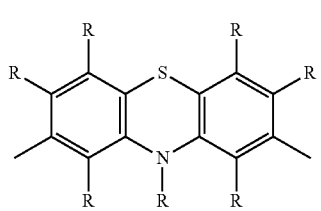
(AA-22)
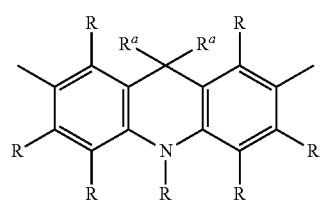
(AA-23)
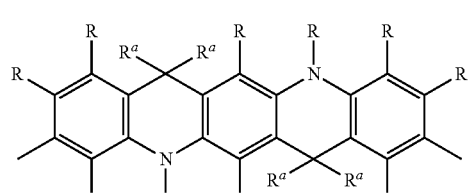
(AA-24)
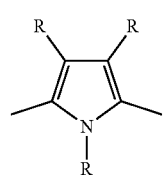
(AA-25)
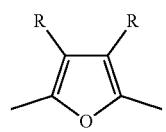
[Chemical Formula 16]
(AA-26)
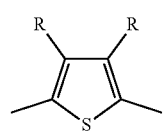
(AA-27)
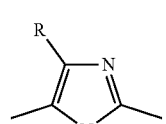
(AA-28)
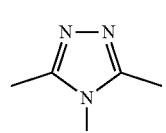
(AA-29)
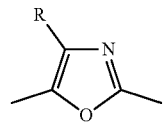
(AA-30)
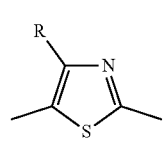
(AA-31)

[Chemical Formula 17]

(AA-32)

(AA-33)

(AA-34)

[wherein, R and R$^a$ represent the same meaning as described above.]

"Crosslinkable group" is a group capable of forming a new bond by being subjected to a heating treatment, an ultraviolet irradiation treatment, a radical reaction and the like, and the crosslinkable group is preferably any one of groups represented by the formulae (B-1) to (B-17). These groups each optionally have a substituent.

[Chemical Formula 18]

(B-1)
(B-2)
(B-3)
(B-4)
(B-5)
(B-6)
(B-7)
(B-8)
(B-9)
(B-10)
(B-11)
(B-12)
(B-13)
(B-14)
(B-15)
(B-16)
(B-17)

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

"Dendron" is a group having a regular dendritic branched structure having a branching point at an atom or ring (that is, a dendrimer structure). A compound having a dendron (hereinafter, referred to as "dendrimer".) includes, for example, structures described in literatures such as International Publication WO 02/067343, JP-A No. 2003-231692, International Publication WO 2003/079736, and International Publication WO 2006/097717.

The dendron is preferably a group represented by the formula (D-A) or (D-B).

[Chemical Formula 19]

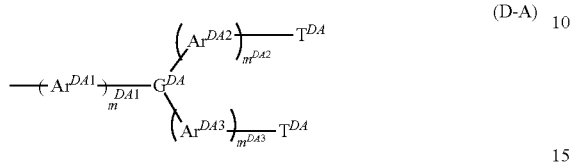
(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{DA3}$ each independently represent an arylene group or a divalent heterocyclic group, and these groups each optionally have a substituent. When a plurality of $A^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

[Chemical Formula 20]

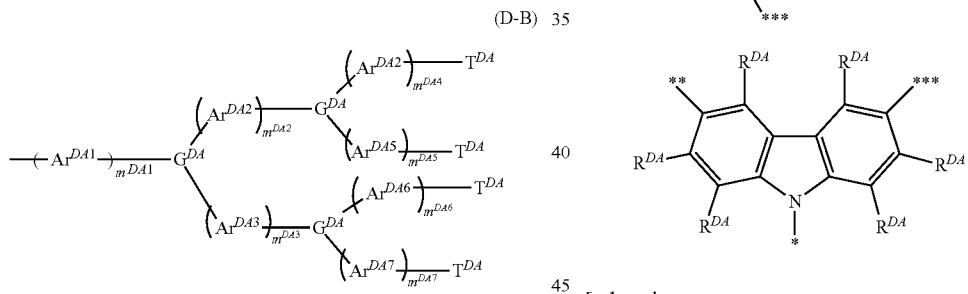
(D-B)

[wherein, $m^{DA1}$ $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and these groups each optionally have a substituent. The plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups each optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and these groups each optionally have a substituent. The plurality of $T^{DA}$ may be the same or different.]

$m^{DA1}$, $m^{DA2}$, $m^{DA3}$, $m^{DA4}$, $m^{DA5}$, $m^{DA6}$ and $m^{DA7}$ are usually an integer of 10 or less, preferably an integer of 5 or less, more preferably 0 or 1. It is preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably a group represented by the formula (GDA-11) to (GDA-15), and these groups each optionally have a substituent.

[Chemical Formula 21]

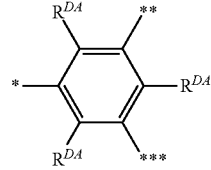
(GDA-11)

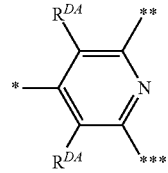
(GDA-12)

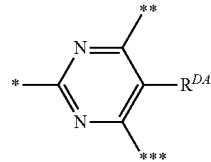
(GDA-13)

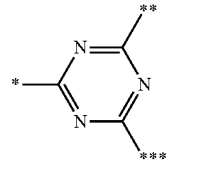
(GDA-14)

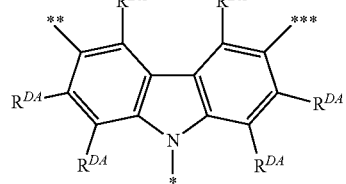
(GDA-15)

[wherein,

* represents a linkage to $Ar^{DA1}$ in the formula (D-A), $Ar^{DA1}$ in the formula (D-B), $Ar^{DA2}$ in the formula (D-B) or $Ar^{DA3}$ in the formula (D-B).

** represents a linkage to $Ar^{DA2}$ in the formula (D-A), $Ar^{DA2}$ in the formula (D-B), $Ar^{DA4}$ in the formula (D-B) or $Ar^{DA6}$ in the formula (D-B).

*** represents a linkage to $Ar^{DA3}$ in the formula (D-A), $A^3$ in the formula (D-B), $Ar^{DA5}$ in the formula (D-B) or $Ar^{DA7}$ in the formula (D-B).

$R^{DA}$ represents a hydrogen atom, an alkyl group, a cycloalkyl group, an alkoxy group, a cycloalkoxy group, an aryl group or a monovalent heterocyclic group, and these groups each optionally have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, and these groups each optionally have a substituent.

It is preferable that $Ar^{DA1}$, $Ar^{DA2}$, $Ar^{DA3}$, $Ar^{DA4}$, $Ar^{DA5}$, $Ar^{DA6}$ and $Ar^{DA7}$ are groups represented by the formulae (ArDA-1) to (ArDA-3).

[Chemical Formula 22]

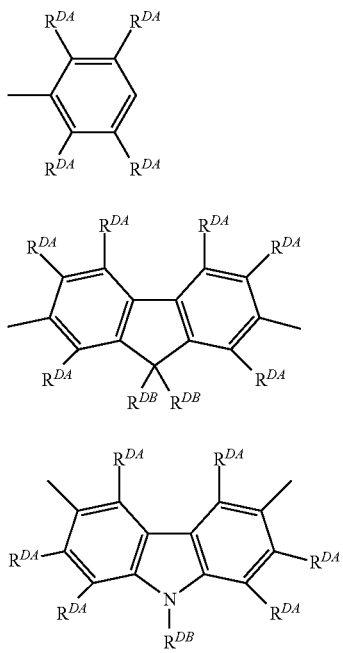

(ArDA-1)
(ArDA-2)
(ArDA-3)

[wherein, $R^{DA}$ represents the same meaning as described above.

$R^{DB}$ represents a hydrogen atom, an alkyl group, a cycloalkyl group, an aryl group or a monovalent heterocyclic group, and these groups each optionally have a substituent. When a plurality of $R^{DB}$ are present, they may be the same or different at each occurrence.]

$R^{DB}$ is preferably an alkyl group, a cycloalkyl group, an aryl group or a monovalent heterocyclic group, more preferably an aryl group or a monovalent heterocyclic group, further preferably an aryl group.

$T^{DA}$ is preferably groups represented by the formulae (TDA-1) to (TDA-3).

[Chemical Formula 23]

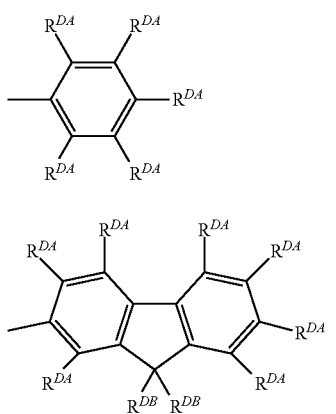

(TDA-1)
(TDA-2)

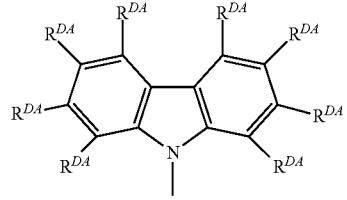

(TDA-3)

[wherein, $R^{DA}$ and $R^{DB}$ represent the same meaning described above.]

The group represented by the formula (D-A) is preferably a group represented by the formula (D-A1) to (D-A3).

[Chemical Formula 24]

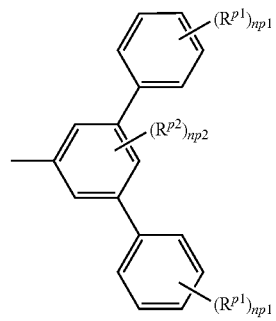

(D-A1)

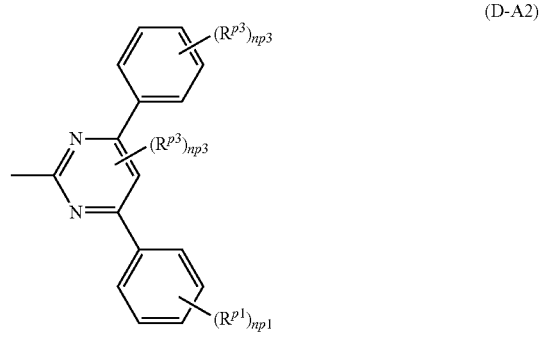

(D-A2)

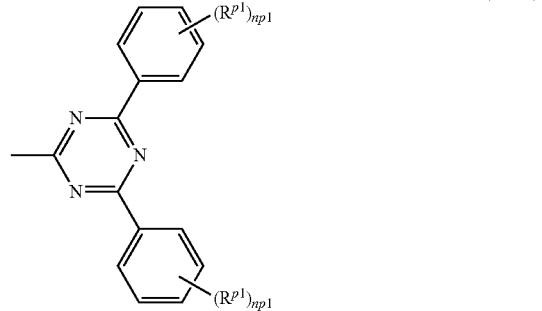

(D-A3)

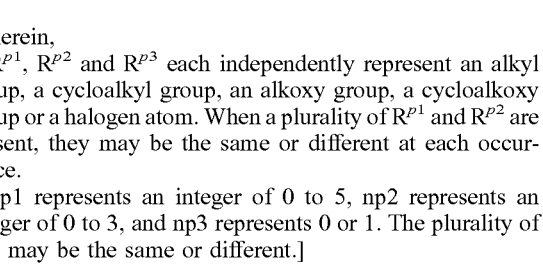

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. The plurality of np1 may be the same or different.]

The group represented by the formula (D-B) is preferably a group represented by the formula (D-B1) to (D-B3).

[Chemical Formula 25]

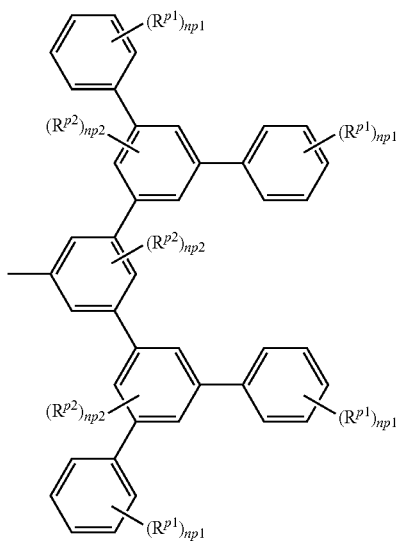

(D-B1)

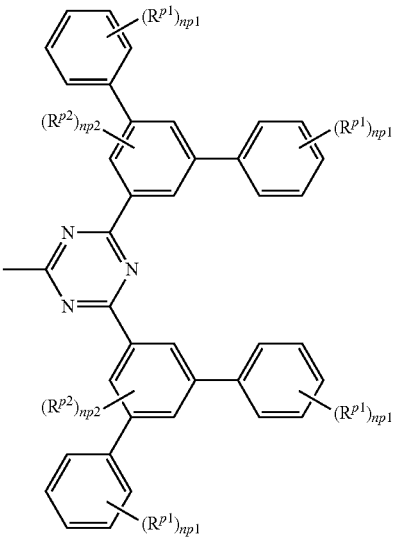

(D-B2)

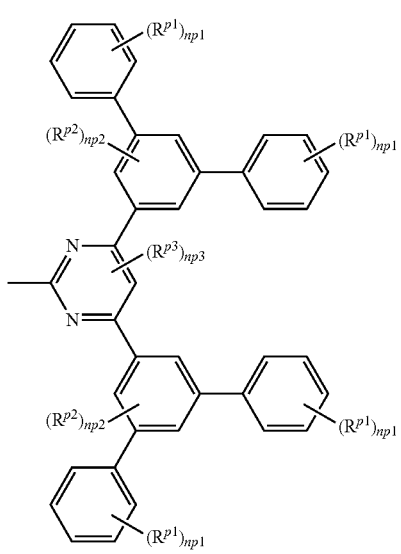

(D-B3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. When a plurality of np1 and np2 are present, they may be the same or different at each occurrence.]

np1 is preferably 0 or 1, more preferably 1. np2 is preferably 0 or 1, more preferably 0. np3 is preferably 0.

$R^{p1}$, $R^{p2}$ and $R^{p3}$ are preferably an alkyl group or a cycloalkyl group.

The film production method of the present invention comprises an ink preparation step, an ink storage step and a film formation step, as described above. Further, the ink storage method of the present invention comprises an ink preparation step and a storage step, as described above. Hereinafter, these steps will be explained in sequence.

<Ink Preparation Step>

The ink preparation step is a step of preparing an ink comprising a metal complex represented by the formula (1-A) or the formula (1-B), and an organic solvent.

[Metal Complex]

M is preferably an iridium atom because a light emitting device is more excellent in the external quantum efficiency.

$E^1$ is preferably a carbon atom.

When $E^{11A}$ is a nitrogen atom and $R^{11A}$ is present, it is preferable that $R^{11A}$ is an alkyl group, a cycloalkyl group, an aryl group, a monovalent heterocyclic group or a substituted amino group.

When $E^{11A}$ is a carbon atom, $R^{11A}$ is preferably a hydrogen atom, an alkyl group, a cycloalkyl group, aryl group or a monovalent heterocyclic group, more preferably a hydrogen atom, an alkyl group, a cycloalkyl group or an aryl group, further preferably a hydrogen atom, an alkyl group or a cycloalkyl group.

When $E^{12A}$ is a nitrogen atom and $R^{12A}$ is present, it is preferable that $R^{12A}$ is an alkyl group, a cycloalkyl group, an aryl group, a monovalent heterocyclic group or a substituted amino group.

When $E^{12A}$ is a carbon atom, $R^{12A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When $E^{13A}$ is a nitrogen atom and $R^{13A}$ is present, it is preferable that $R^{13A}$ is an alkyl group, a cycloalkyl group, an aryl group, a monovalent heterocyclic group or a substituted amino group.

When $E^{13A}$ is a carbon atom, $R^{13A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

$R^{21A}$, $R^{22A}$, $R^{23A}$ and $R^{24A}$ are each preferably a hydrogen atom, an alkyl group, a cycloalkyl group, an aryl group, a monovalent heterocyclic group or a substituted amino group, more preferably a hydrogen atom, an aryl group, a monovalent heterocyclic group or a substituted amino group.

It is preferable that at least one of $R^{11A}$, $R^{12A}$, $R^{13A}$, $R^{21A}$, $R^{22A}$, $R^{23A}$ and $R^{24A}$ has at least one selected from the group consisting of an aryl group, a monovalent heterocyclic group and a substituted amino group, because a light emitting device is more excellent in the external quantum efficiency. These groups each optionally have a substituent.

When the ring $R^{1A}$ is a diazole ring, a diazole ring in which $E^{11A}$ is a nitrogen atom or a diazole ring in which $E^{12A}$ is a nitrogen atom is preferable, the diazole ring in which $E^{11A}$ is a nitrogen atom being more preferable.

When the ring $R^{1A}$ is a triazole ring, a triazole ring in which $E^{11A}$ and $E^{12A}$ are each a nitrogen atom or a triazole ring in which $E^{11A}$ and $E^{13A}$ are each a nitrogen atom is preferable, the triazole ring in which $E^{11A}$ and $E^{12A}$ are each a nitrogen atom being more preferable.

When the ring $R^{1A}$ has an aryl group, a monovalent heterocyclic group or a substituted amino group, it is preferable that $R^{11A}$ or $R^{12A}$ is an aryl group, a monovalent heterocyclic group or a substituted amino group, it is more preferable that $R^{11A}$ is an aryl group, a monovalent heterocyclic group or a substituted amino group.

When the ring $R^{2A}$ is a pyridine ring, a pyridine ring in which $E^{21A}$ is a nitrogen atom, a pyridine ring in which $E^{22A}$ is a nitrogen atom or a pyridine ring in which $E^{23A}$ is a nitrogen atom is preferable, the pyridine ring in which $E^{22A}$ is a nitrogen atom being more preferable.

When the ring $R^{2A}$ is a diazine ring, a diazine ring in which $E^{21A}$ and $E^{23A}$ are each a nitrogen atom or a diazine ring in which $E^{22A}$ and $E^{24A}$ are each a nitrogen atom is preferable, the diazine ring in which $E^{22A}$ and $E^{24A}$ are each a nitrogen atom being more preferable.

The ring $R^{2A}$ is preferably a benzene ring.

Examples of the anionic bidentate ligand represented by $A^1$-$G^1$-$A^2$ include ligands represented by the following formulae.

[Chemical Formula 26]

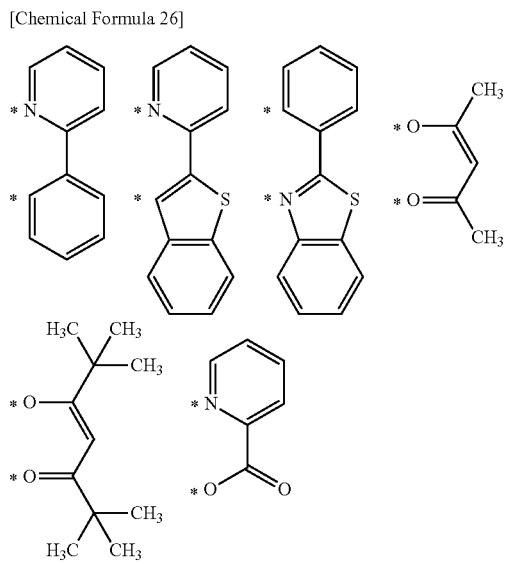

[Chemical Formula 27]

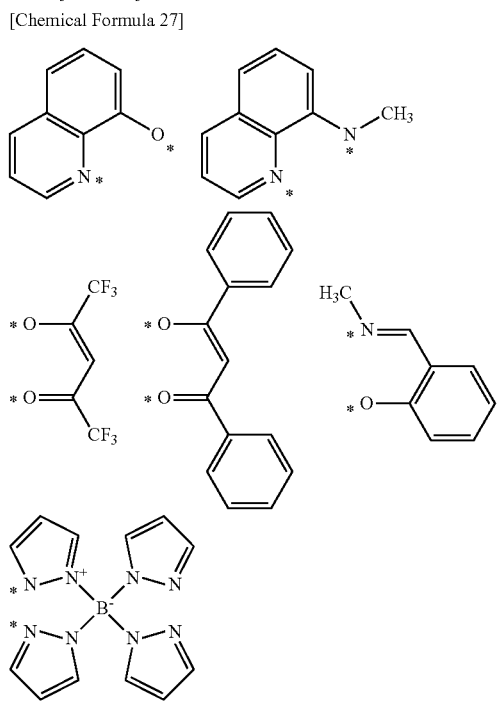

[wherein, * indicates a site binding to M.]

It is preferable that at least one selected from the group consisting of $R^{11B}$, $R^{12B}$, $R^{13B}$, $R^{14B}$, $R^{21B}$, $R^{22B}$, $R^{23B}$ and $R^{24B}$ is an aryl group, a monovalent heterocyclic group or a substituted amino group, because a light emitting device obtained by using the film production method of the present invention is more excellent in the external quantum efficiency. These groups each optionally further have a substituent.

When the ring $R^{1B}$ is a diazine ring, a diazine ring in which $E^{11B}$ is a nitrogen atom or a diazine ring in which $E^{13B}$ is a nitrogen atom is preferable, the diazine ring in which $E^{11B}$ is a nitrogen atom being more preferable.

$R^{11B}$, $R^{12B}$, $R^{13B}$ and $R^{14B}$ are each preferably a substituent selected from the group consisting of a hydrogen atom, an alkyl group, a cycloalkyl group, an aryl group, a monovalent heterocyclic group and a substituted amino group, more preferably a hydrogen atom, an aryl group, a monovalent heterocyclic group or a substituted amino group.

When the ring $R^{1B}$ has a substituent selected from the group consisting of an aryl group, a monovalent heterocyclic group and a substituted amino group, it is preferable that $R^{11B}$, $R^{12B}$ or $R^{13B}$ is a substituent selected from the group consisting of an aryl group, a monovalent heterocyclic group and a substituted amino group, it is more preferable that $R^{11B}$ or $R^{13B}$ is a substituent selected from the group consisting of an aryl group, a monovalent heterocyclic group and a substituted amino group, it is further preferable that $R^{11B}$ is an aryl group, a monovalent heterocyclic group or a substituted amino group.

When the ring $R^{2B}$ is a pyridine ring, a pyridine ring in which $E^{21B}$ is a nitrogen atom, a pyridine ring in which $E^{22B}$ is a nitrogen atom or a pyridine ring in which $E^{23B}$ is a nitrogen atom is preferable, the pyridine ring in which $E^{22B}$ is a nitrogen atom being more preferable.

When the ring $R^{2B}$ is a diazine ring, a diazine ring in which $E^{21B}$ and $E^{23B}$ are each a nitrogen atom or a diazine ring in which $E^{22B}$ and $E^{24B}$ are each a nitrogen atom is preferable, the diazine ring in which $E^{22B}$ and $E^{24B}$ are each a nitrogen atom being more preferable.

The ring $R^{2B}$ is preferably a benzene ring.

$R^{21B}$, $R^{22B}$, $R^{23B}$ and $R^{24B}$ are each preferably a group selected from the group consisting of a hydrogen atom, an alkyl group, a cycloalkyl group, an aryl group, a monovalent heterocyclic group and a substituted amino group, more preferably a group selected from the group consisting of a hydrogen atom, an aryl group, a monovalent heterocyclic group and a substituted amino group.

When the ring $R^{2B}$ has a substituent selected from the group consisting of an aryl group, a monovalent heterocyclic group and a substituted amino group, it is preferable that $R^{22B}$ or $R^{23B}$ is a substituent selected from the group consisting of an aryl group, a monovalent heterocyclic group and a substituted amino group, it is more preferable that $R^{22B}$ is an aryl group, a monovalent heterocyclic group or a substituted amino group.

The metal complex represented by the formula (1-A) is preferably a metal complex represented by the formula (1-A1), the formula (1-A2), the formula (1-A3) or the formula (1-A4), more preferably a metal complex represented by the formula (1-A1) or the formula (1-A2), further preferably a metal complex represented by the formula (1-A1).

The metal complex represented by the formula (1-B) is preferably a metal complex in which $E^{11B}$, $E^{12B}$, $E^{13B}$, $E^{14B}$, $E^{21B}$, $E^{22B}$, $E^{23B}$ and $E^{24B}$ are each a carbon atom, more preferably a metal complex in which the ring $R^{1B}$ is a condensed ring in addition to that, further preferably a metal complex represented by the formula (1-B1), the formula (1-B2) or the formula (1-B3), particularly preferably a metal complex represented by the formula (1-B1).

The metal complex is preferably a metal complex represented by the formula (1-A).

The metal complex represented by the formula (1-A) or formula (1-B) includes, for example, metal complexes represented by COM-1 to COM-20.

[Chemical Formula 28]

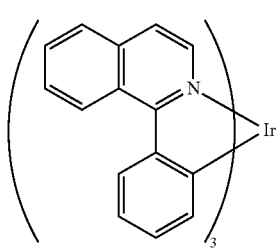

COM-1

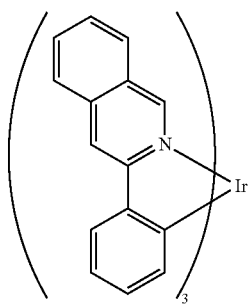

COM-2

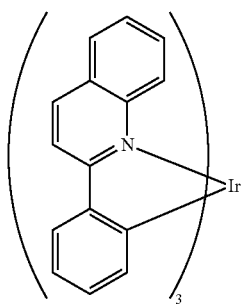

COM-3

-continued
[Chemical Formula 29]
COM-4
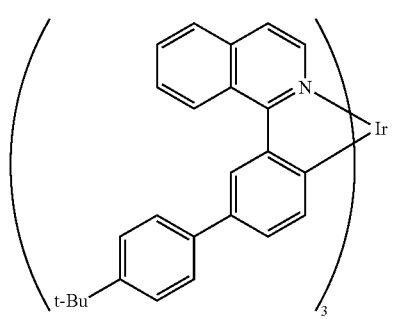
COM-5
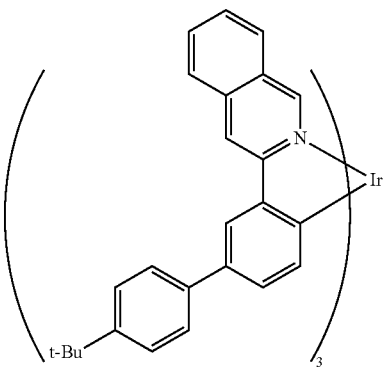
COM-6
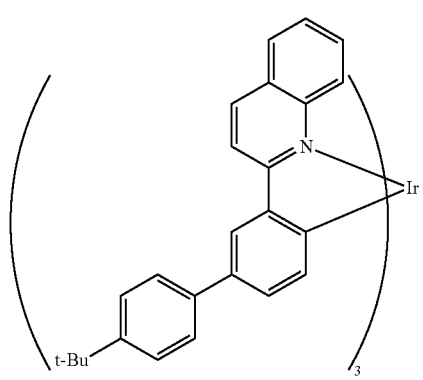
[Chemical Formula 30]
COM-7
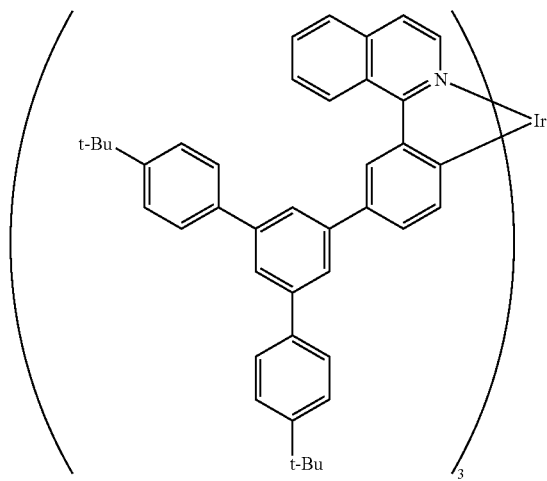

-continued
COM-8
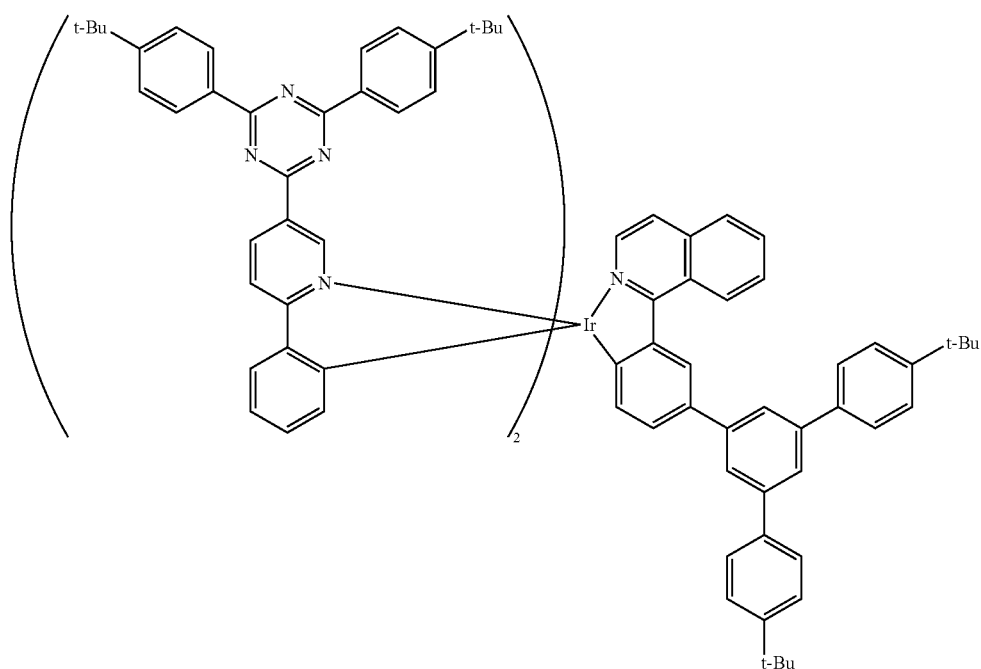
[Chemical Formula 31]
COM-9
COM-10
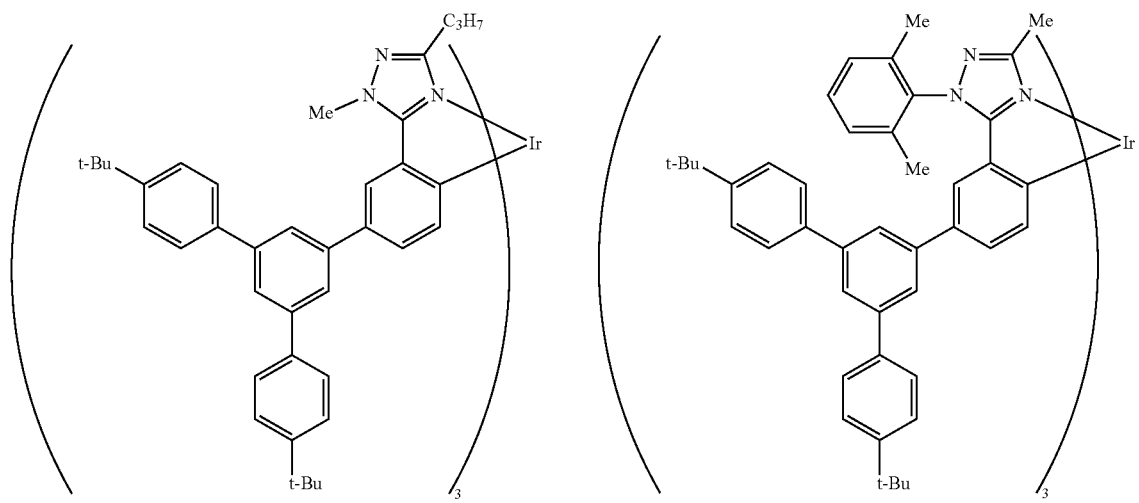
COM-11
COM-12
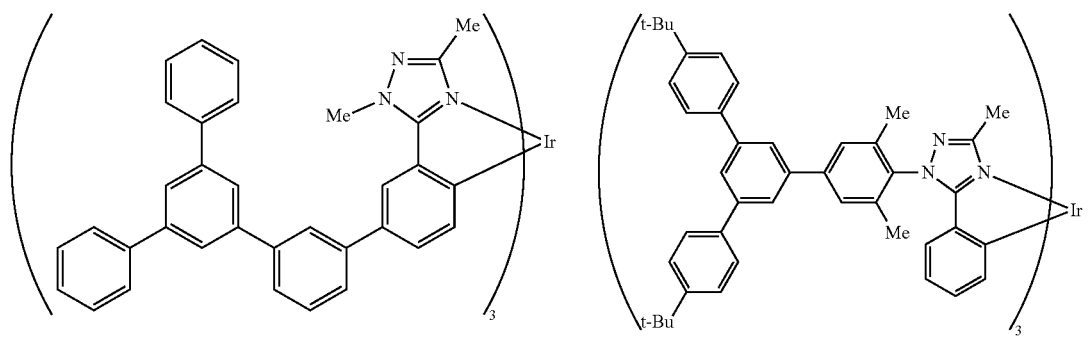

-continued
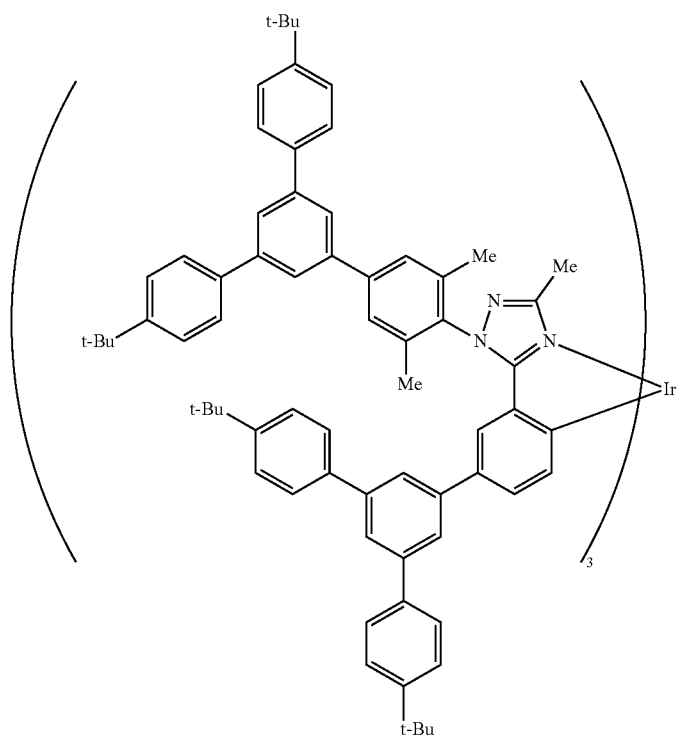
COM-13
[Chemical Formula 32]
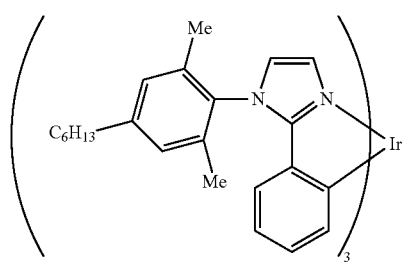
COM-14
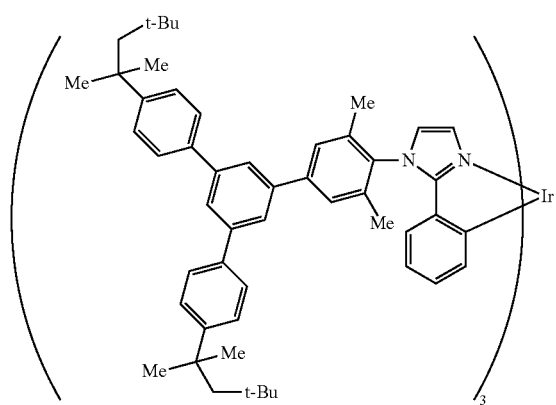
COM-16
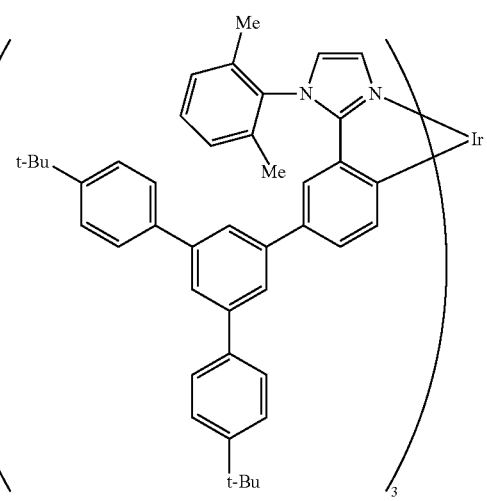
COM-15
COM-17

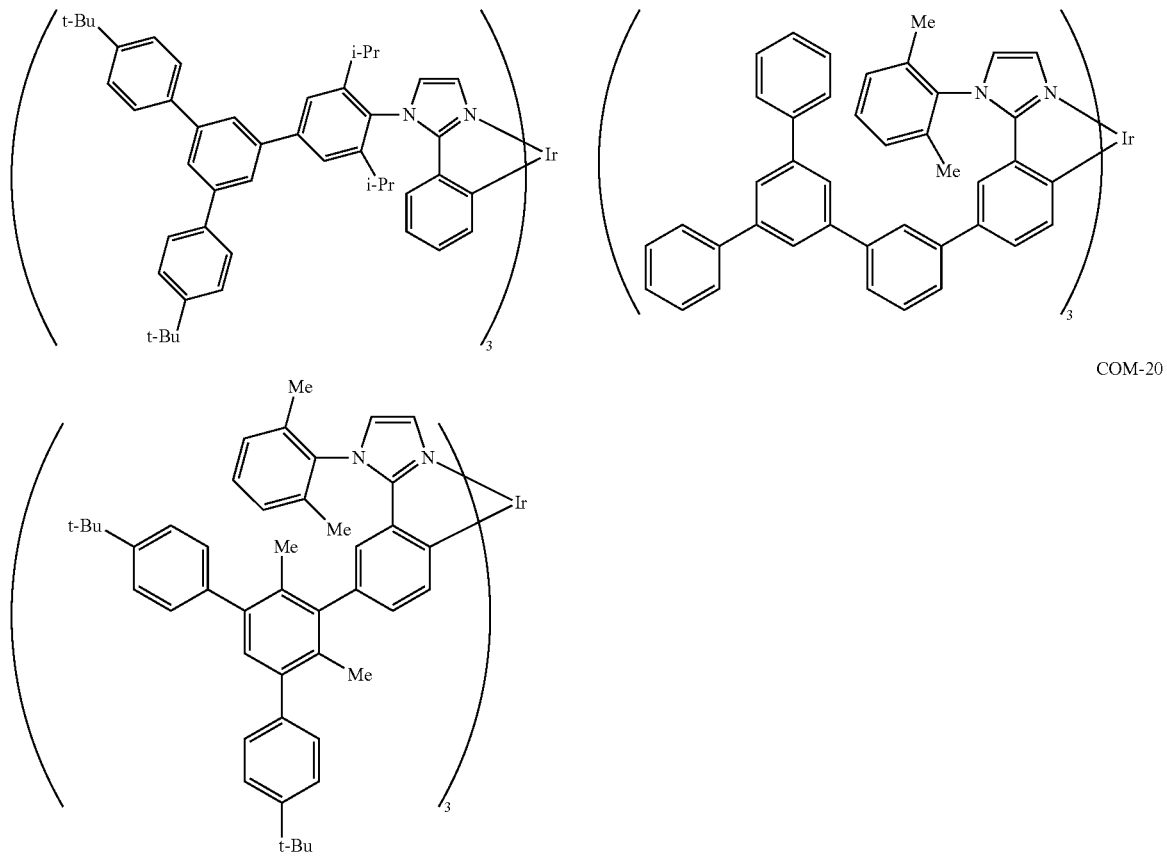

It is preferable that the metal complex represented by the formula (1-A) or formula (1-B) has a dendron as a substituent, because solubility in an organic solvent and the external quantum efficiency of a light emitting device are excellent.

The metal complex represented by the formula (1-A) or formula (1-B) can be synthesized, for example, according to methods described in Japanese Translation of PCT International Application Publication (JP-T) No. 2004-530254, Japanese Unexamined Patent Application Publication (JP-A) No. 2008-179617, JP-A No. 2011-105701, JP-T No. 2007-504272, JP-A No. 2013-147449 and JP-A No. 2013-147450.

In the ink before storage, the content of metal complexes having a molecular weight larger by 16, 32 or 48 than that of the metal complex represented by the formula (1-A) or the formula (1-B) according to the area percentage value determined by liquid chromatography is usually 0.6 or less, preferably 0.3 or less, more preferably 0.1 or less when the content of the metal complex represented by the formula (1-A) or the formula (1-B) according to the area percentage value determined by liquid chromatography is taken as 100.

In the ink after storage, the content of metal complexes having a molecular weight larger by 16, 32 or 48 is 0.6 or less, preferably 0.51 or less.

In the ink preparation step, the metal complexes represented by the formula (1-A) or the formula (1-B) may be used each singly or in combination of two or more thereof.

[Organic Solvent]

The organic solvent used for the film production method of the present invention is usually a solvent capable of dissolving or uniformly dispersing the solid component in the ink. The organic solvent includes, for example, chlorine-based solvents such as 1,2-dichloroethane, 1,1,2-trichloroethane, chlorobenzene and o-dichlorobenzene; ether solvents such as THF, dioxane, anisole and 4-methylanisole; aromatic hydrocarbon solvents such as toluene, xylene, mesitylene, ethylbenzene, n-hexylbenzene and cyclohexyl benzene; aliphatic hydrocarbon solvents such as cyclohexane, methylcyclohexane, n-heptane, n-hexane, n-heptane, n-octane, n-nonane, n-decane, n-dodecane and bicyclohexyl; ketone solvents such as acetone, methyl ethyl ketone, cyclohexanone and acetophenone; ester solvents such as ethyl acetate, butyl acetate, ethyl cellosolve acetate, methyl benzoate and phenyl acetate; polyhydric alcohol solvents such as ethylene glycol, glycerin and 1,2-hexanediol; alcohol solvents such as isopropyl alcohol and cyclohexanol; sulfoxide solvents such as dimethyl sulfoxide; amide solvents such as N-methyl-2-pyrrolidone and N,N-dimethylformamide, and preferred are ether solvents and aromatic hydrocarbon solvents.

In the ink preparation step, the organic solvents may be used each singly or in combination of two or more thereof.

In the ink, the blending amount of the organic solvent is usually 1000 to 100000 parts by weight, preferably 2000 to 20000 parts by weight with respect to 100 parts by weight of the total solid content.

The viscosity of the ink may be adjusted depending on the type of the printing method, and when applied to a printing method in which a solution passes through a discharge apparatus such as an inkjet print method, the viscosity is preferably 1 to 25 mPa·s at 25° C. because clogging and flight deflection at discharge are less likely to occur.

The ink prepared in the ink preparation step may further comprise at least one material selected from the group consisting of a host material, a hole transporting material, a hole injection material, an electron transporting material, an electron injection material, a light emitting material and an antioxidant. These materials each may be used singly or in combination of two or more thereof.

[Host Material]

When the ink comprises a host material having at least one function selected from the group consisting of hole injectability, hole transportability, electron injectability and electron transportability, the external quantum efficiency of a light emitting device becomes excellent.

When the ink comprises a host material, the content of the metal complex represented by the formula (1-A) or the formula (1-B) is usually 0.05 to 80 parts by weight, preferably 0.1 to 50 parts by weight, more preferably 0.5 to 40 parts by weight with respect to 100 parts by weight of the sum of the metal complex represented by the formula (1-A) or the formula (1-B) and the host material.

It is preferable that the lowest excited triplet state ($T_1$) of the host material is at energy level equivalent to or higher than $T_1$ of the metal complex represented by the formula (1-A) or the formula (1-B) because the external quantum efficiency of a light emitting device is excellent.

The host material is classified into low molecular weight compounds (low molecular weight host) and polymer compounds (polymer host), and the low molecular weight host is preferable.

[Low Molecular Weight Host]

The low molecular weight host is preferably a compound represented by the formula (H-1).

$Ar^{H1}$ and $Ar^{H2}$ are preferably a phenyl group, a fluorenyl group, a spirobifluorenyl group, a pyridyl group, a pyrimidinyl group, a triazinyl group, a quinolinyl group, an isoquinolinyl group, a thienyl group, a benzothienyl group, a dibenzothienyl group, a furyl group, a benzofuryl group, a dibenzofuryl group, a pyrrolyl group, an indolyl group, an azaindolyl group, a carbazolyl group, an azacarbazolyl group, a diazacarbazolyl group, a phenoxazinyl group or a phenothiazinyl group, more preferably a phenyl group, a pyridyl group, a carbazolyl group or an azacarbazolyl group, further preferably a group represented by the above-described formula (TDA-1) or the above-described formula (TDA-3), particularly preferably a group represented by the above-described formula (TDA-3), and these groups each optionally have a substituent.

The substituent which $Ar^{H1}$ and $Ar^{H2}$ optionally have is preferably a halogen atom, an alkyl group, a cycloalkyl group, an alkoxy group, a cycloalkoxy group, an aryl group or a monovalent heterocyclic group, more preferably an alkyl group, a cycloalkoxy group, an alkoxy group or cycloalkoxy group, further preferably an alkyl group or cycloalkoxy group, and these groups each optionally further have a substituent.

$n^{H1}$ is preferably 1. $n^{H2}$ is preferably 0.

$n^{H3}$ is preferably an integer of 0 to 5, more preferably an integer of 1 to 3, further preferably 1.

$n^{H11}$ is preferably an integer of 1 to 5, more preferably an integer of 1 to 3, further preferably 1.

$R^{H11}$ is preferably a hydrogen atom, an alkyl group, a cycloalkyl group, an aryl group or a monovalent heterocyclic group, more preferably a hydrogen atom, an alkyl group or a cycloalkyl group, further preferably a hydrogen atom or an alkyl group, and these groups each optionally have a substituent.

$L^{H1}$ is preferably an arylene group or a divalent heterocyclic group.

$L^{H1}$ is preferably a group represented by the formula (A-1) to (A-3), the formula (A-8) to (A-10), the formula (AA-1) to (AA-6), the formula (AA-10) to (AA-21) or the formula (AA-24) to (AA-34), more preferably a group represented by the formula (A-1), the formula (A-2), the formula (A-8), the formula (A-9), the formula (AA-2), the formula (AA-4) or the formula (AA-10) to (AA-15), further preferably a group represented by the formula (A-1), the formula (A-2), the formula (A-8), the formula (AA-2), the formula (AA-4), the formula (AA-10), the formula (AA-12) or the formula (AA-14), particularly preferably a group represented by the formula (A-1), the formula (A-2), the formula (AA-2), the formula (AA-4) or the formula (AA-14).

The substituent which $L^{H1}$ optionally has is preferably a halogen atom, an alkyl group, a cycloalkyl group, an alkoxy group, a cycloalkoxy group, an aryl group or a monovalent heterocyclic group, more preferably an alkyl group, an alkoxy group, an aryl group or a monovalent heterocyclic group, further preferably an alkyl group, an aryl group or a monovalent heterocyclic group, and these groups optionally further have a substituent.

$L^{H21}$ is preferably a single bond or an arylene group optionally having a substituent, more preferably a single bond. The definition and examples of the arylene group or the divalent heterocyclic group represented by $L^{H21}$ are the same as the definition and examples of the arylene group or the divalent heterocyclic group represented by $L^{H1}$.

$R^{H21}$ is preferably an aryl group or a monovalent heterocyclic group, and these groups each optionally have a substituent. The definition and examples of the aryl group and the monovalent heterocyclic group represented by $R^{H21}$ are the same as the definition and examples of the aryl group and the monovalent heterocyclic group represented by $Ar^{H1}$ and $Ar^{H2}$. The definition and examples of the substituent which $R^{H21}$ may optionally has are the same as the definition and examples of the substituent which $Ar^{H1}$ and $Ar^{H2}$ optionally have.

The compound represented by the formula (H-1) is preferably a compound represented by the formula (H-2).

[Chemical Formula 33]

[wherein, $Ar^{H1}$, $Ar^{H2}$, $n^{H3}$ and $L^{H1}$ represent the same meaning as described above.]

As the compound represented by the formula (H-1), compounds represented by the following formulae (H-101) to (H-119) are exemplified.

[Chemical Formula 34]

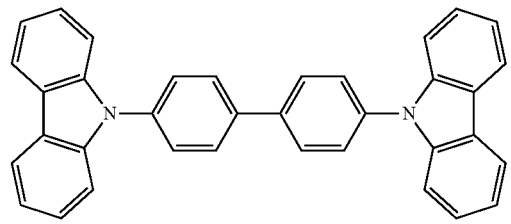

-continued
(H-102)
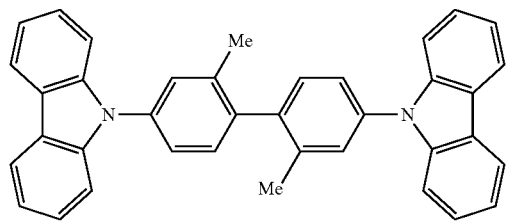
(H-103)
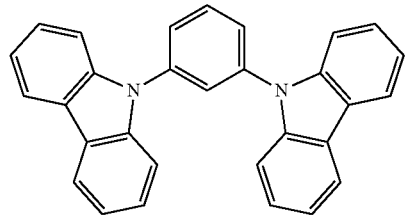
(H-104)
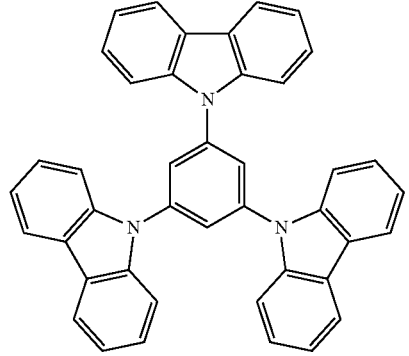
(H-105)
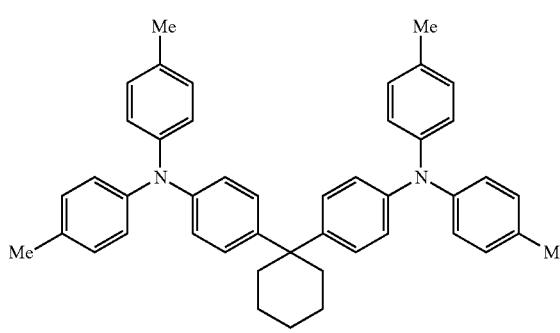
(H-106)
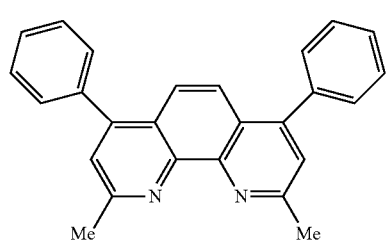
-continued
[Chemical Formula 35]
(H-107)
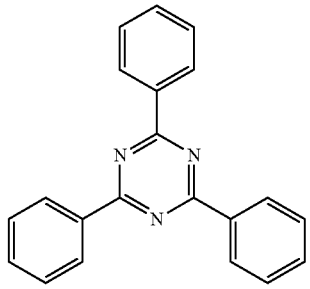
(H-108)
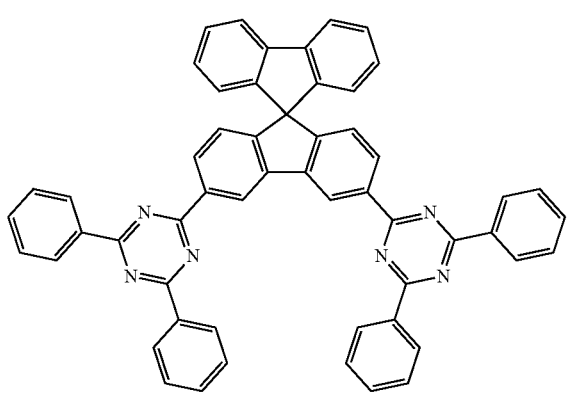
(H-109)
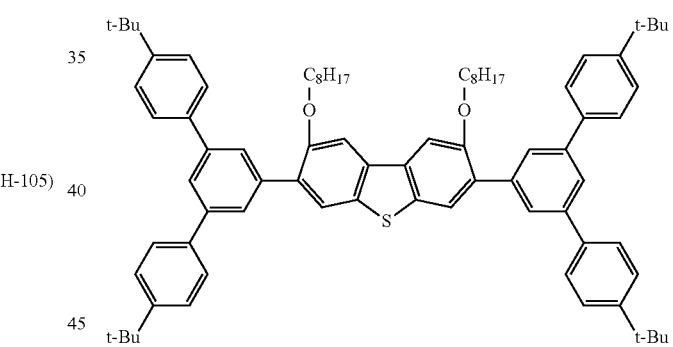
(H-110)
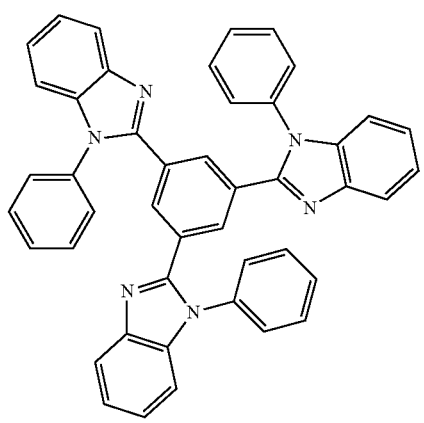

(H-111)
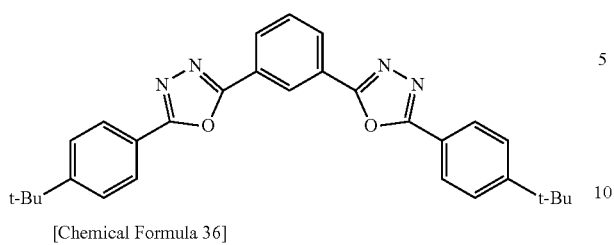
[Chemical Formula 36]
(H-112)
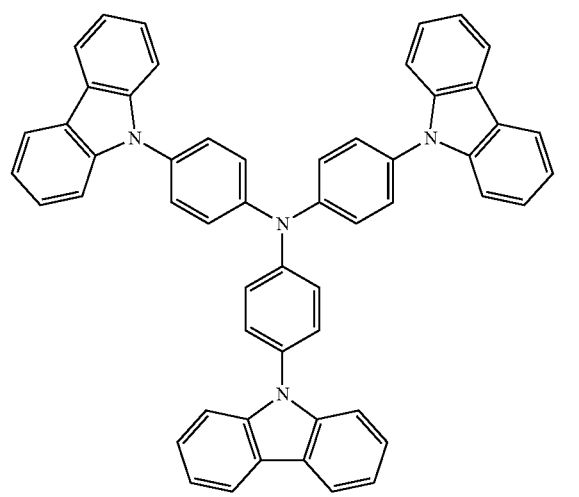
[Chemical Formula 37]
(H-112)
(H-115)
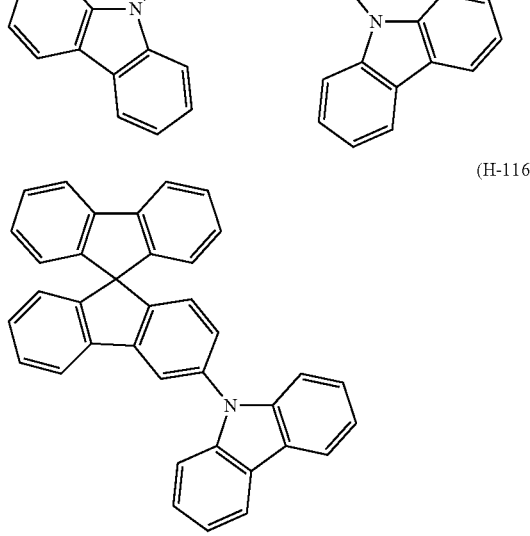
(H-116)
(H-113)
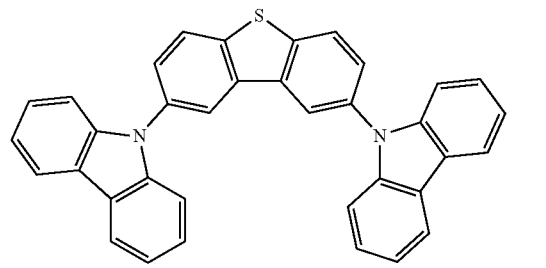
(H-117)
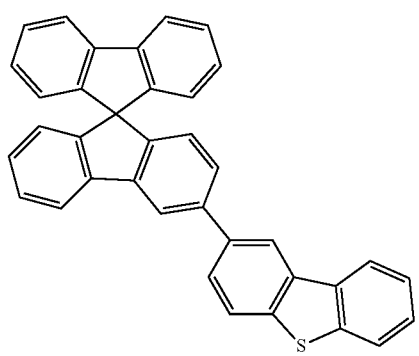
(H-114)
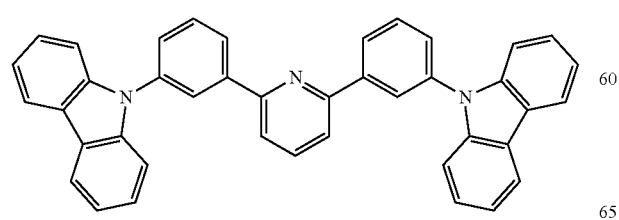
(H-118)
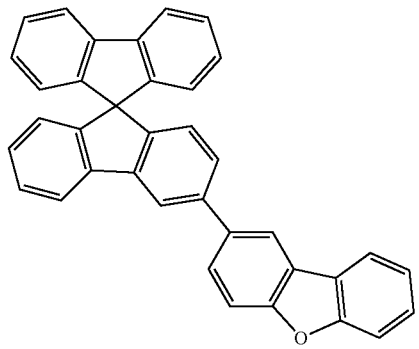

[Chemical Formula 38]

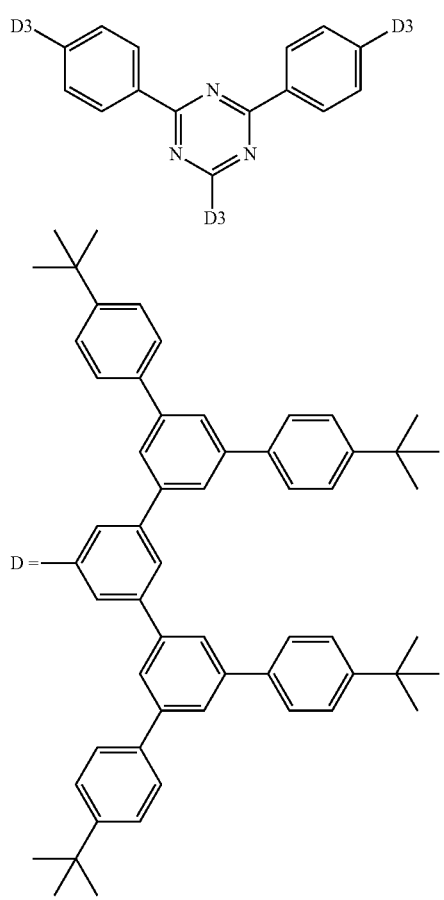

(H-119)

[Polymer Host]

The polymer host includes, for example, polymer compounds as a hole transporting material described later and polymer compounds as an electron transporting material described later. The polymer host is preferably a polymer compound comprising a constitutional unit represented by the formula (Y).

The arylene group represented by $Ar^{Y1}$ is more preferably a group represented by the formula (A-1), the formula (A-2), the formula (A-6) to (A-10), the formula (A-19) or the formula (A-20), further preferably a group represented by the formula (A-1), the formula (A-2), the formula (A-7), the formula (A-9) or the formula (A-19), and these groups each optionally have a substituent.

The divalent heterocyclic group represented by $Ar^{Y1}$ is more preferably a group represented by the formula (AA-1) to (AA-4), the formula (AA-10) to (AA-15), the formula (AA-18) to (AA-21), the formula (AA-33) or the formula (AA-34), further preferably a group represented by the formula (AA-4), the formula (AA-10), the formula (AA-12), the formula (AA-14) or the formula (AA-33), and these groups each optionally have a substituent.

The more preferable range and the further preferable range of the arylene group and the divalent heterocyclic group in the divalent group in which at least one arylene group and at least one divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

"The divalent group in which at least one arylene group and at least one divalent heterocyclic group are bonded directly to each other" includes, for example, groups represented by the following formulae, and each of them optionally has a substituent.

[Chemical Formula 39]

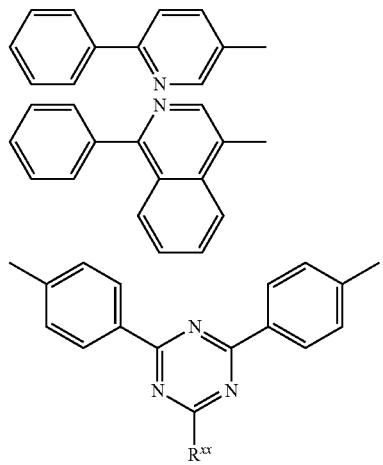

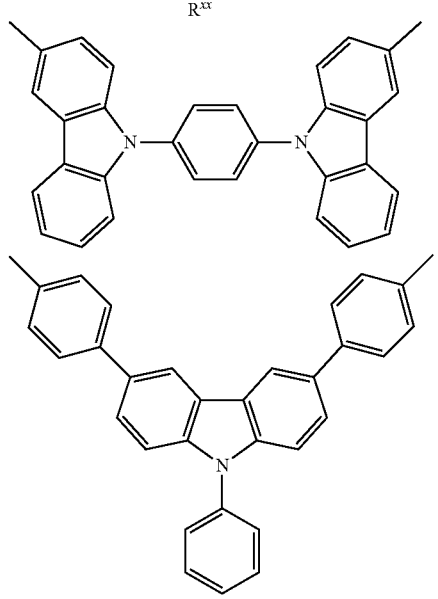

[wherein, $R^{XX}$ represents a hydrogen atom, an alkyl group, a cycloalkyl group, an aryl group or a monovalent heterocyclic group and these groups each optionally have a substituent.]

$R^{XX}$ is preferably an alkyl group, a cycloalkyl group or an aryl group, and these groups each optionally have a substituent.

The substituent which the group represented by $Ar^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-10), and from the standpoint of the luminance life of the light emitting device produced by using the composition comprising the polymer host and the metal complex of the present invention preferable are constitutional units represented by the formulae (Y-1) to (Y-3), from the standpoint of electron transportability preferable are constitutional units represented by the formulae (Y-4) to (Y-7), and from the standpoint of hole transportability preferable are constitutional units represented by the formulae (Y-8) to (Y-10).

[Chemical Formula 40]

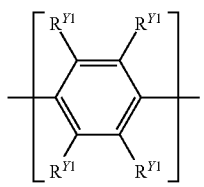

(Y-1)

[wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent $R^{Y1}$s may be combined together to form a ring together with the carbon atoms to which they are attached.]

[Chemical Formula 41]

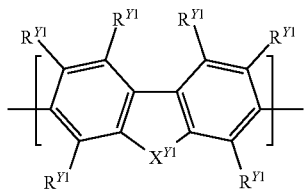

(Y-2)

[wherein, $R^{Y1}$ represents the same meaning as described above. $X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, an alkyl group, a cycloalkyl group, an alkoxy group, a cycloalkoxy group, an aryl group or a monovalent heterocyclic group and these groups each optionally have a substituent. The plurality of $R^{Y2}$ may be the same or different, and these $R^{Y2}$s may be combined together to form a ring together with the carbon atoms to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by —C($R^{Y2}$)$_2$— in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by —C($R^{Y2}$)$_2$— is preferably a group represented by the formula (Y-A1) to (Y-A5), more preferably a group represented by the formula (Y-A4), and these groups each optionally have a substituent.

[Chemical Formula 42]

(Y-A1)

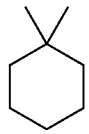

(Y-A2)

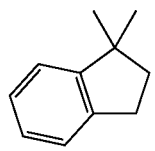

(Y-A3)

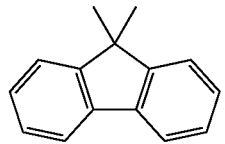

(Y-A4)

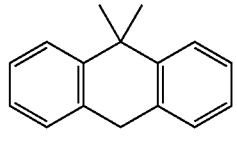

(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C($R^{Y2}$)$_2$—C($R^{Y2}$)$_2$— in $X^{Y1}$ are preferably an alkyl group or a cycloalkyl group each optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), and these groups each optionally have a substituent.

[Chemical Formula 43]

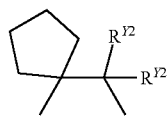

(Y-B1)

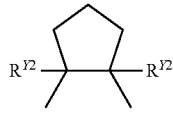

(Y-B2)

-continued

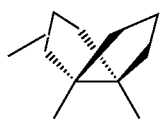 (Y-B3)

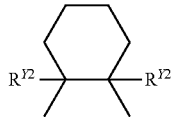 (Y-B4)

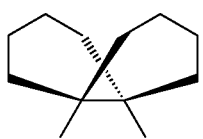 (Y-B5)

[wherein, $R^{Y2}$ represents the same meaning as described above.]

[Chemical Formula 44]

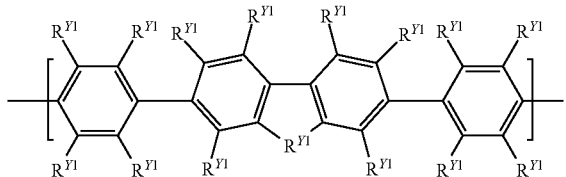 (Y-3)

[wherein, $R^{Y1}$ and $X^{Y1}$ represent the same meaning as described above.]

[Chemical Formula 45]

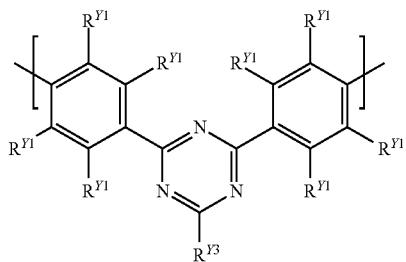 (Y-4)

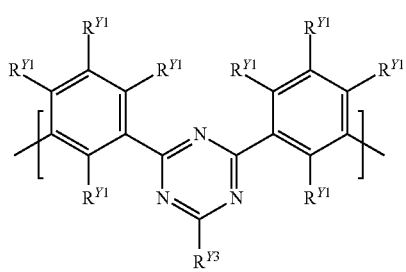 (Y-5)

[Chemical Formula 46]

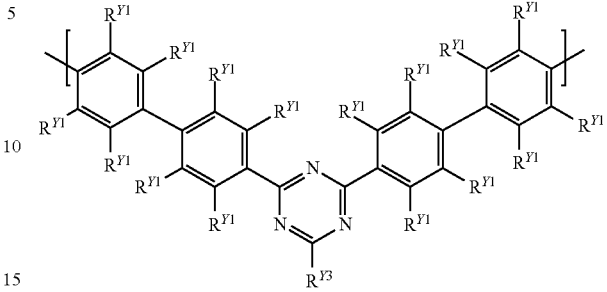

(Y-6)

(Y-7)

[wherein, $R^{Y1}$ represents the same meaning as described above. $R^{Y3}$ represents a hydrogen atom, an alkyl group, a cycloalkyl group, an alkoxy group, a cycloalkoxy group, an aryl group or a monovalent heterocyclic group and these groups each optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups each optionally have a substituent.

[Chemical Formula 47]

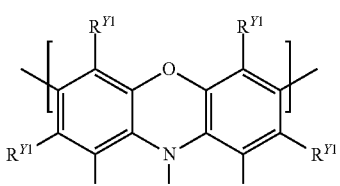 (Y-8)

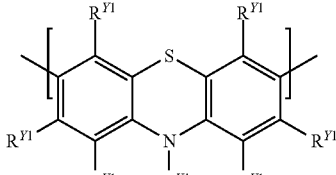 (Y-9)

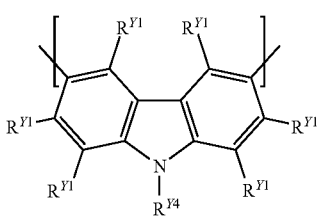 (Y-10)

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, a constitutional unit composed of an arylene group represented by the formula (Y-101) to (Y-121), a constitutional unit composed of a divalent heterocyclic group represented by the formula (Y-201) to (Y-206), and a constitutional unit composed of a divalent group in which at least one arylene group and at least one divalent heterocyclic group are bonded directly to each other represented by the formula (Y-301) to (Y-304).

[Chemical Formula 48]

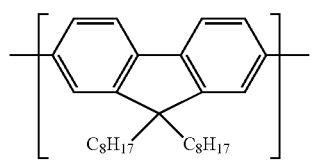
(Y-101)

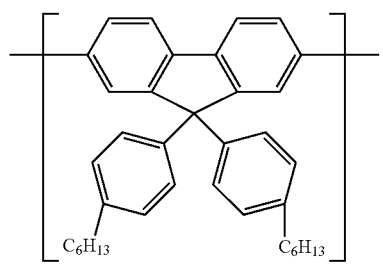
(Y-102)

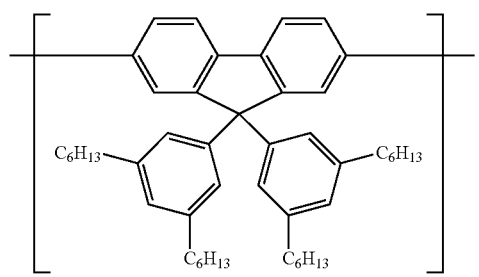
(Y-103)

[Chemical Formula 49]

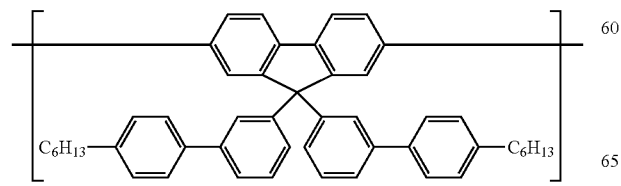
(Y-104)

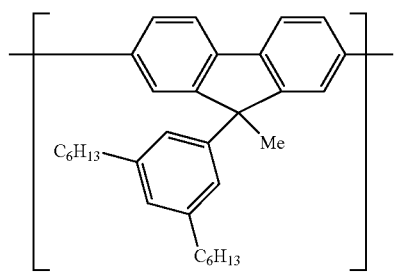
(Y-105)

[Chemical Formula 50]

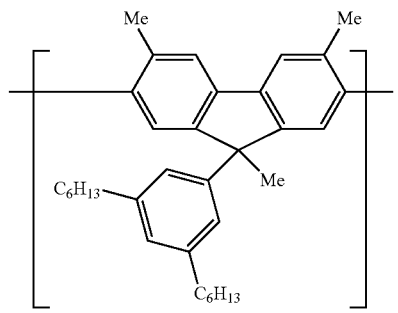
(Y-106)

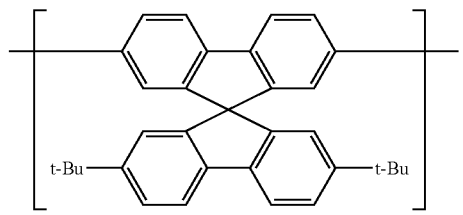
(Y-107)

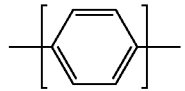
(Y-108)

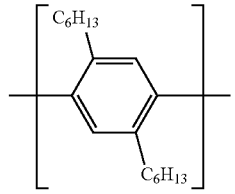
(Y-109)

[Chemical Formula 51]

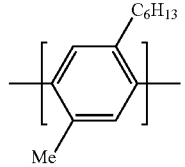
(Y-110)

(Y-111) 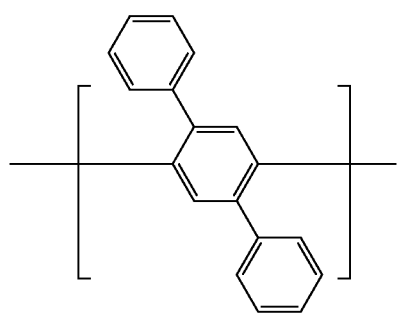
(Y-112) 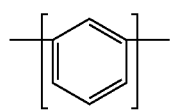
(Y-113) 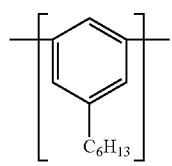
(Y-114) 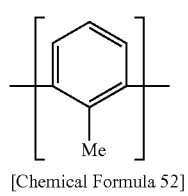
[Chemical Formula 52]
(Y-115) 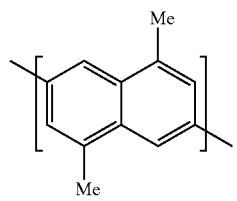
(Y-116) 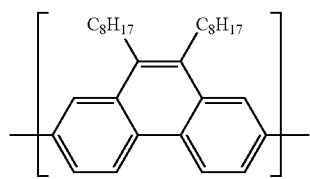
(Y-117) 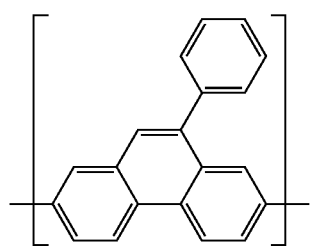
(Y-118) 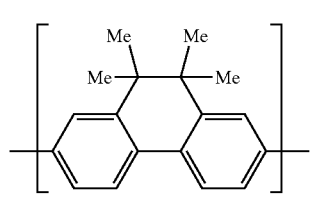
[Chemical Formula 53]
(Y-119) 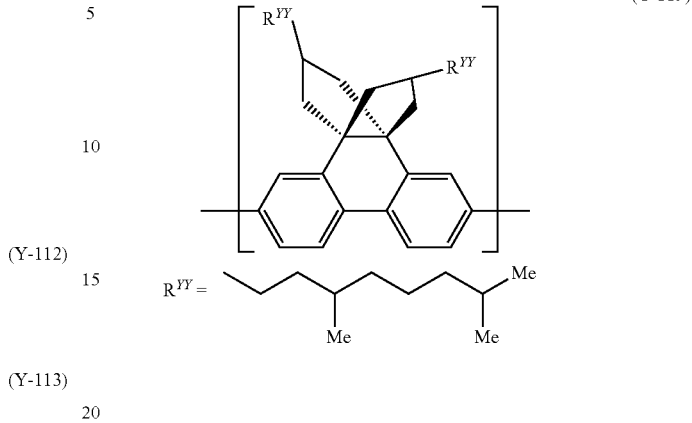
$R^{YY}=$ 
(Y-120)
(Y-121)
[Chemical Formula 54]
(Y-201) 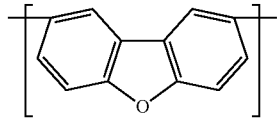
(Y-202) 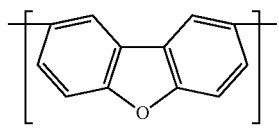

(Y-203)
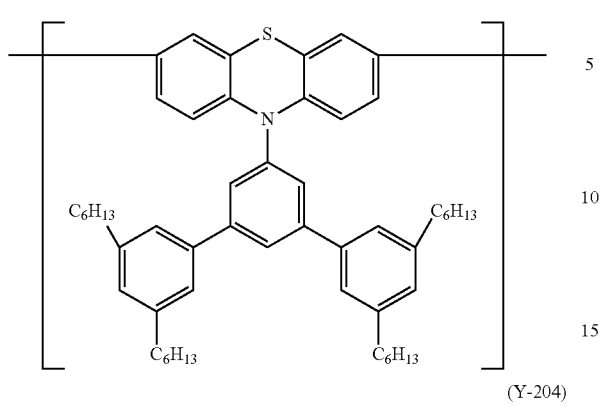
(Y-204)
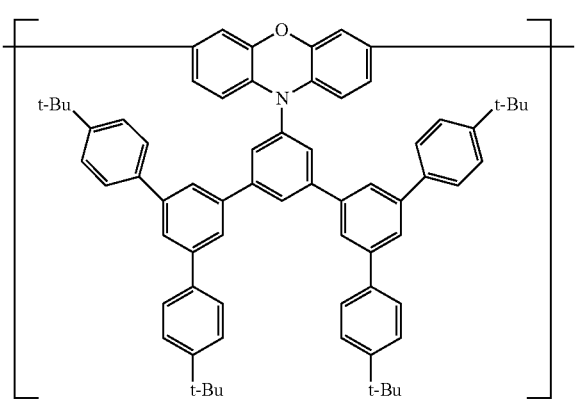
[Chemical Formula 55]
(Y-205)
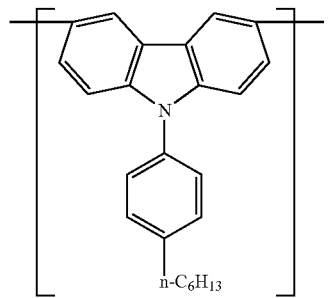
(Y-206)
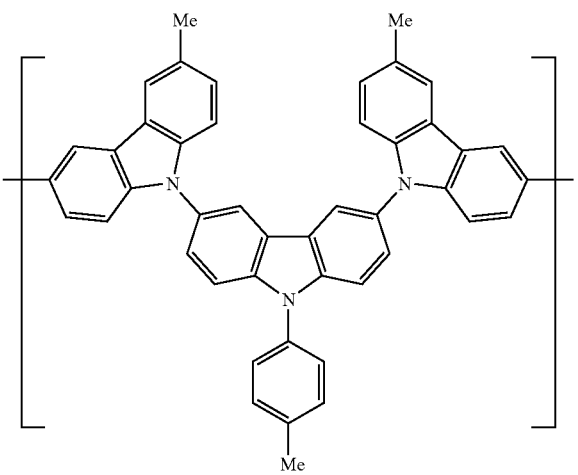
(Y-301)
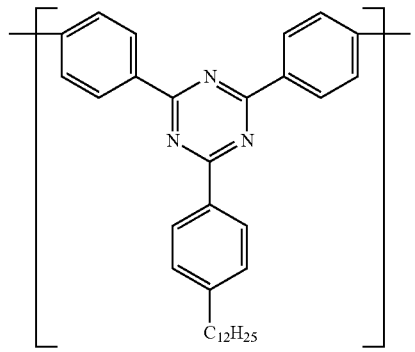
[Chemical Formula 56]
(Y-302)
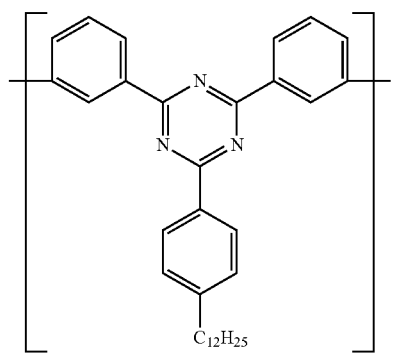
(Y-303)
(Y-304)
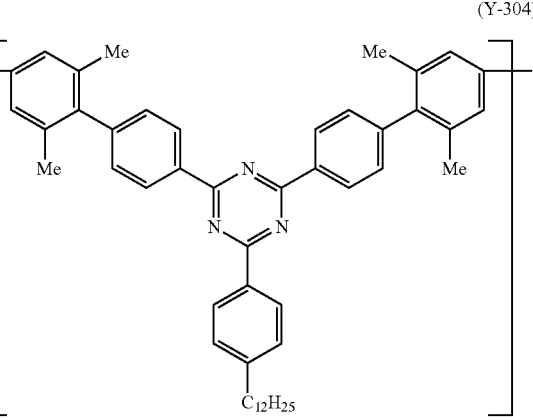

(Y-305)

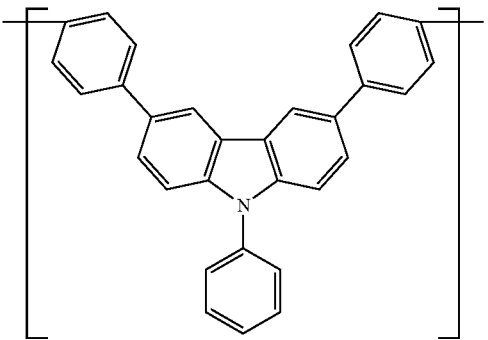

The amount of the constitutional unit represented by the formula (Y) in which Ar$^{Y1}$ is an arylene group is preferably 0.5 to 80 mol %, more preferably 30 to 60 mol % with respect to the total amount of constitutional units contained in a polymer compound, because the luminance life of a light emitting device is excellent.

The amount of the constitutional unit represented by the formula (Y) in which Ar$^{Y1}$ is a divalent heterocyclic group or a divalent group in which at least one arylene group and at least one divalent heterocyclic group are bonded directly to each other is preferably 0.5 to 30 mol %, more preferably 3 to 20 mol % with respect to the total amount of constitutional units contained in a polymer compound, because the charge transportability of a light emitting device is excellent.

The constitutional unit represented by the formula (Y) may be contained only singly or two or more units thereof may be contained in the polymer host.

It is preferable that the polymer host further comprises a constitutional unit represented by the following formula (X), because hole transportability is excellent.

[Chemical Formula 57]

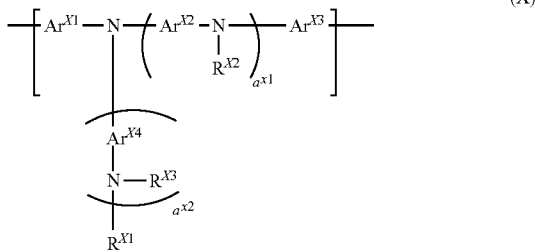

(X)

[wherein, a$^{x1}$ and a$^{x2}$ each independently represent an integer of 0 or more. Ar$^{X1}$ and Ar$^{X3}$ each independently represent an arylene group or a divalent heterocyclic group, and these groups each optionally have a substituent. Ar$^{X2}$ and Ar$^{X4}$ each independently represent an arylene group, a divalent heterocyclic group or a divalent group in which at least one arylene group and at least one divalent heterocyclic group are bonded directly to each other, and these groups each optionally have a substituent. R$^{X1}$, R$^{X2}$ and R$^{X3}$ each independently represent a hydrogen atom, an alkyl group, a cycloalkyl group, an aryl group or a monovalent heterocyclic group, and these groups each optionally have a substituent.]

a$^{x1}$ is preferably 2 or less, more preferably 1, because the luminance life of a light emitting device is excellent.

a$^{x2}$ is preferably 2 or less, more preferably 0, because the luminance life of a light emitting device is excellent.

R$^{X1}$, R$^{X2}$ and R$^{X3}$ are preferably an alkyl group, a cycloalkyl group, an aryl group or a monovalent heterocyclic group, more preferably an aryl group, and these groups each optionally have a substituent.

The arylene group represented by Ar$^{X1}$ and Ar$^{X3}$ is more preferably a group represented by the formula (A-1) or the formula (A-9), further preferably a group represented by the formula (A-1), and these groups each optionally have a substituent.

The divalent heterocyclic group represented by Ar$^{X1}$ and Ar$^{X3}$ is more preferably a group represented by the formula (AA-1), the formula (AA-2) or the formula (AA-7) to (AA-26), and these groups each optionally have a substituent.

Ar$^{X1}$ and Ar$^{X3}$ are preferably an arylene group optionally having a substituent.

The arylene group represented by Ar$^{X2}$ and Ar$^{X4}$ is more preferably a group represented by the formula (A-1), the formula (A-6), the formula (A-7), the formula (A-9) to (A-11) or the formula (A-19), and these groups each optionally have a substituent.

The more preferable range of the divalent heterocyclic group represented by Ar$^{X2}$ and Ar$^{X4}$ is the same as the more preferable range of the divalent heterocyclic group represented by Ar$^{X1}$ and Ar$^{X3}$.

The more preferable range and the further preferable range of the arylene group and the divalent heterocyclic group in the divalent group in which at least one arylene group and at least one divalent heterocyclic group are bonded directly to each other represented by Ar$^{X2}$ and Ar$^{X4}$ are the same as the more preferable range and the further preferable range of the arylene group and the divalent heterocyclic group represented by Ar$^{X1}$ and Ar$^{X3}$, respectively.

The divalent group in which at least one arylene group and at least one divalent heterocyclic group are bonded directly to each other represented by Ar$^{X2}$ and Ar$^{X4}$ includes the same groups as the divalent group in which at least one arylene group and at least one divalent heterocyclic group are bonded directly to each other represented by Ar$^{Y1}$ in the formula (Y).

Ar$^{X2}$ and Ar$^{X4}$ are preferably an arylene group optionally having a substituent.

The substituent which the group represented by Ar$^{X1}$ to Ar$^{X4}$ and R$^{X1}$ to R$^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-1) to (X-6), further preferably a constitutional unit represented by the formula (X-3) to (X-6).

[Chemical Formula 58]

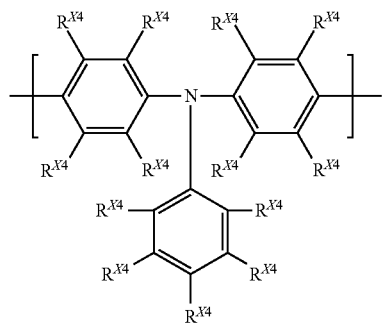
(X-1)

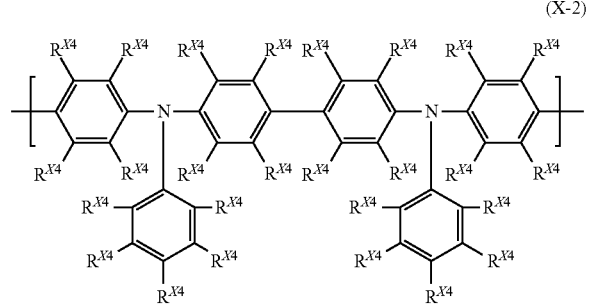
(X-2)

[Chemical Formula 59]

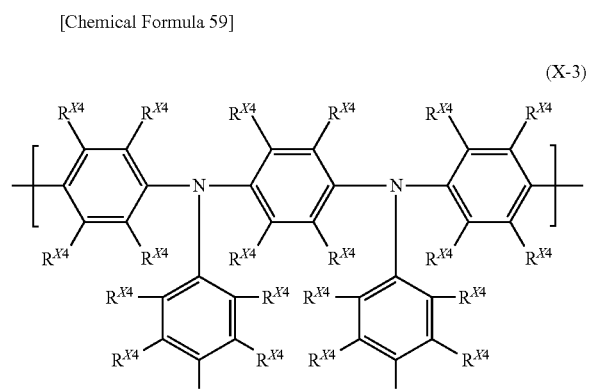
(X-3)

[Chemical Formula 60]

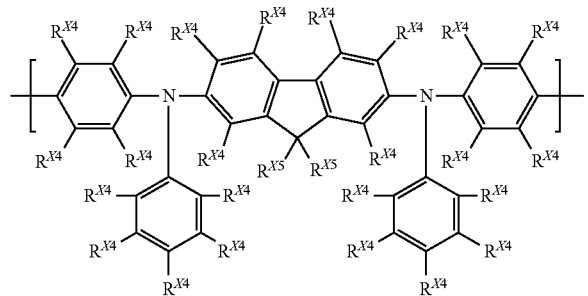
(X-4)

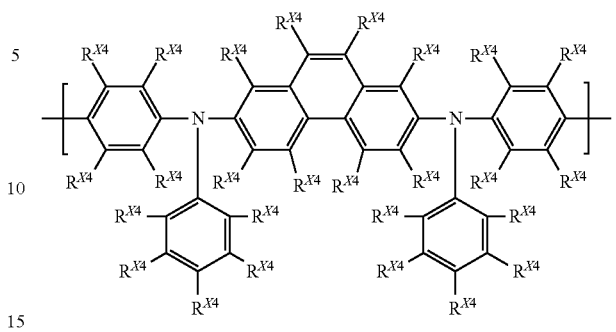
(X-5)

[Chemical Formula 61]

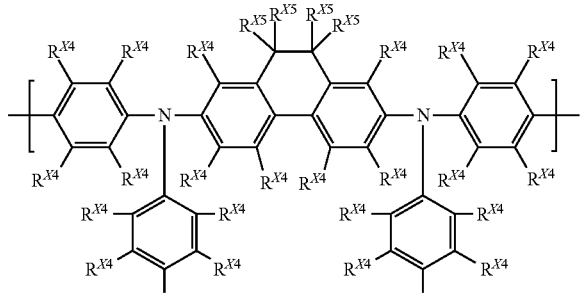
(X-6)

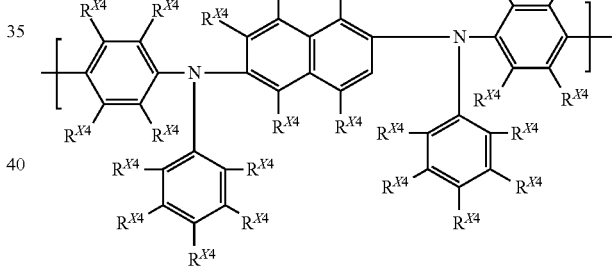
(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups each optionally have a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The amount of the constitutional unit represented by the formula (X) is preferably 0.1 to 50 mol %, more preferably 1 to 40 mol %, further preferably 5 to 30 mol % with respect to the total amount of constitutional units contained in a polymer host, because hole transportability is excellent.

The constitutional unit represented by the formula (X) includes, for example, constitutional units represented by the formulae (X1-1) to (X1-11), preferably constitutional units represented by the formulae (X1-3) to (X1-10).

[Chemical Formula 62]
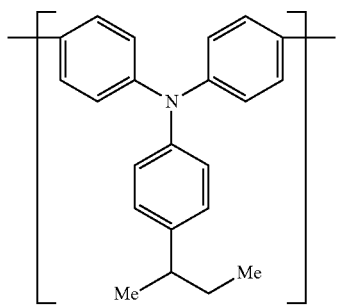
(X1-1)
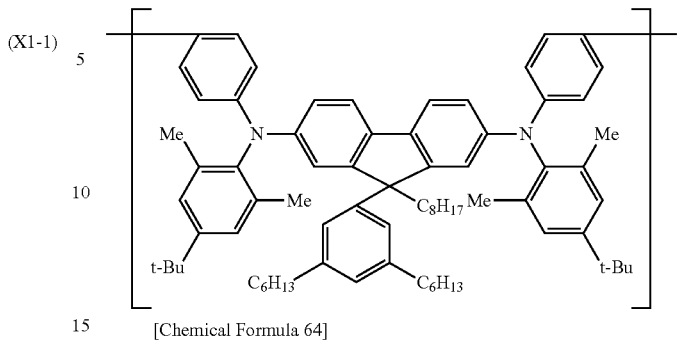
(X1-5)
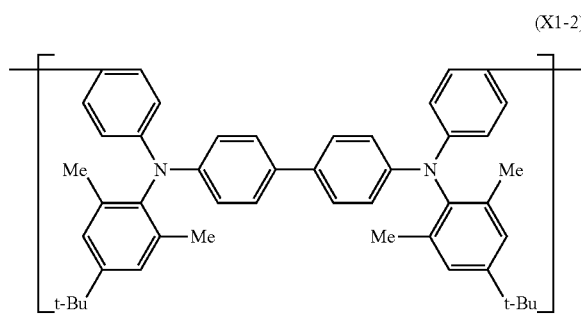
(X1-2)
[Chemical Formula 64]
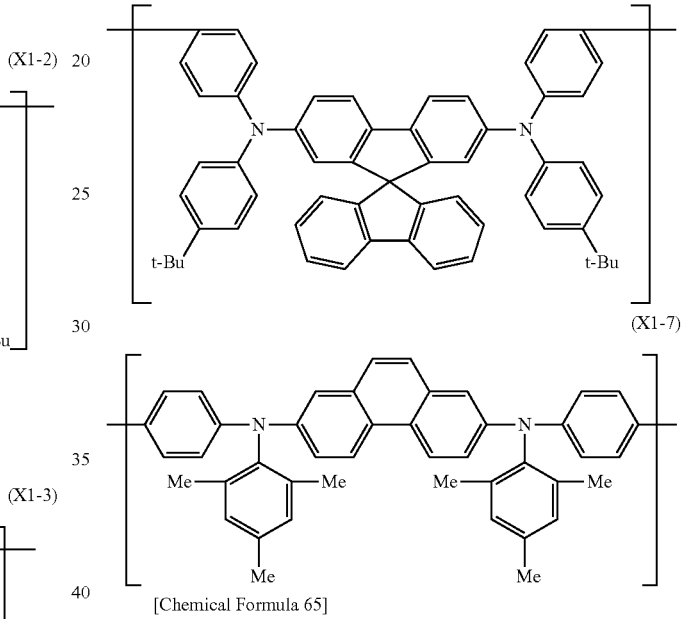
(X1-6)
(X1-7)
[Chemical Formula 65]
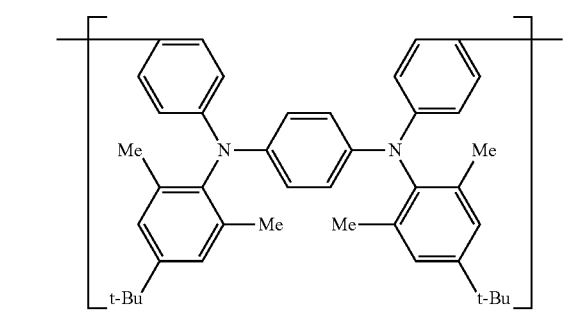
(X1-3)
[Chemical Formula 63]
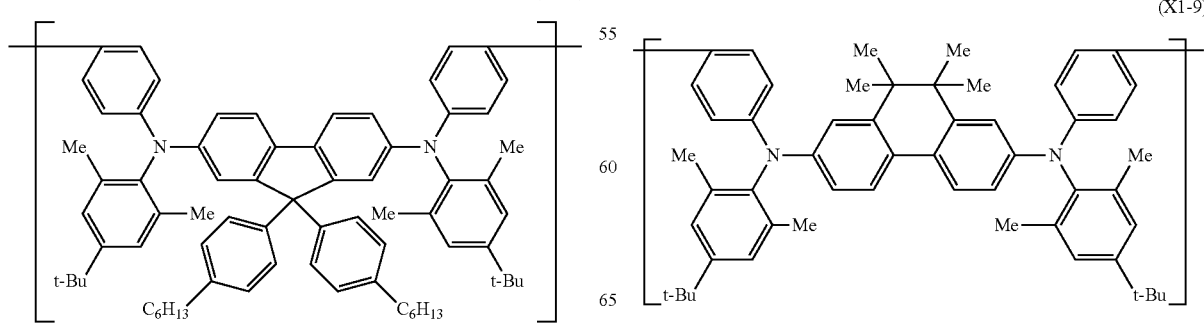
(X1-4)
(X1-8)
(X1-9)

[Chemical Formula 66] -continued

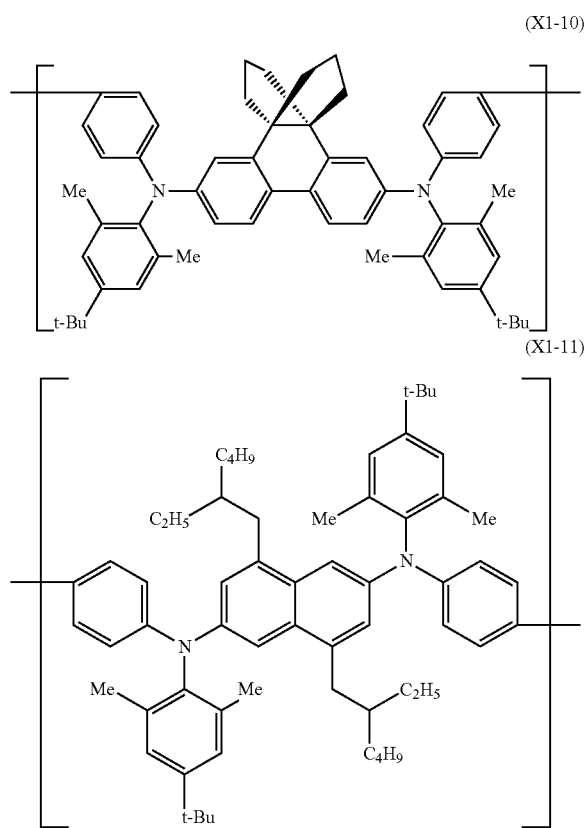

(X1-10)

(X1-11)

The constitutional unit represented by the formula (X) may be contained only singly or two or more units thereof may be contained in the polymer host.

Examples of the polymer host include polymer compounds (P-1) to (P-6) in Table 1. "Other" constitutional unit denotes a constitutional unit other than the constitutional unit represented by the formula (Y) and the constitutional unit represented by the formula (X).

TABLE 1

| polymer compound | constitutional unit and mole fraction thereof ||||||
|---|---|---|---|---|---|
| | formula (Y) ||| formula (X) | |
| | formulae (Y-1) to (Y-3) p | formulae (Y-4) to (Y-7) q | formulae (Y-8) to (Y-10) r | formulae (X-1) to (X-7) s | other t |
| (P-1) | 0.1 to 99.9 | 0.1 to 99.9 | 0 | 0 | 0 to 30 |
| (P-2) | 0.1 to 99.9 | 0 | 0.1 to 99.9 | 0 | 0 to 30 |
| (P-3) | 0.1 to 99.8 | 0.1 to 99.8 | 0 | 0.1 to 99.8 | 0 to 30 |
| (P-4) | 0.1 to 99.8 | 0.1 to 99.8 | 0.1 to 99.8 | 0 | 0 to 30 |
| (P-5) | 0.1 to 99.8 | 0 | 0.1 to 99.8 | 0.1 to 99.8 | 0 to 30 |
| (P-6) | 0.1 to 99.7 | 0.1 to 99.7 | 0.1 to 99.7 | 0.1 to 99.7 | 0 to 30 |

[In the table, p, q, r, s and t represent the mole fraction of each constitutional unit. p+q+r+s+t=100, and 100≥p+q+r+s≥70. Other constitutional unit denotes a constitutional unit other than the constitutional unit represented by the formula (Y) and the constitutional unit represented by the formula (X).]

The polymer host may be any of a block copolymer, a random copolymer, an alternating copolymer or a graft copolymer, and may also be another embodiment, and is preferably a copolymer produced by copolymerizing a plurality of raw material monomers.

[Hole Transporting Material]

The hole transporting material is classified into low molecular weight compounds and polymer compounds, and may have a crosslinkable group.

As the low molecular weight compound, for example, aromatic amines such as 1,1-bis(di-4-tolylaminophenyl)cyclohexane (TAPC), N,N'-diphenyl-N,N'-[bis(3-methylphenyl)]-[1,1'-biphenyl]-4, 4'-diamine (TPD), (N,N'-di-α-naphthyl-N,N'-diphenyl)-benzidine (α-NPD) and 4,4',4''-tris(3-methylphenylphenylamino)triphenylamine (MTDATA) are mentioned.

The polymer compound includes, for example, polyvinylcarbazole and derivatives thereof; polyarylenes having an aromatic amine structure in the side chain or main chain and derivatives thereof. The polymer compound may be a compound to which an electron accepting site is bonded. The electron accepting site includes, for example, fullerene, tetrafluorotetracyanoquinodimethane, tetracyanoethylene and trinitrofluorenone.

In the ink, the blending amount of a hole transporting material is usually 1 to 1000000 parts by weight, preferably 10 to 100000 parts by weight with respect to 100 parts by weight of the metal complex represented by the formula (1-A) or the formula (1-B).

[Hole Injection Material]

The hole injection material is classified into low molecular weight compounds and polymer compounds, and may have a crosslinkable group.

The low molecular weight compound includes, for example, metal phthalocyanines such as copper phthalocyanine; and oxides of metals such as molybdenum and tungsten.

The polymer compound includes, for example, electrically conductive polymers such as polyaniline, polythiophene and polypyrrole.

In the ink, the blending amount of a hole injection material is usually 1 to 1000000 parts by weight, preferably 10 to 100000 parts by weight with respect to 100 parts by weight of the metal complex represented by the formula (1-A) or the formula (1-B).

[Electron Transporting Material]

The electron transporting material is classified into low molecular weight compounds and polymer compounds. The electron transporting material may have a crosslinkable group.

The low molecular weight compound includes, for example, metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene, and derivatives thereof.

In the ink, the blending amount of an electron transporting material is usually 1 to 1000000 parts by weight, preferably 1 to 100000 parts by weight with respect to 100 parts by weight of the metal complex represented by the formula (1-A) or the formula (1-B).

[Electron Injection Material]

The electron injection material is classified into low molecular weight compounds and polymer compounds. The electron injection material may have a crosslinkable group.

The low molecular weight compound includes, for examples, metal fluorides such as lithium fluoride, sodium fluoride, cesium fluoride and potassium fluoride.

The polymer compound includes, for example, polyphenylenevinylene, polythienylenevinylene, polyquinoline and polyquinoxaline, and derivatives thereof, and the like.

In the ink, the blending amount of an electron injection material is usually 1 to 1000000 parts by weight, preferably 1 to 100000 parts by weight with respect to 100 parts by weight of the metal complex represented by the formula (1-A) or the formula (1-B).

[Light Emitting Material]

The light emitting material (different from the metal complex represented by the formula (1-A) or the formula (1-B)) is classified into low molecular weight compounds and polymer compounds. The light emitting material may have a crosslinkable group.

The low molecular weight compound includes, for example, naphthalene and derivatives thereof, anthracene and derivatives thereof, and perylene and derivatives thereof.

The polymer compound includes, for example, polymer compounds such as a phenylene group, a naphthalenediyl group, an anthracenediyl group, a fluorenediyl group, a phenanthrenediyl group, a dihydrophenanthrenediyl group, a carbazolediyl group, a phenoxazinediyl group, a phenothiazinediyl group, an anthracenediyl group and a pyrenediyl, and copolymers of them with aromatic amines.

In the ink, the blending amount of a light emitting material is usually 0.01 to 1000000 parts by weight, preferably 0.1 to 100000 parts by weight with respect to 100 parts by weight of the metal complex represented by the formula (1-A) or the formula (1-B).

[Antioxidant]

The antioxidant may be a compound soluble in an organic solvent which is the same as the solvent in which the metal complex represented by the formula (1-A) or the formula (1-B) is soluble and which does not inhibit light emission and charge transportation, and includes, for example, phenol antioxidants and phosphorus-based antioxidants.

In the ink, the blending amount of an antioxidant is usually 0.01 to 10 parts by weight, preferably 0.1 to 5 parts by weight with respect to 100 parts by weight of the metal complex represented by the formula (1-A) or the formula (1-B).

<Ink Storage Step•Storage Step>

The ink storage step is a step of storing the ink prepared in the ink preparation step for 3 days or more under light shielding. The storage step is a step of storing the ink prepared in the ink preparation step for three days or more, and the storage step is preferably performed under light shielding. Hereinafter, the ink storage step and the storage step are collectively referred to simply as "ink storage step".

The storage time in the ink storage step is preferably 1 week or more because the external quantum efficiency of a light emitting device is excellent. The storage time in the ink storage step is preferably 3 years or less, more preferably 1 year or less, further preferably 1 to 5 weeks, particularly preferably 3 to 5 weeks.

In the ink storage step, the ink may be stored in a brown glass bottle or in a light-shielding sealed container made of a metal or the like, or placed in a transparent container and stored under light shielding, and it is preferable that the ink is stored under complete light shielding.

In the ink storage step, the atmosphere is not limited and an air atmosphere may be permissible, but an atmosphere of an inert gas such as a nitrogen gas and an argon gas is preferable.

In the ink storage step, the storage temperature is usually 0° C. to 50° C., preferably 10° C. to 30° C.

It is preferable that $Cb[M]$, $Cb[M+16n]$, $Ca[M]$ and $Ca[M+16n]$ in the formula (1) satisfy the formula (1').

$$0.3 \leq (Ca[M+16n]/Ca[M])/(Cb[M+16n]/Cb[M]) \leq 10 \qquad (1')$$

<Film Formation Step>

The film formation step is a step of forming a film by an application method using an ink stored in the ink storage step and in which the total content of metal complexes having a molecular weight larger by 16, 32 or 48 than that of the metal complex represented by the formula (1-A) or the formula (1-B) according to the area percentage value is 0.6 or less when the content of the metal complex represented by the formula (1-A) or the formula (1-B) according to the area percentage value is taken as 100.

The total content of metal complexes having a molecular weight larger by 16, 32 or 48 than that of the metal complex represented by the formula (1-A) or the formula (1-B) according to the area percentage value, stored in the ink storage step, is preferably 0.01 to 0.52, more preferably 0.02 to 0.10 when the content of the metal complex represented by the formula (1-A) or the formula (1-B) according to the area percentage value is taken as 100.

When a plurality of the metal complexes represented by the formula (1-A) or the formula (1-B) are contained in the ink used in the film formation step, the content of the metal complex contained in the largest amount is taken as 100. On the other hand, when a plurality of metal complexes having a molecular weight larger by 16, 32, or 48 than that of the metal complex represented by the formula (1-A) or the formula (1-B) are contained, the total content is adopted.

The metal complex having a molecular weight larger by 16, 32 or 48 than that of the metal complex represented by the formula (1-A) or the formula (1-B) is a component that can be generated by an external factor or an internal factor in the metal complex production step, the ink preparation step and the ink storage step.

The amount of the metal complex represented by the formula (1-A) or the formula (1-B) and the metal complex having a molecular weight larger by 16, 32 or 48 than that of the metal complex represented by the formula (1-A) or the formula (1-B) in the ink used in the film formation step can be analyzed by liquid chromatography (LC). The metal complex having a molecular weight larger by 16, 32 or 48 than that of the metal complex represented by the formula (1-A) or the formula (1-B) in the ink can be detected by LC-MS. Note that this analysis and detection are performed after the ink storage step.

The application method for the film formation step includes, for example, a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method and a nozzle coat method.

In the film formation step, after applying the ink to a substrate or the like by an application method, an organic solvent is removed as necessary. As a method for removing an organic solvent, for example, natural drying and heating are mentioned.

The film formation step may be performed under an air atmosphere, but it is preferable to perform it under light shielding and under an inert gas atmosphere.

<Others>

The film produced by the film production method of the present invention is useful for a light emitting device. The constitution of a light emitting device comprises, for example, electrodes consisting of an anode and a cathode, and a light emitting layer composed of the above-described film disposed between the electrodes. The light emitting device may additionally comprise a hole transporting layer, an electron transporting layer, a light emitting layer, a hole injection layer, an electron injection layer and the like between the electrodes.

It is preferable that the material used for a hole transporting layer, an electron transporting layer and a light emitting layer has a crosslinkable group to avoid dissolution of the material in a solvent in which a layer adjacent to the hole transporting layer, the electron transporting layer and the light emitting layer is dissolved in forming the adjacent layer. After forming each layer using the material having a crosslinkable group, the crosslinkable group can be crosslinked to insolubilize the layer.

The method of forming each layer includes, for example, a vacuum vapor deposition method from powder, a method by film formation from solution or melted state. The order, number and thickness of the layers to be laminated are adjusted in view of the external quantum efficiency and the luminance life.

The substrate in the light emitting device may be a substrate on which a single-layered or laminated electrode can be formed and which does not chemically change when forming an organic layer and, for example, is a substrate made of a material such as glass, plastic and silicon. In the case of an opaque substrate, it is preferred that the electrode farthest from the substrate is transparent or semi-transparent.

The anode material includes, for example, electrically conductive metal oxides and semi-transparent metals, preferably, indium oxide, zinc oxide, tin oxide; electrically conductive compounds such as indium.tin.oxide (ITO) and indium.zinc.oxide; a complex of silver and palladium and copper (APC); NESA, gold, platinum, silver and copper.

The cathode material includes, for example, metals such as lithium, sodium, potassium, rubidium, cesium, beryllium, magnesium, calcium, strontium, barium, aluminum, zinc and indium; alloys composed of two or more of them; alloys composed of at least one of them and at least one of silver, copper, manganese, titanium, cobalt, nickel, tungsten and tin; and graphite and graphite intercalation compounds.

EXAMPLES

The present invention will be illustrated further in detail by examples below, but the present invention is not limited to these examples.

In the examples, the polystyrene-equivalent number average molecular weight (Mn) and the polystyrene-equivalent weight average molecular weight (Mw) of a polymer compound were measured by size exclusion chromatography (SEC) (manufactured by Shimadzu Corp., trade name: LC-10Avp). SEC measurement conditions are as described below.

[Measurement Condition]

The polymer compound to be measured was dissolved in THF at a concentration of about 0.05 wt %, and 10 µL of the solution was injected into SEC. As the mobile phase of SEC, THF was used and allowed to flow at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

NMR measurement was conducted by the following method.

Approximately 10 mg of a measurement sample was dissolved in about 0.7 mL of a deuterated solvent and NMR was measured using an NMR apparatus (trade name: MERCURY 300, manufactured by Varian, Inc.).

As an indicator of the purity of the compound, the high performance liquid chromatography (HPLC) area percent value was used. Unless otherwise specified, this value is a value at 254 nm in HPLC (trade name: LC-20A, manufactured by Shimadzu Corporation). In this case, the compound to be measured was dissolved in an ink solvent so as to give a concentration of 0.01 to 1.0% by weight, preferably 0.01 to 0.2% by weight, and the solution was injected in an amount of 1 to 10 µL depending on the concentration into HPLC. Samples for HPLC were prepared within 30 minutes, stored under light shielding, and NMR was measured within 10 hours after sample preparation. As the mobile phase of HPLC, acetonitrile and tetrahydrofuran were used, and the solution was flowed at a flow rate of 1 mL/min at gradient of acetonitrile/tetrahydrofuran=100/0 to 0/100 (volume ratio). As the column, SUMIPAX ODS Z-CLUE (manufactured by Sumika Chemical Analysis Service, Ltd.) or an ODS column having the equivalent performance was used. As the detector, a photodiode array detector (trade name: SPD-M20A, manufactured by Shimadzu Corporation,) was used.

Liquid chromatograph mass spectrometry (LC-MS) was conducted by the following method.

A measurement sample was dissolved in an ink solvent so as to give a concentration of about 2 mg/mL, and about 1 µL of the solution was injected into LC-MS (trade name: 1100LCMSD, manufactured by Agilent Technologies). Samples for LC-MS were prepared within 30 minutes, stored under light shielding, and LC-MS was measured within 10 hours after sample preparation. As the mobile phase for LC-MS, acetonitrile and THF were used while changing the ratio thereof, and the solution was flowed at a flow rate of 0.2 ml/min. As the column, SUMIPAX ODS Z-CLUE (φ4.6×250 mm, 3 µm, manufactured by Sumika Chemical Analysis Service, Ltd.) was used.

<Synthesis Example 1> Synthesis of Monomers 1, 4

A monomer 1 was synthesized according to the synthesis method described in Dalton Trans., 2011, 40, 2433.

A monomer 4 was synthesized according to the synthesis method described in International Publication WO 2005/049546.

[Chemical Formula 67]

Monomer 1

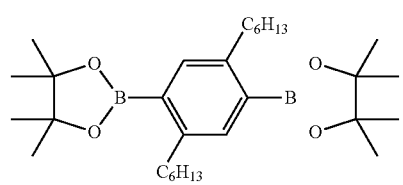

-continued

Monomer 4

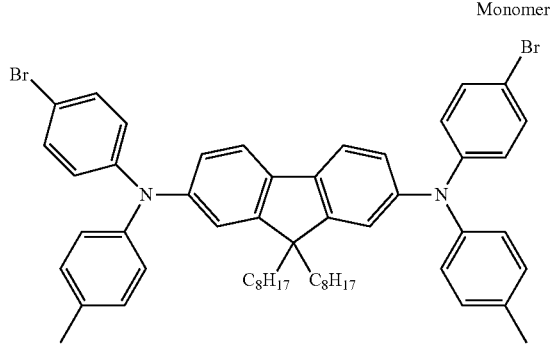

<Synthesis Example 2> Synthesis of Monomer 2

[Chemical Formula 68]

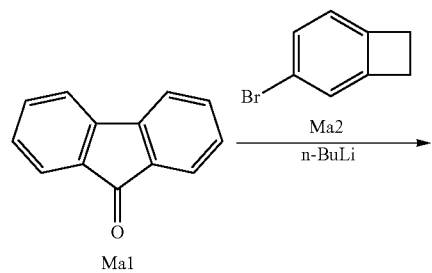

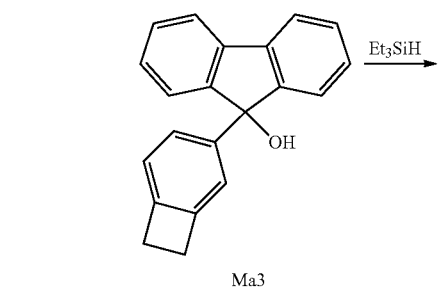

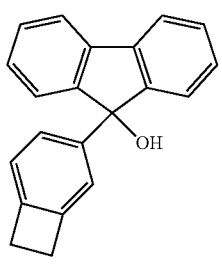

A gas in a flask equipped with a stirrer was purged with a nitrogen gas, then, a compound Ma2 (64.6 g) and tetrahydrofuran (615 mL) were added, and the mixture was cooled down to −70° C. Into this, a n-butyllithiumhexane solution (1.6 M, 218 mL) was dropped over a period of 1 hour, then, the mixture was stirred at −70° C. for 2 hours. To this, a compound Ma1 (42.1 g) was added in several batches, then, the mixture was stirred at −70° C. for 2 hours. Into this, methanol (40 mL) was dropped over a period of 1 hour, then, the mixture was heated up to room temperature. Thereafter, the solvent was distilled off by concentrating under reduced pressure, and toluene and water were added. Thereafter, an aqueous layer was separated and the resultant organic layer was washed with water. The resultant organic layer was concentrated under reduced pressure, and the resultant residue was purified by using a silica gel column (mobile phase: a mixed solvent of hexane and ethyl acetate), thereby obtaining 71 g of a compound Ma3 as a colorless oil. This operation was repeated, thereby obtaining a necessary amount of the compound Ma3.

$^1$H-NMR (CDCl$_3$, 300 MHz): δ (ppm): 2.43 (1H, s), 3.07-3.13 (4H, m), 6.95 (1H, d), 7.07 (1H. s), 7.18-7.28 (3H, m), 7.28-7.40 (4H, m), 7.66 (2H, s).

A gas in a flask equipped with a stirrer was purged with a nitrogen gas, then, the compound Ma3 (72.3 g), toluene (723 mL) and triethylsilane (118.0 g) were added, and the mixture was heated up to 70° C. Into this, methanesulfonic acid (97.7 g) was dropped over a period of 1.5 hours, then, the mixture was stirred at 70° C. for 0.5 hours. Thereafter, the mixture was cooled down to room temperature, and toluene (1 L) and water (1 L) were added, then, an aqueous layer was separated. The resultant organic layer was washed with water, a 5 wt % sodium hydrogen carbonate aqueous solution and water in this order. The resultant organic layer was concentrated under reduced pressure, and the resultant coarse product was recrystallized from a mixed solvent of toluene and ethanol, thereby obtaining 51.8 g of a compound Ma4 as a white solid. This operation was repeated, thereby obtaining a necessary amount of the compound Ma4.

$^1$H-NMR (CDCl$_3$, 300 MHz): δ (ppm): 3.03-3.14 (4H, m), 4.99 (1H, s), 6.68 (1H, s), 6.92-7.01 (2H, m), 7.20-7.28 (2H, m), 7.29-7.38 (4H, m), 7.78 (2H, d).

[Chemical Formula 69]

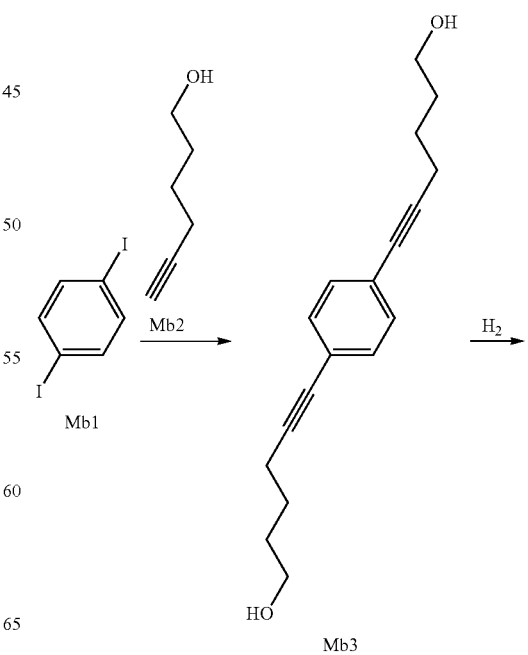

-continued

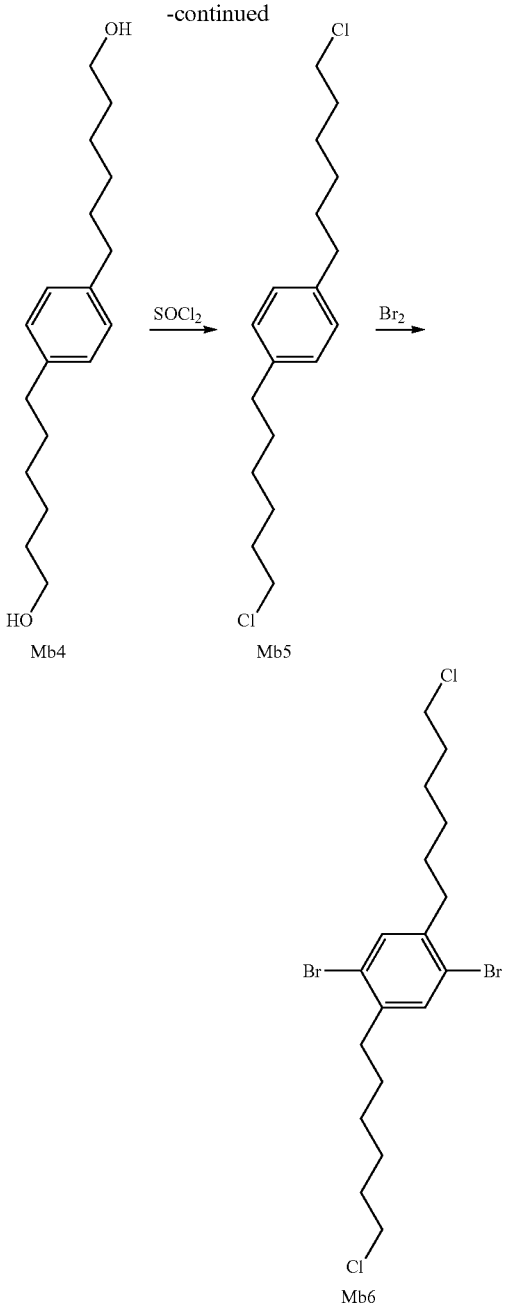

A gas in a flask equipped with a stirrer was purged with a nitrogen gas, then, a compound Mb1 (185.0 g), a compound Mb2 (121.1 g), copper iodide (I) (3.2 g), dichloromethane (185 mL) and triethylamine (2.59 L) were added, and the mixture was heated up to the reflux temperature. Thereafter, the mixture was stirred at the reflux temperature for 0.5 hours, and cooled down to room temperature. To this was added dichloromethane (1.85 L), then, the mixture was filtrated through a filter paved with celite. To the resultant filtrate was added a 10 wt % sodium hydrogen carbonate aqueous solution, then, an aqueous layer was separated. The organic layer was washed with water twice, washed with a saturated sodium chloride aqueous solution, then, magnesium sulfate was added. The resultant mixture was filtrated, and the resultant filtrate was concentrated under reduced pressure. The resultant residue was purified by using a silica gel column (mobile phase: a mixed solvent of chloroform and ethyl acetate), thereby obtaining a coarse product. This resultant coarse product was dissolved in ethanol (1.4 L), then, activated carbon (5 g) was added, and the mixture was filtrated. The resultant filtrate was concentrated under reduced pressure, and the resultant residue was recrystallized from hexane, thereby obtaining 99.0 g of a compound Mb3 as a white solid. This operation was repeated, thereby obtaining a necessary amount of the compound Mb3.

$^1$H-NMR (DMSO-$d_6$, 300 MHz): δ (ppm): 1.52-1.55 (8H, m), 2.42 (4H, t), 3.38-3.44 (4H, m), 4.39-4.43 (2H, m), 7.31 (4H, s).

A gas in a flask equipped with a stirrer was purged with a nitrogen gas, then, the compound Mb3 (110.0 g), ethanol (1.65 L) and palladium/carbon (Palladium weight: 10%) (11.0 g) were added, and the mixture was heated up to 30° C. Thereafter, a gas in the flask was purged with a hydrogen gas. Thereafter, the mixture was stirred at 30° C. for 3 hours while feeding a hydrogen gas into the flask. Thereafter, a gas in the flask was purged with a nitrogen gas. The resultant mixture was filtrated, and the resultant filtrate was concentrated under reduced pressure. The resultant residue was purified by using a silica gel column (mobile phase: a mixed solvent of chloroform and ethyl acetate), thereby obtaining a coarse product. This resultant coarse product was recrystallized from hexane, thereby obtaining 93.4 g of a compound Mb4 as a white solid.

$^1$H-NMR (CDCl$_3$, 300 MHz): δ (ppm): 1.30-1.40 (8H, m), 1.55-1.65 (8H, m), 2.58 (4H, t), 3.64 (4H, t), 7.09 (4H, s).
$^{13}$C-NMR (CDCl$_3$, 75 MHz): δ (ppm): 25.53, 28.99, 31.39, 32.62, 35.37, 62.90, 128.18, 139.85.

A gas in a flask equipped with a stirrer was purged with a nitrogen gas, then, the compound Mb4 (61.0 g), pyridine (0.9 g) and toluene (732 mL) were added, and the mixture was heated up to 60° C. Into this, thionyl chloride (91.4 g) was dropped over a period of 1.5 hours, then, the mixture was stirred at 60° C. for 5 hours. The resultant mixture was cooled down to room temperature, then, concentrated under reduced pressure. The resultant residue was purified by using a silica gel column (mobile phase: a mixed solvent of hexane and ethyl acetate), thereby obtaining 64.3 g of a compound Mb5 as a colorless oil.

$^1$H-NMR (CDCl$_3$, 300 MHz): δ (ppm): 1.35-1.40 (4H, m), 1.41-1.50 (4H, m), 1.60-1.68 (4H, m), 1.75-1.82 (4H, m), 2.60 (4H, t), 3.55 (4H, t), 7.11 (4H, s).

A gas in a flask equipped with a stirrer was purged with a nitrogen gas, then, the compound Mb5 (42.0 g), an iron powder (1.7 g), iodine (0.3 g) and dichloromethane (800 mL) were added. Thereafter, the whole flask was light-shielded, and cooled at 0 to 5° C. Into this, a mixed solution of bromine (44.7 g) and dichloromethane (200 mL) was dropped over a period of 1 hour, then, the mixture was stirred at 0 to 5° C. overnight. The resultant mixed solution was added to water (1.2 L) cooled at 0 to 5° C., then, an organic layer was separated. The organic layer was washed with a 10 wt % sodium thiosulfate aqueous solution, and further, washed with a saturated sodium chloride aqueous solution and water in this order. To the resultant organic layer was added sodium sulfate, then, the mixture was filtrated, and the resultant filtrate was concentrated under reduced pressure. The resultant residue was purified by using a silica gel column (mobile phase: hexane), thereby obtaining a coarse product. This resultant coarse product was recrystallized from hexane, thereby obtaining 47.0 g of a compound Mb6 as a white solid.

¹H-NMR (CDCl₃, 300 MHz): δ (ppm): 1.38-1.45 (4H, m), 1.47-1.55 (4H, m), 1.57-1.67 (4H, m), 1.77-1.84 (4H, m), 2.66 (4H, t), 3.55 (4H, t), 7.36 (2H, s).

[Chemical Formula 70]

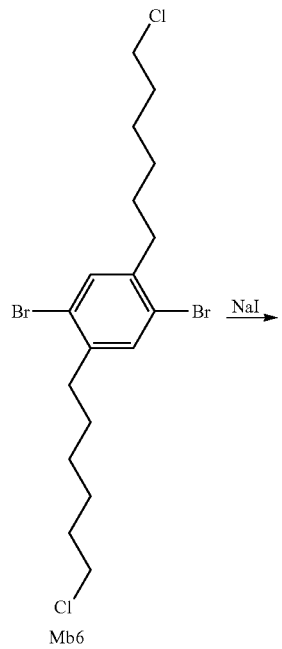

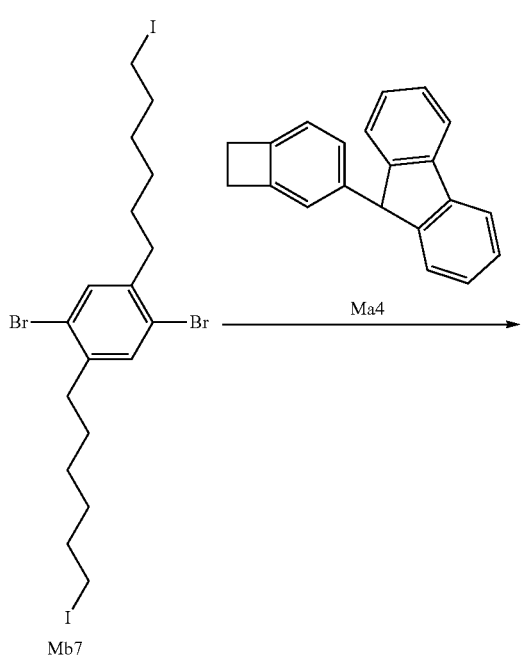

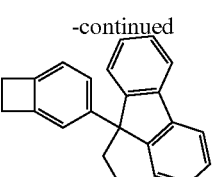

A gas in a flask equipped with a stirrer was purged with a nitrogen gas, then, sodium iodide (152.1 g) and acetone (600 mL) were added, and the mixture was stirred at room temperature for 0.5 hours. To this the compound Mb6 (40.0 g) was added, then, the mixture was heated up to the reflux temperature, and stirred at the reflux temperature for 24 hours. Thereafter, the mixture was cooled down to room temperature, and the resultant mixed solution was added to water (1.2 L). The deposited solid was separated by filtration, then, washed with water, thereby obtaining a coarse product. This resultant coarse product was recrystallized from a mixed solution of toluene and methanol, thereby obtaining 46.0 g of a compound Mb7 as a white solid. This operation was repeated, thereby obtaining a necessary amount of the compound Mb7.

¹H-NMR (CDCl₃, 300 MHz): δ (ppm): 1.35-1.50 (8H, m), 1.57-1.65 (4H, m), 1.80-1.89 (4H, m), 2.65 (4H, t), 3.20 (4H, t), 7.36 (2H, s).

A gas in a flask equipped with a stirrer was purged with a nitrogen gas, then, sodium hydride (60 wt %, dispersed in liquid paraffin) (9.4 g), tetrahydrofuran (110 mL) and the compound Mb7 (63.2 g) were added. To this, a compound Ma4 (55.0 g) was added in several batches, then, the mixture was stirred for 12 hours. To this were added toluene (440 mL) and water (220 mL), then, an aqueous layer was separated. The organic layer was washed with water, then, magnesium sulfate was added. The resultant mixed solution was filtrated, and the resultant filtrate was concentrated under reduced pressure, thereby obtaining a coarse product. This resultant coarse product was purified by using a silica gel column (mobile phase: a mixed solvent of hexane and toluene). Thereafter, the product was recrystallized from heptane, thereby obtaining 84.1 g of a compound Mb8 as a white solid.

¹H-NMR (CDCl₃, 300 MHz): δ (ppm): 0.70-0.76 (4H, m), 1.10-1.21 (8H, m), 1.32-1.44 (4H, m), 2.39-2.58 (8H, m), 3.00-3.12 (8H, m), 6.82-6.94 (4H, m), 7.00-7.05 (2H, m), 7.17-7.28 (10H, m), 7.30-7.38 (4H, m), 7.71-7.77 (4H, m).

A gas in a flask equipped with a stirrer was purged with a nitrogen gas, then, the compound Mb8 (84.0 g), [1,1'-bis(diphenylphosphino)ferrocene]palladium(II) dichloride dichloromethane adduct (PdCl₂ (dppf).CH₂Cl₂, 2.2 g), bis(pinacolato)diboron (68.3 g), potassium acetate (52.8 g) and cyclopentyl methyl ether (840 mL) were added, and the mixture was heated up to the reflux temperature, then, stirred at the reflux temperature for 5 hours. Thereafter, the mixture was cooled down to room temperature, and toluene (500 mL) and water (300 mL) were added, then, an aqueous layer was separated. The organic layer was washed with water, then, activated carbon (18.5 g) was added. The resultant mixed solution was filtrated, and the resultant filtrate was concentrated under reduced pressure, thereby obtaining a coarse product. This coarse product was purified by using a silica gel column (mobile phase: a mixed solvent of hexane and toluene). Thereafter, an operation of recrystallization from a mixed solution of toluene and acetonitrile was repeated, thereby obtaining 45.8 g of a monomer 2 as a white solid.

¹H-NMR (CDCl₃, 300 MHz): δ (ppm): 0.70-0.76 (4H, m), 1.24-1.40 (36H, m), 2.39-2.48 (4H, m), 2.66-2.75 (4H, m), 3.00-3.10 (8H, m), 6.76-6.90 (4H, m), 7.00-7.05 (2H, m), 7.19-7.30 (8H, m), 7.30-7.36 (4H, m), 7.43 (2H, s), 7.72 (4H, d).

<Synthesis Example 3> Synthesis of Monomer 3

[Chemical Formula 71]

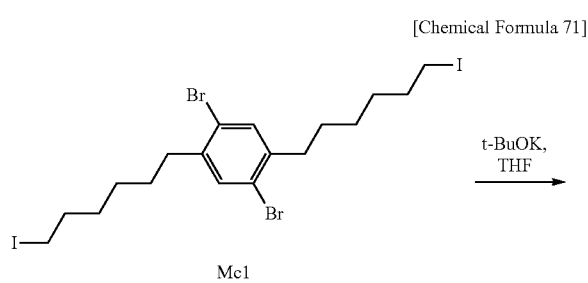

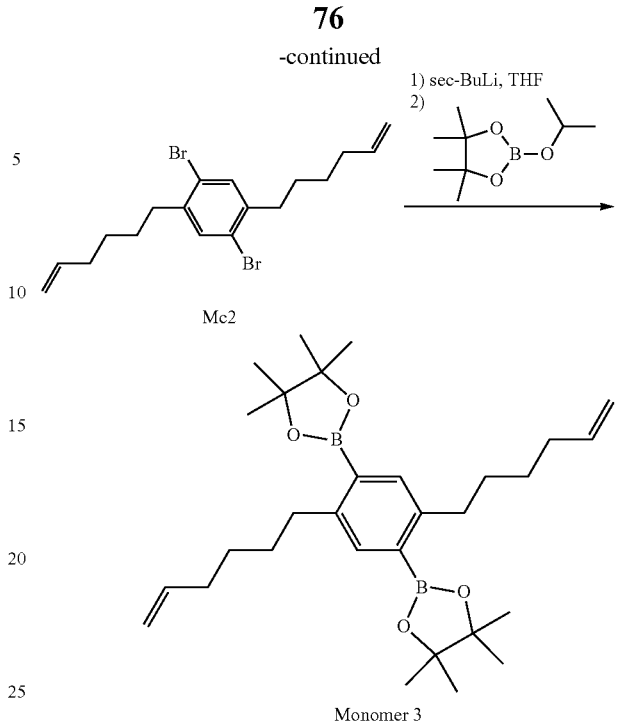

Under a nitrogen gas atmosphere, a compound Mc 1 (26 g, 39.6 mmol) was dissolved in tetrahydrofuran (500 mL) and the solution was cooled to 0° C. to 5° C. Potassium tert-butoxide (17.75 g, 158.5 mmol) was added slowly at a temperature in the range of 0° C. to 5° C., the reaction solution was allowed to warm to room temperature and stirred for 24 h. Ice water (500 mL) was added to the reaction solution, and after allowing to stand still, the separated organic layer was separated from the aqueous layer and combined with the ethyl acetate extract of the aqueous layer. The organic layer was concentrated under reduced pressure to remove the solvent, to give an oil. This oil was purified by silica gel column chromatography using hexane, to obtain 14.5 g of the intended compound Mc2.

¹H-NMR (400 MHz, CDCl₃): δ (ppm)=7.37 (s, 2H), 5.81-5.87 (m, 2H), 4.96-5.07 (m, 4H), 2.67 (t, J=7.64 Hz, 4H), 2.09-2.15 (m, 4H), 1.57-1.64 (m, 4H), 1.47-1.53 (m, 4H).

¹³C-NMR (100 MHz, CDCl₃): δ (ppm)=141.19, 138.67, 133.79, 123.08, 114.60, 35.36, 33.54, 29.28, 28.56.

Under a nitrogen gas atmosphere, the compound Mc2 (11.66 g, 29.1 mmol) was dissolved in tetrahydrofuran (220 mL), the solution was cooled to −75° C., and sec-butyllithium (94 mL, 131.1 mmol) was dropped over a period of 2 hours at an internal temperature of −65° C. or lower, and the mixture was stirred for 5.5 hours at an internal temperature of −65° C. or lower. Into the reaction solution, isopropyl pinacol borate (30 mL, 145.7 mmol) was dropped over a period of 30 minutes at −70° C. The reaction solution was warmed to room temperature and stirred overnight. Then, the reaction solution was cooled to 0° C., a 2 mol/L hydrochloric acid diethyl ether solution was dropped until the reaction solution became transparent. The product was extracted with diethyl ether, and concentrated under reduced pressure to remove the solvent, to give a solid. Acetonitrile (150 mL) was added to this solid, and the mixture was stirred at room temperature for 2 hours, and the obtained solid was filtered. Acetonitrile (100 mL) was added again to this solid, followed by stirring at room temperature for 2 hours, and further, recrystallization with acetonitrile was performed twice, to obtain 3.60 g of the intended monomer 3. The HPLC area percentage value of the monomer 3 was 99.90%. The filtrates of acetonitrile at the time of recrystallization were combined and recrystallization with acetonitrile was performed twice, to obtain 1.4 g of a monomer 3.

$^1$H-NMR (500 MHz, THF-d8): δ (ppm)=7.53 (s, 2H), 5.83 (m, 2H), 4.99 (d, 2H), 4.90 (d, 2H), 2.82 (t, 4H), 2.07 (m, 4H), 1.56 (m, 4H), 1.45 (m, 4H), 1.33 (s, 24H).

<Synthesis Example 4> Synthesis of Polymer Compound 1

An inert gas atmosphere was prepared in a reaction vessel, then, the monomer 1 (0.49334 g), the monomer 2 (0.12976 g), the monomer 3 (0.06195 g), the monomer 4 (1.14646 g), dichlorobis (tris-o-methoxyphenylphosphine)palladium (2.20 mg) and toluene (30 mL) were added and heated at 105° C.

A 20 wt % tetraethylammonium hydroxide aqueous solution (8.3 mL) was dropped thereto, and the mixture was refluxed for 6 hours. Thereafter, phenylboronic acid (61.0 mg) and dichlorobis(triphenylphosphine)palladium (1.1 mg) were added and the mixture was refluxed for 14.5 hours. Thereafter, an aqueous sodium diethyldithiocarbamate solution was added thereto, and the mixture was stirred at 80° C. for 2 hours. After cooling, the reaction solution was washed with water twice, with a 3 wt % acetic acid aqueous solution twice and with water twice, and the resultant solution was dropped into methanol, to cause generation of a precipitate. The obtained precipitate was dissolved in toluene and purified by passing through an alumina column and a silica gel column in this order. The resultant solution was dropped into methanol, and the mixture was stirred, then, the resultant precipitate was isolated by filtration and dried, to obtain 1.05 g of a polymer compound 1. The polystyrene-equivalent number-average molecular weight of the polymer compound 1 was $2.4 \times 10^4$, and the polystyrene-equivalent weight-average molecular weight thereof was $1.8 \times 10^5$.

The polymer compound 1 is a copolymer constituted of a constitutional unit derived from the monomer 1, a constitutional unit derived from the monomer 2, a constitutional unit derived from the monomer 3 and a constitutional unit derived from the monomer 4 at a molar ratio of 40:5:5:50 according to the theoretical values calculated from the amounts of the charged raw materials.

<Synthesis Example 5> Synthesis of Metal Complex 1

[Chemical Formula 72]

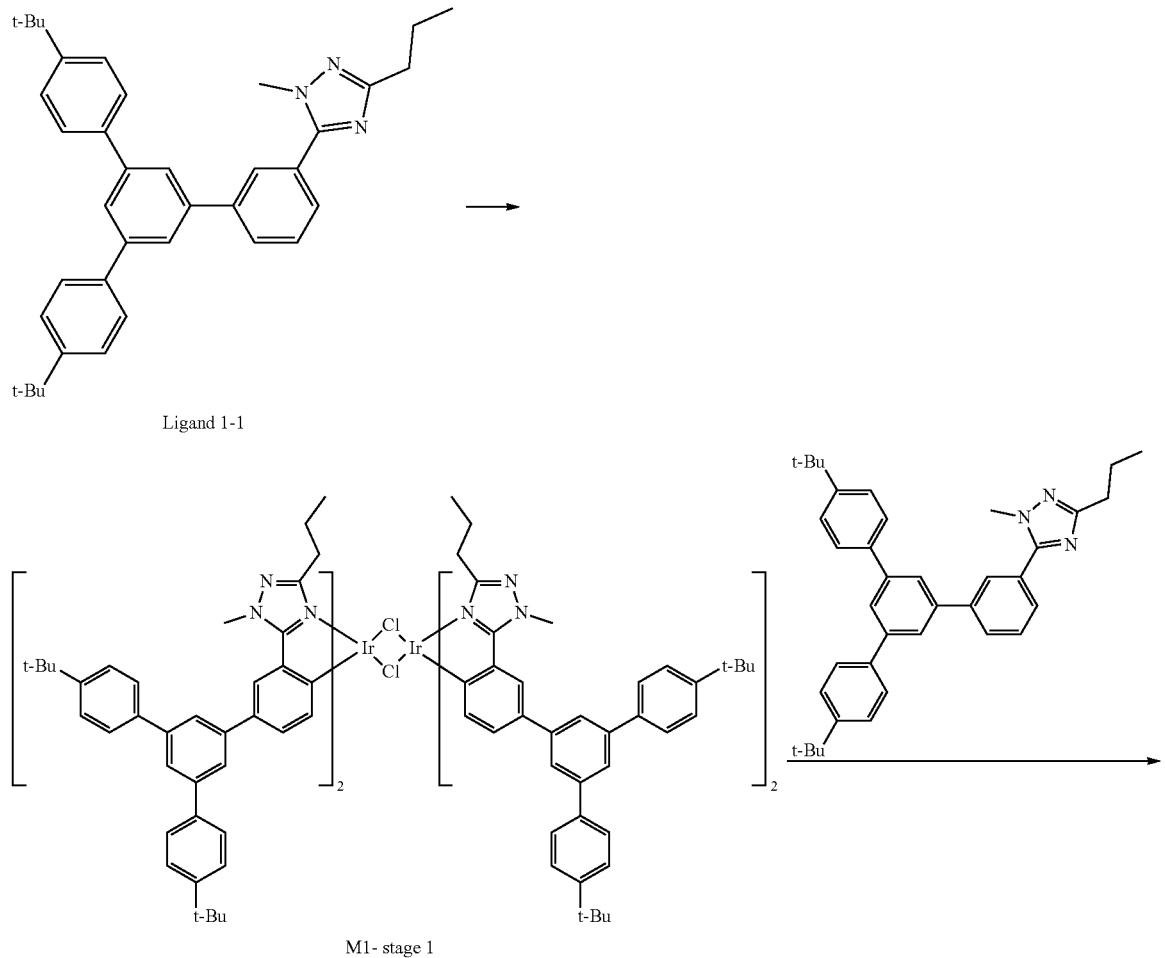

Ligand 1-1

M1- stage 1

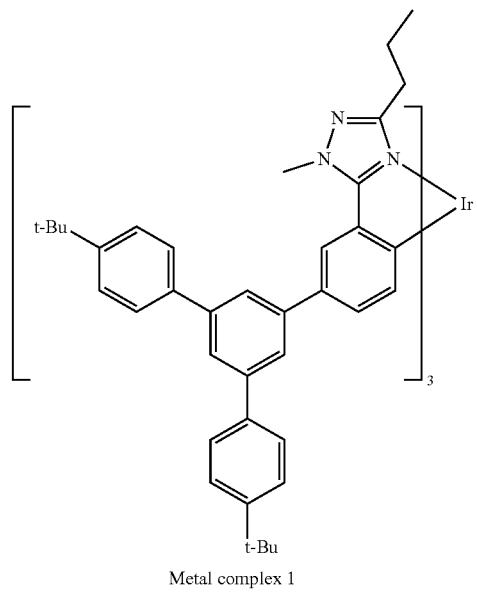

Metal complex 1

Into a reaction vessel, 226 mg of iridium chloride, 760 mg of Ligand 1-1 (synthesized according to the method described in JP-A No. 2013-147551), 2 mL of water and 6 mL of 2-butoxyethanol were added, and a nitrogen atmosphere was prepared in the reaction vessel, then, the mixture was refluxed with heating for 17 hours. The resultant reaction mixture was allowed to cool, then, water and dichloromethane were added, and the organic layer was washed. The washed organic layer was concentrated and dried, to obtain 840 mg of M1-stage1. Into the reaction vessel, 840 mg of the resultant M1-stage1 and 1300 mg of Ligand 1-1 were added, and an argon gas atmosphere was prepared in the reaction vessel. Thereafter, 165 mg of silver trifluorosulfonate and 1.25 mL of diethylene glycol dimethyl ester were added thereto, and the mixture was refluxed with heating for 15 hours. The resultant reaction mixture was allowed to cool, then, dichloromethane was added and the resultant suspension was filtered under suction. The resultant filtrate was separated by a separatory funnel, and the resultant organic layer was concentrated. The resultant concentrate was purified by silica gel column chromatography (a mixed solvent of dichloromethane and ethyl acetate), to give a yellow solid. The resulting yellow solid was crystallized using a mixed solvent of dichloromethane and methanol, then, crystallized using a mixed solvent of dichloromethane and hexane, to give 850 mg of a metal complex 1 as a yellow powder.

The results of $^1$H-NMR analysis are shown below.

$^1$H-NMR: δ (ppm)=7.82 (d, 3H), 7.75 (d, 6H), 7.72 (d, 3H), 7.62 (d, 12H), 7.48 ((dd, 3H), 1.96 (ddd, 3H), 7.20 (dd, 3H), 6.87 (d, 3H), 4.27 (s, 9H), 2.26-1.37 (s, 54H), 1.05 (m, 6H), 0.73 (t, 9H).

The LC analysis conditions are as follows.

The sample was diluted with toluene so that the metal complex concentration was 0.2 wt % to 0.3 wt %, and analyzed.

Apparatus: LC-20A (manufactured by Shimadzu Corporation)

Column: SUMIPAX ODS Z-CLUE (φ4.6×250 mm, 3 μm, manufactured by Sumika Chemical Analysis Service, Ltd.)

Column temperature: 15° C.

Detector: photodiode array detector (SPD-M20A, manufactured by Shimadzu Corporation)

Detection wavelength: 254 nm

Mobile phase: solution A: acetonitrile, solution B: THF

Conditions for mobile phase: solution B 0%—40 minutes—solution B 50% (10 minutes)—10 minutes—solution B 100%

Flow rate: 1.0 ml/min

Sample injection amount: 1 μL

The results of LC analysis are shown below.

When the LC purity was 99.79% and the content of the metal complex 1 was taken as 100, the total amount of metal complexes having a molecular weight larger by 16 than that of the metal complex 1 was 0.12. Metal complexes having a molecular weight larger by 32 or 48 than that of the metal complex 1 were undetected.

LC-MS (APCI, positive) m/z: 1815.0 ([M+H]$^+$)

<Synthesis Example 6> Synthesis of Metal Complex 2
[Chemical Formula 73]
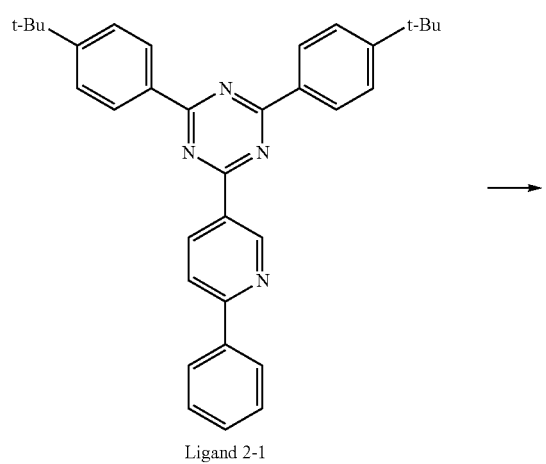
Ligand 2-1
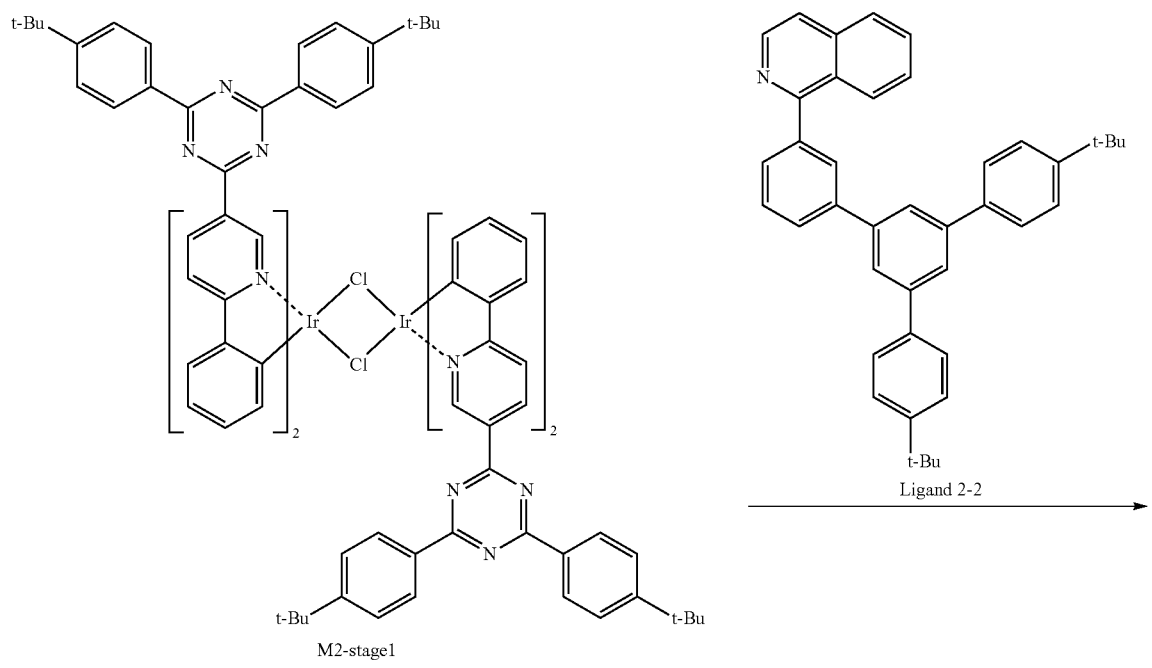

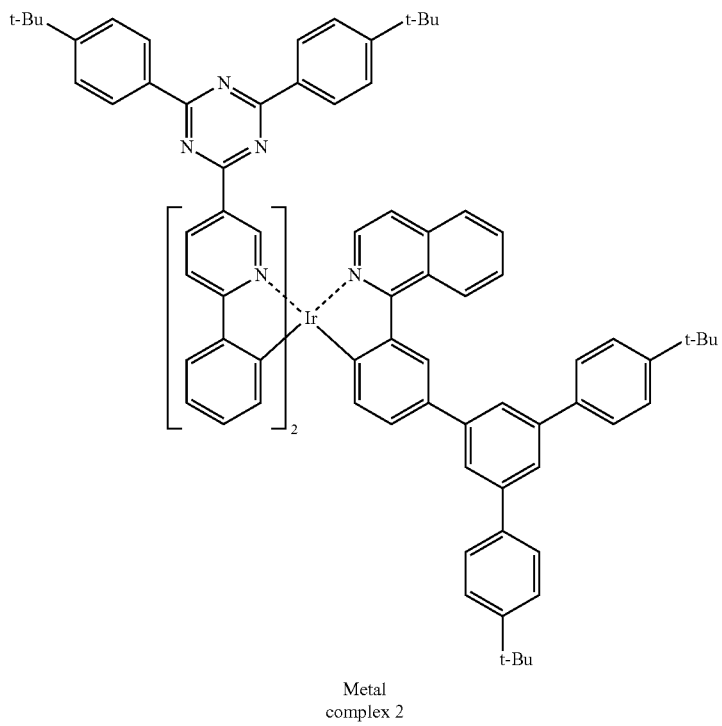

Metal complex 2

<Synthesis of M2-Stage1>

Into a reaction vessel, 22.17 g of Ligand 2-1 (synthesized according to the method described in JP-A No. 2011-105701), 6.95 g of iridium chloride trihydrate, 96 mL of 2-ethoxyethanol and 32 mL of water were added, an argon gas flow was prepared in the reaction vessel, then, the mixture was stirred at 140° C. for 15 hours. The resultant reaction mixture was allowed to cool, then, separated by filtration, and the resultant residue was washed with 150 mL of methanol, 100 mL of water and 150 mL of methanol in this order, to obtain a red solid. The resultant red solid was dissolved in 200 mL of chloroform, then, 300 mL of ethanol was added, and the mixture was refluxed for 2 hours. The resultant reaction mixture was allowed to cool, then, separated by filtration, and the resultant solid was washed with ethanol. Crystallization using a mixed solvent of chloroform and ethanol was repeated 3 times, then, the resultant solids were collected and dried under reduced pressure, to obtain 20.03 g of M2-stage1.

<Synthesis of Metal Complex 2>

Into a reaction vessel, 759 mg of M2-stage1, 330 mg of Ligand 2-2 (synthesized according to the method described in International Publication WO 2006/062226), 9 mL of diglyme and 157 mg of silver trifluoromethanesulfonate were added, an argon gas flow was prepared in the reaction vessel, then, the mixture was stirred at 100° C. for 10 hours. The resultant reaction mixture was allowed to cool, then, 50 mL of pure water was added, and the generated precipitate was separated by filtration. To the resultant precipitate, 40 mL of a mixed solvent of toluene and hexane (1/2 (volume ratio)) was added, then, the mixture was filtered. The resultant filtrate was dehydrated over sodium sulfate. The resultant solution was filtered, and the resultant solid was purified by silica gel column chromatography (a mixed solvent of hexane and toluene (1/1.5 (volume ratio))), then, the solvent was distilled off. The resultant residue was washed with 50 mL of methanol and dried under reduced pressure, to give 252 mg of a metal complex 2.

The LC analysis conditions are the same as those of the metal complex 1.

The results of LC analysis are shown below.

When the LC purity was 98.02% and the content of the metal complex 2 was taken as 100, the total amount of metal complexes having a molecular weight larger by 32 than that of the metal complex 2 was 0.12, and metal complexes having a molecular weight larger by 16 or 48 than that of the metal complex 2 were undetected.

LC-MS (APCI, positive) m/z: 1732.8 ([M+H]$^+$)

<Synthesis Example 7> Synthesis of Metal Complex 3
[Chemical Formula 74]
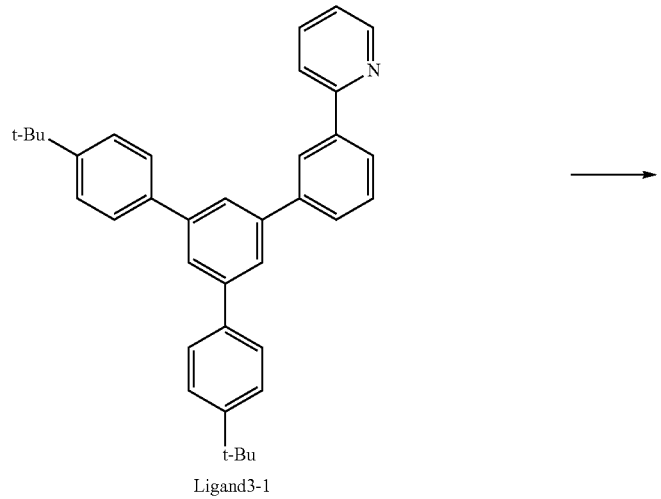
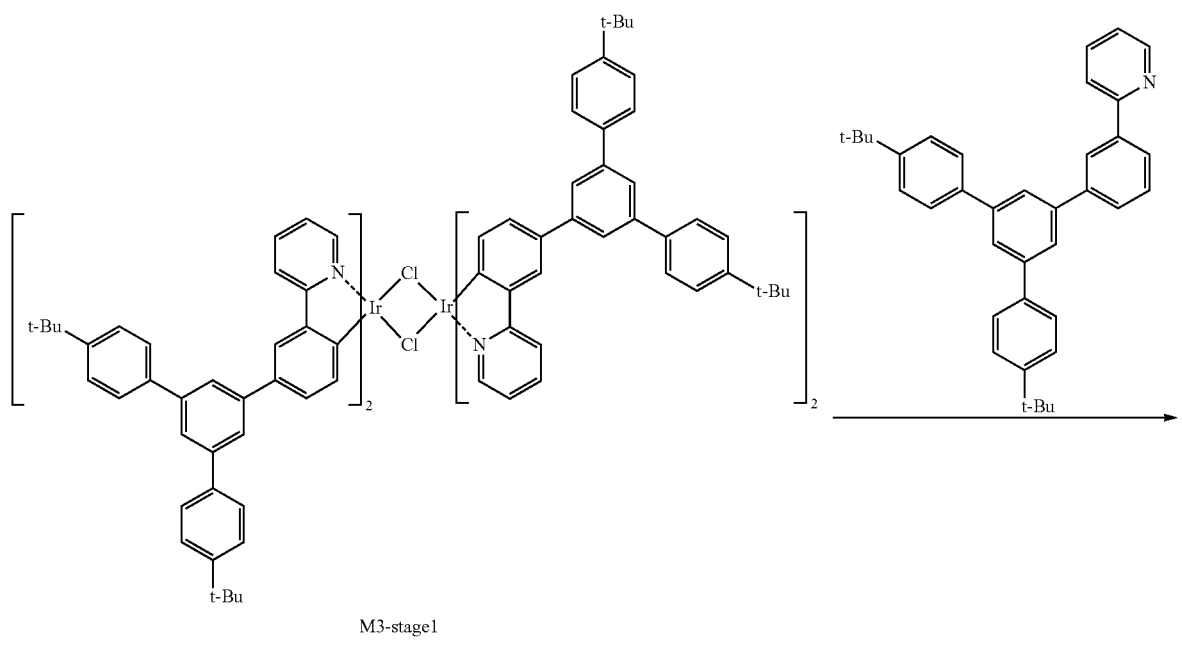

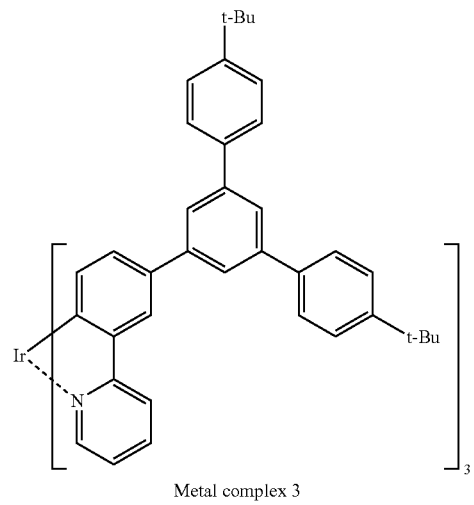

Metal complex 3

<Synthesis of M3-Stage1>

Into a reaction vessel, 13.0 g of Ligand 3-1 (synthesized according to the method described in International Publication WO 2008/111658), 4.12 g of iridium(III) chloride trihydrate, 290 ml of ethoxyethanol and 116 ml of water were added, then, the mixture was refluxed with heating for 23 hours. The resultant reaction mixture was cooled down to room temperature, then, 290 ml of methanol was added and the mixture was stirred at room temperature for 15 minutes, then, the deposited crystal was filtrated. The resultant crystal was washed with methanol, water and hexane in this order, then, dried under reduced pressure at 30° C., to obtain 13.11 g of M3-stage1.

<Synthesis of Metal Complex 3>

A nitrogen gas atmosphere was prepared in a reaction vessel, then, 13.11 g of M3-stage1, 13.48 g of Ligand 3-1, 2.77 g of silver trifluoromethanesulfonate and 130 ml of ethylene glycol dimethyl ether were added, and the mixture was stirred at 150° C. for 2 hours. The resultant reaction mixture was cooled down to room temperature, then, 1150 ml of methanol was added, and the mixture was stirred at room temperature for 30 minutes. The deposited crystal was filtrated, the resultant crystal was washed with methanol, then, dried under reduced pressure at 30° C., to obtain 15.60 g of a crude product. The resultant crude product was purified by silica gel column chromatography (a mixed solvent of toluene and hexane (2:1 (volume ratio))), to obtain 9.30 g of a metal complex 3.

The results of $^1$H-NMR analysis are shown below.

$^1$H-NMR: δ (ppm)=1.38 (s, 54H), δ 6.93 (dd, J=6.3, 6.6 Hz, 3H), δ 7.04 (br, 3H), δ 7.30 (d, J=7.9 Hz, 3H), δ 7.48 (d, J=7.3 Hz, 12H), δ 7.61-7.70 (m, 21H), δ 7.82 (s, 6H), δ 8.01 (s, 3H), δ 8.03 (d, J=7.9 Hz, 3H)

The LC analysis conditions are as follows.

The sample was diluted with toluene so that the metal complex concentration was 0.2 wt % to 0.3 wt %, and analyzed.

Apparatus: LC-20A (manufactured by Shimadzu Corporation)

Column: SUMIPAX ODS Z-CLUE (4 4.6×250 mm, 3 μm, manufactured by Sumika Chemical Analysis Service, Ltd.)

Column temperature: 15° C.

Detector: photodiode array detector (SPD-M20A, manufactured by Shimadzu Corporation)

Detection wavelength: 254 nm

Mobile phase: solution A: acetonitrile, solution B: THF

Conditions for mobile phase: solution B 10% (0 min)—50 min—solution B 20% (0 min)—10 min—solution B 50% (0 min)—20 min—100% (0 min)

Flow rate: 1.0 ml/min

Sample injection amount: 1 μL

The results of LC analysis are shown below.

When the LC purity was 99.95% and the content of the metal complex 3 was taken as 100, the total amount of metal complexes having a molecular weight larger by 16 than that of the metal complex 3 was 0.01, and metal complexes having a molecular weight larger by 32 or 48 than that of the metal complex 3 were undetected.

LC-MS (APCI, positive) m/z: 1676.7 ([M+H]$^+$)

<Example 1> Fabrication and Evaluation of Light Emitting Device 1

An ITO film having a thickness of 45 nm was attached to a glass substrate by a sputtering method, to form an anode. On the anode, a polythiophene-sulfonic acid type hole injecting agent (AQ-1200, manufactured by Plextronics Co., Ltd.) was spin-coated to form a film with a thickness of 35 nm, and the film was heated on a hot plate at 170° C. for 15 minutes under an air atmosphere, to form a hole injection layer.

The polymer compound 1 was dissolved in xylene at a concentration of 0.7% by weight. The resultant xylene solution was spin-coated on the hole injection layer to form a film with a thickness of 20 nm, and the film was heated on a hot plate at 180° C. for 60 minutes under a nitrogen gas atmosphere, to form a hole transporting layer.

A host compound 1 (manufactured by Luminescense Technology) and the metal complex 1 (host compound 1/metal complex 1=70 wt %/30 wt %) were dissolved in toluene at a concentration of 2.0% by weight. The resultant toluene solution (hereinafter, referred to as "toluene solution A") was stored in a glove box purged with a nitrogen gas for 2 weeks under light shielding at ambient temperature. Thereafter, the stored toluene solution was spin-coated on the hole transporting layer to form a film with a thickness of 80 nm, and the film was heated at 130° C. for 10 minutes under a nitrogen gas atmosphere, to form a light emitting layer.

In the LC analysis immediately before formation of the light emitting layer (film), when the content of the metal complex 1 in the toluene solution A was taken as 100, the total amount of metal complexes having a molecular weight larger by 16 than that of the metal complex 1 was 0.02, and metal complexes having a molecular weight larger by 32 or 48 than that of the metal complex 1 were undetected.

A polymer compound 2 synthesized according to the synthesis method described in International Publication WO 2010/117075 was dissolved in 2,2,3,3,4,4,5,5-octafluoro-1-pentanol at a concentration of 0.25% by weight. The resultant solution was spin-coated on the light emitting layer to form a film with a thickness of 10 nm, and the film was heated at 130° C. for 10 minutes under a nitrogen gas atmosphere, to form an electron transporting layer.

The substrate carrying thereon the light emitting layer formed was placed in a vapor deposition machine and the inner pressure was reduced to $1.0 \times 10^{-4}$ Pa or less, then, as a cathode, sodium fluoride was vapor-deposited with a thickness of about 4 nm on the light emitting layer, then, aluminum was vapor-deposited with a thickness of about 80 nm on this. After vapor deposition, sealing with a glass substrate was performed, to fabricate a light emitting device 1.

When voltage was applied to the light emitting device 1, EL emission was observed. The results are shown in Table 2.

[Chemical Formula 75]

Host compound 1

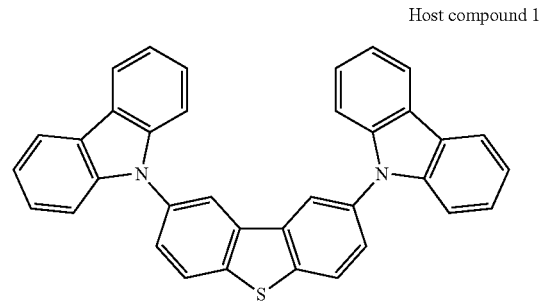

Polymer compound 2

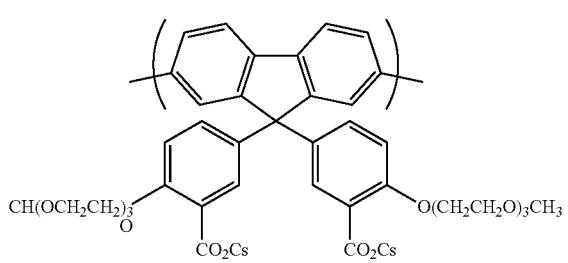

Metal complex 1

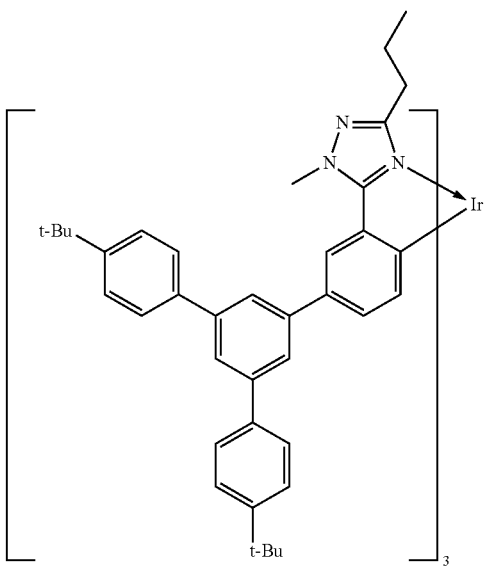

<Example 2> Fabrication and Evaluation of Light Emitting Device

A light emitting device 2 was fabricated in the same manner as in Example 1, except that the storage period of the toluene solution A was changed from 2 weeks to 4 weeks in Example 1.

In the LC analysis immediately before formation of the light emitting layer (film), when the content of the metal complex 1 in the toluene solution A was taken as 100, the total amount of metal complexes having a molecular weight larger by 16 than that of the metal complex 1 was 0.02, and metal complexes having a molecular weight larger by 32 or 48 than that of the metal complex 1 were undetected.

When voltage was applied to the light emitting device 2, EL emission was observed. The results are shown in Table 2.

<Comparative Example 1> Fabrication and Evaluation of Light Emitting Device C1

A light emitting device C1 was fabricated in the same manner as in Example 1, except that the toluene solution A was not stored in Example 1.

In the LC analysis immediately before formation of the light emitting layer (film), when the content of the metal complex 1 in the toluene solution A was taken as 100, the total amount of metal complexes having a molecular weight larger by 16 than that of the metal complex 1 was 0.02, and metal complexes having a molecular weight larger by 32 or 48 than that of the metal complex 1 were undetected.

A light emitting device C1 was fabricated in the same manner as in Example 1, except that the toluene solution A was used without storage in Example 1.

When voltage was applied to the light emitting device C1, EL emission was observed. The results are shown in Table 2.

<Comparative Example 2> Fabrication and Evaluation of Light Emitting Device C2

A light emitting device C2 was fabricated in the same manner as in Example 1, except that the toluene solution A was stored in a glove box purged with a nitrogen gas for 1 week under fluorescent illumination at ambient temperature instead of storage of the toluene solution A in a glove box purged with a nitrogen gas for 2 weeks under light shielding in Example 1.

In the LC analysis immediately before formation of the light emitting layer (film), when the content of the metal complex 1 in the toluene solution A was taken as 100, the total amount of metal complexes having a molecular weight larger by 16 than that of the metal complex 1 was 0.49, and metal complexes having a molecular weight larger by 32 or 48 than that of the metal complex 1 were undetected.

When voltage was applied to the light emitting device C2, EL emission was observed. The results are shown in Table 2.

<Comparative Example 3> Fabrication and Evaluation of Light Emitting Device C3

A light emitting device C3 was fabricated in the same manner as in Example 1, except that the toluene solution A was stored in a glove box purged with a nitrogen gas for 4 weeks under fluorescent illumination at ambient temperature instead of storage of the toluene solution A in a glove box purged with a nitrogen gas for 2 weeks under light shielding in Example 1.

In the LC analysis immediately before formation of the light emitting layer (film), when the content of the metal complex 1 in the toluene solution A was taken as 100, the total amount of metal complexes having a molecular weight larger by 16 than that of the metal complex 1 was 0.71, and metal complexes having a molecular weight larger by 32 or 48 than that of the metal complex 1 were undetected.

When voltage was applied to the light emitting device C3, EL emission was observed. The results are shown in Table 2.

The evaluation results are shown in Table 2. The relative value of the external quantum efficiency (maximum value) of each light emitting device is shown when the external quantum efficiency (maximum value) of the light emitting device C1 is taken as 1.00.

TABLE 2

| light emitting device | ink storage condition | the total amount of metal complexes having a molecular weight larger by 16 than that of a metal complex of which content is taken as 100 | value of formula (1) | value of formula (2) | external quantum efficiency (relative value) |
|---|---|---|---|---|---|
| 1 | light shielded for 2 weeks/under nitrogen gas atmosphere | 0.02 | 1 | 0.0002 | 1.08 |
| 2 | light shielded for 4 weeks/under nitrogen gas atmosphere | 0.02 | 1 | 0.0002 | 1.14 |
| C1 | no storage | 0.02 | — | — | 1.00 |
| C2 | irradiated for 1 week/under nitrogen gas atmosphere | 0.49 | 25 | 0.0049 | 1.01 |
| C3 | irradiated for 4 weeks/under nitrogen gas atmosphere | 0.71 | 36 | 0.0071 | 0.48 |

<Example 3> Fabrication and Evaluation of Light Emitting Device 3

An ITO film having a thickness of 45 nm was attached to a glass substrate by a sputtering method, to form an anode. On the anode, a polythiophene-sulfonic acid type hole injecting agent (AQ-1200, manufactured by Plextronics Co., Ltd.) was spin-coated to form a film with a thickness of 35 nm, and the film was heated on a hot plate at 170° C. for 15 minutes under an air atmosphere, to form a hole injection layer.

The polymer compound 1 was dissolved in xylene at a concentration of 0.7% by weight. The resultant xylene solution was spin-coated on the hole injection layer to form a film with a thickness of 20 nm, and the film was heated on a hot plate at 180° C. for 60 minutes under a nitrogen gas atmosphere, to form a hole transporting layer.

A host compound 2 synthesized according to the synthesis method described in JP-A No. 2015-110751 and the metal complex 2 (host compound 2/metal complex 2=90 wt %/10 wt %) were dissolved in toluene at a concentration of 2.2% by weight. The resultant toluene solution (hereinafter, referred to as "toluene solution B") was stored in a glove box purged with a nitrogen gas for 1 week under light shielding at ambient temperature. Thereafter, the stored toluene solution was spin-coated on the hole transporting layer to form a film with a thickness of 80 nm, and the film was heated at 130° C. for 10 minutes under a nitrogen gas atmosphere, to form a light emitting layer.

In the LC analysis immediately before formation of the light emitting layer (film), when the content of the metal complex 2 in the toluene solution B was taken as 100, the total amount of metal complexes having a molecular weight larger by 32 than that of the metal complex 2 was 0.10, and metal complexes having a molecular weight larger by 16 or 48 than that of the metal complex 2 were undetected.

The substrate carrying thereon the light emitting layer formed was placed in a vapor deposition machine and the inner pressure was reduced to $1.0 \times 10^{-4}$ Pa or less, then, as a cathode, sodium fluoride was vapor-deposited with a thickness of about 4 nm on the light emitting layer, then, aluminum was vapor-deposited with a thickness of about 80 nm on this. After vapor deposition, sealing with a glass substrate was performed, to fabricate a light emitting device 3.

When voltage was applied to the light emitting device 3, EL emission was observed. The results are shown in Table 3.

[Chemical Formula 76]

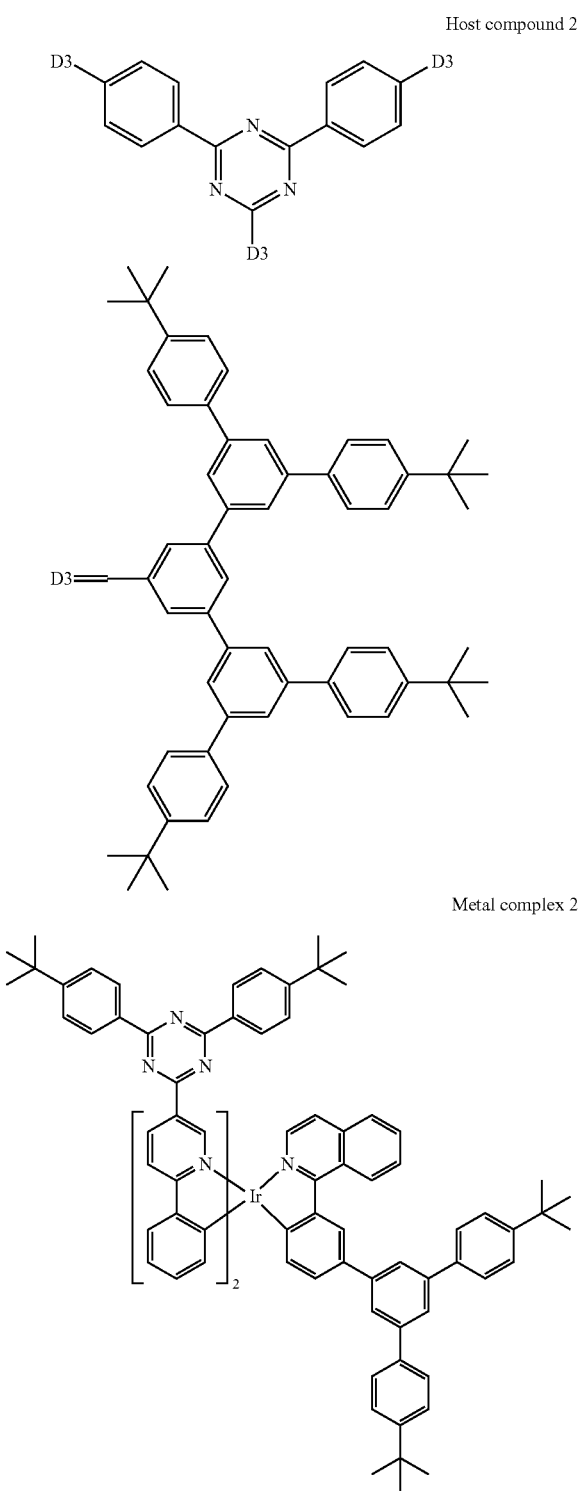

Host compound 2

Metal complex 2

<Example 4> Fabrication and Evaluation of Light Emitting Device 4

A light emitting device 4 was fabricated in the same manner as in Example 3, except that the storage period of the toluene solution B was changed from 1 week to 2 weeks in Example 3.

In the LC analysis immediately before formation of the light emitting layer (film), when the content of the metal complex 2 in the toluene solution B was taken as 100, the total amount of metal complexes having a molecular weight larger by 32 than that of the metal complex 2 was 0.10, and metal complexes having a molecular weight larger by 16 or 48 than that of the metal complex 2 were undetected.

When voltage was applied to the light emitting device 4, EL emission was observed. The results are shown in Table 3.

<Comparative Example 4> Fabrication and Evaluation of Light Emitting Device C4

A light emitting device C4 was fabricated in the same manner as in Example 3, except that the toluene solution B was not stored in Example 3.

In the LC analysis immediately before formation of the light emitting layer (film), when the content of the metal complex 2 in the toluene solution B was taken as 100, the total amount of metal complexes having a molecular weight larger by 32 than that of the metal complex 2 was 0.12, and metal complexes having a molecular weight larger by 16 or 48 than that of the metal complex 2 were undetected.

When voltage was applied to the light emitting device C4, EL emission was observed. The results are shown in Table 3.

<Comparative Example 5> Fabrication and Evaluation of Light Emitting Device C5

A light emitting device C5 was fabricated in the same manner as in Example 3, except that the toluene solution B was stored in a glove box purged with a nitrogen gas for 1 week under fluorescent illumination at ambient temperature instead of storage of the toluene solution B in a glove box purged with a nitrogen gas for 1 week under light shielding at ambient temperature in Example 3.

In the LC analysis immediately before formation of the light emitting layer (film), when the content of the metal complex 2 in the toluene solution B was taken as 100, the total amount of metal complexes having a molecular weight larger by 32 than that of the metal complex 2 was 0.78, and metal complexes having a molecular weight larger by 16 or 48 than that of the metal complex 2 were undetected.

When voltage was applied to the light emitting device C5, EL emission was observed. The results are shown in Table 3.

<Comparative Example 6> Fabrication and Evaluation of Light Emitting Device C6

A light emitting device C6 was fabricated in the same manner as in Example 3, except that the toluene solution B was stored in a glove box purged with a nitrogen gas for 2 weeks under fluorescent illumination at ambient temperature instead of storage of the toluene solution B in a glove box purged with a nitrogen gas for 1 week under light shielding at ambient temperature in Example 3.

In the LC analysis immediately before formation of the light emitting layer (film), when the content of the metal complex 2 in the toluene solution B was taken as 100, the total amount of metal complexes having a molecular weight larger by 32 than that of the metal complex 2 was 3.48, and metal complexes having a molecular weight larger by 16 or 48 than that of the metal complex 2 were undetected.

When voltage was applied to the light emitting device C6, EL emission was observed. The results are shown in Table 3.

The evaluation results are shown in Table 3. The relative value of the external quantum efficiency (maximum value) of each light emitting device is shown when the external quantum efficiency (maximum value) of the light emitting device C4 is taken as 1.00.

TABLE 3

| light emitting device | ink storage condition | the total amount of metal complexes having a molecular weight larger by 32 than that of a metal complex of which content is taken as 100 | value of formula (1) | value of formula (2) | external quantum efficiency (relative value) |
|---|---|---|---|---|---|
| 3 | light shielded for 1 week/under nitrogen gas atmosphere | 0.10 | 0.8 | 0.0010 | 1.11 |
| 4 | light shielded for 2 weeks/under nitrogen gas atmosphere | 0.10 | 0.8 | 0.0010 | 1.09 |
| C4 | no storage | 0.12 | — | — | 1.00 |
| C5 | irradiated for 1 week/under nitrogen gas atmosphere | 0.78 | 7 | 0.0078 | 0.85 |
| C6 | irradiated for 2 weeks/under nitrogen gas atmosphere | 3.48 | 29 | 0.0348 | 0.41 |

<Example 5> Fabrication and Evaluation of Light Emitting Device 5

An ITO film having a thickness of 45 nm was attached to a glass substrate by a sputtering method, to form an anode. On the anode, a polythiophene-sulfonic acid type hole injecting agent (AQ-1200, manufactured by Plextronics Co., Ltd.) was spin-coated to form a film with a thickness of 35 nm, and the film was heated on a hot plate at 170° C. for 15 minutes under an air atmosphere, to form a hole injection layer.

The polymer compound 1 was dissolved in xylene at a concentration of 0.7% by weight. The resultant xylene solution was spin-coated on the hole injection layer to form a film with a thickness of 20 nm, and the film was heated on a hot plate at 180° C. for 60 minutes under a nitrogen gas atmosphere, to form a hole transporting layer.

The host compound 1 and the metal complex 2 (host compound 1/metal complex 2=92.5 wt %/7.5 wt %) were dissolved in toluene at a concentration of 2.0% by weight. The resultant toluene solution (hereinafter, referred to as "toluene solution C") was stored for 2 weeks under light shielding at ambient temperature in an air atmosphere. Thereafter, the stored toluene solution was spin-coated on the hole transporting layer to form a film with a thickness of 80 nm, and the film was heated at 130° C. for 10 minutes under a nitrogen gas atmosphere, to form a light emitting layer.

In the LC analysis immediately before formation of the light emitting layer (film), when the content of the metal complex 2 in the toluene solution C was taken as 100, the total amount of metal complexes having a molecular weight larger by 32 than that of the metal complex 2 was 0.33, and metal complexes having a molecular weight larger by 16 or 48 than that of the metal complex 2 were undetected.

The substrate carrying thereon the light emitting layer formed was placed in a vapor deposition machine and the inner pressure was reduced to $1.0 \times 10^{-4}$ Pa or less, then, as a cathode, sodium fluoride was vapor-deposited with a thickness of about 4 nm on the light emitting layer, then, aluminum was vapor-deposited with a thickness of about 80 nm on the sodium fluoride layer. After vapor deposition, sealing with a glass substrate was performed, to fabricate a light emitting device 5.

When voltage was applied to the light emitting device 5, EL emission was observed. The results are shown in Table 4.

<Example 6> Fabrication and Evaluation of Light Emitting Device 6

A light emitting device 6 was fabricated in the same manner as in Example 5, except that the toluene solution C was stored for 5 hours under fluorescent illumination at ambient temperature in an air atmosphere, then, stored for 2 weeks under light shielding in an air atmosphere instead of storage of the toluene solution C for 2 weeks under light shielding at ambient temperature in an air atmosphere.

In the LC analysis immediately before formation of the light emitting layer (film), when the content of the metal complex 2 in the toluene solution C was taken as 100, the total amount of metal complexes having a molecular weight larger by 32 than that of the metal complex 2 was 0.51, and metal complexes having a molecular weight larger by 16 or 48 than that of the metal complex 2 were undetected.

When voltage was applied to the light emitting device 6, EL emission was observed. The results are shown in Table 4.

<Comparative Example 7> Fabrication and Evaluation of Light Emitting Device C7

A light emitting device C7 was fabricated in the same manner as in Example 5, except that the toluene solution C was not stored in Example 5.

In the LC analysis immediately before formation of the light emitting layer (film), when the content of the metal complex 2 in the toluene solution C was taken as 100, the total amount of metal complexes having a molecular weight larger by 32 than that of the metal complex 2 was 0.11, and metal complexes having a molecular weight larger by 16 or 48 than that of the metal complex 2 were undetected.

When voltage was applied to the light emitting device C7, EL emission was observed. The results are shown in Table 4.

<Comparative Example 8> Fabrication and Evaluation of Light Emitting Device C8

A light emitting device C8 was fabricated in the same manner as in Example 5, except that the toluene solution C was stored for 10 hours under fluorescent illumination at ambient temperature in an air atmosphere, then, stored for 2 weeks under light shielding in an air atmosphere instead of storage of the toluene solution C for 2 weeks under light shielding at ambient temperature in an air atmosphere.

In the LC analysis immediately before formation of the light emitting layer (film), when the content of the metal complex 2 in the toluene solution C was taken as 100, the total amount of metal complexes having a molecular weight larger by 32 than that of the metal complex 2 was 0.87, and metal complexes having a molecular weight larger by 16 or 48 than that of the metal complex 2 were undetected.

When voltage was applied to the light emitting device C8, EL emission was observed. The results are shown in Table 4.

The evaluation results are shown in Table 4. The relative value of the external quantum efficiency (maximum value) of each light emitting device is shown when the external quantum efficiency (maximum value) of the light emitting device C7 is taken as 1.00.

TABLE 4

| light emitting device | ink storage condition | the total amount of metal complexes having a molecular weight larger by 32 than that of a metal complex of which content is taken as 100 | value of formula (1) | value of formula (2) | external quantum efficiency (relative value) |
|---|---|---|---|---|---|
| 5 | light shielded for 2 weeks/ under air atmosphere | 0.33 | 3 | 0.0033 | 1.07 |
| 6 | irradiated for 5 hours, light shielded for 2 weeks/ under air atmosphere | 0.51 | 5 | 0.0051 | 1.06 |
| C7 | no storage | 0.11 | — | — | 1.00 |
| C8 | irradiated for 10 hours, light shielded for 2 weeks/ under air atmosphere | 0.87 | 8 | 0.0087 | 0.80 |

<Example 7> Fabrication and Evaluation of Light Emitting Device 7

An ITO film having a thickness of 45 nm was attached to a glass substrate by a sputtering method, to form an anode. On the anode, a polythiophene-sulfonic acid type hole injecting agent (AQ-1200, manufactured by Plextronics Co., Ltd.) was spin-coated to form a film with a thickness of 35 nm, and the film was heated on a hot plate at 170° C. for 15 minutes under an air atmosphere, to form a hole injection layer.

The polymer compound 1 was dissolved in xylene at a concentration of 0.7% by weight. The resultant xylene solution was spin-coated on the hole injection layer to form a film with a thickness of 20 nm, and the film was heated on a hot plate at 180° C. for 60 minutes under a nitrogen gas atmosphere, to form a hole transporting layer.

The host compound 2 and the metal complex 3 (host compound 2/metal complex 3=70 wt %/30 wt %) were dissolved in toluene at a concentration of 2.5% by weight.

The resultant toluene solution (hereinafter, referred to as "toluene solution D") was stored in a glove box purged with a nitrogen gas for 1 week under light shielding at ambient temperature. Thereafter, the stored toluene solution was spin-coated on the hole transporting layer to form a film with a thickness of 80 nm, and the film was heated at 130° C. for 10 minutes under a nitrogen gas atmosphere, to form a light emitting layer.

In the LC analysis immediately before formation of the light emitting layer (film), when the content of the metal complex 3 in the toluene solution D was taken as 100, the total amount of metal complexes having a molecular weight larger by 16 than that of the metal complex 3 was 0.02, and metal complexes having a molecular weight larger by 32 or 48 than that of the metal complex 3 were undetected.

The substrate carrying thereon the light emitting layer formed was placed in a vapor deposition machine and the inner pressure was reduced to $1.0 \times 10^{-4}$ Pa or less, then, as a cathode, sodium fluoride was vapor-deposited with a thickness of about 4 nm on the light emitting layer, then, aluminum was vapor-deposited with a thickness of about 80 nm on the sodium fluoride layer. After vapor deposition, sealing with a glass substrate was performed, to fabricate a light emitting device 7.

When voltage was applied to the light emitting device 7, EL emission was observed. The results are shown in Table 5.

<Example 8> Fabrication and Evaluation of Light Emitting Device 8

A light emitting device 8 was fabricated in the same manner as in Example 7, except that the storage period of the toluene solution D was changed from 1 week to 2 weeks in Example 7.

In the LC analysis immediately before formation of the light emitting layer (film), when the content of the metal complex 3 in the toluene solution B was taken as 100, the total amount of metal complexes having a molecular weight larger by 16 than that of the metal complex 3 was 0.01, and metal complexes having a molecular weight larger by 32 or 48 than that of the metal complex 3 were undetected.

When voltage was applied to the light emitting device 8, EL emission was observed. The results are shown in Table 5.

<Comparative Example 9> Fabrication and Evaluation of Light Emitting Device C9

A light emitting device C9 was fabricated in the same manner as in Example 7, except that the toluene solution D was not stored in Example 7.

In the LC analysis immediately before formation of the light emitting layer (film), when the content of the metal complex 3 in the toluene solution C was taken as 100, the total amount of metal complexes having a molecular weight larger by 16 than that of the metal complex 3 was 0.02, and metal complexes having a molecular weight larger by 32 or 48 than that of the metal complex 3 were undetected.

When voltage was applied to the light emitting device C9, EL emission was observed. The results are shown in Table 5.

TABLE 5

| light emitting device | ink storage condition | the total amount of metal complexes having a molecular weight larger by 16 than that of a metal complex of which content is taken as 100 | value of formula (1) | value of formula (2) | external quantum efficiency (relative value) |
|---|---|---|---|---|---|
| 7 | light shielded for 1 week/under nitrogen gas atmosphere | 0.02 | 1 | 0.0002 | 1.06 |
| 8 | light shielded for 2 weeks/under nitrogen gas atmosphere | 0.01 | 0.5 | 0.0001 | 1.07 |
| C9 | no storage | 0.02 | — | — | 1.00 |

INDUSTRIAL APPLICABILITY

According to the film production method or the like of the present invention, a film excellent in the external quantum efficiency when used for a light emitting layer of a light emitting device is obtained.

The invention claimed is:

1. A film production method comprising
an ink preparation step of preparing an ink comprising a metal complex represented by the formula (1-A) and an organic solvent,
an ink storage step of storing the ink prepared in the ink preparation step for 3 days or more under light shielding, and
a film formation step of forming a film by an application method using the ink stored in the ink storage step and in which the total content of metal complexes having a molecular weight larger by 16, 32 or 48 than that of the metal complex represented by the formula (1-A) according to the area percentage value determined by liquid chromatography is 0.2 or more and 0.6 or less when the content of the metal complex represented by the formula (1-A) according to the area percentage value determined by liquid chromatography is taken as 100:

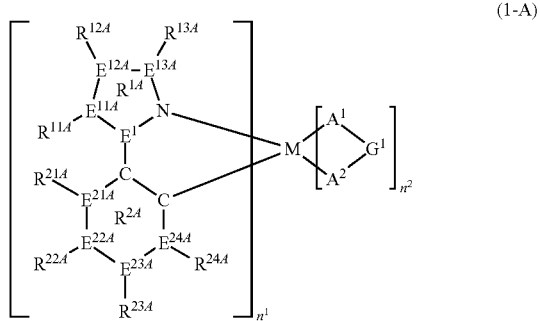

(1-A)

wherein
M represents an iridium atom or a platinum atom,
$n^1$ represents an integer of 1 or more, $n^2$ represents an integer of 0 or more, and $n^1+n^2$ is 2 or 3, and $n^1+n^2$ is 3 when M is an iridium atom, while $n^1+n^2$ is 2 when M is a platinum atom, $E^1$ represents a carbon atom or a nitrogen atom, and when a plurality of $E^1$ are present, they may be the same or different, $E^{11A}$, $E^{12A}$, $E^{13A}$, $E^{21A}$, $E^{22A}$, $E^{23A}$ and $E^{24A}$ each independently represent a nitrogen atom or a carbon atom, and when a plurality of $E^{11A}$, $E^{12A}$, $E^{13A}$, $E^{21A}$, $E^{22A}$, $E^{23A}$ and $E^{24A}$ are present, they may be the same or different at each occurrence, and when $E^{11A}$ is a nitrogen atom, $R^{11A}$ may be either present or not present, when $E^{12A}$ is a nitrogen atom, $R^{12A}$ may be either present or not present, when $E^{13A}$ is a nitrogen atom, $R^{13A}$ may be either present or not present, when $E^{21A}$ is a nitrogen atom, $R^{21A}$ is not present, when $E^{22A}$ is a nitrogen atom, $R^{22A}$ is not present, when $E^{23A}$ is a nitrogen atom, $R^{23A}$ is not present, and when $E^{24A}$ is a nitrogen atom, $R^{24A}$ is not present, $R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, or $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each are combined together to form an aromatic ring together with the atoms to which they are attached, and the group represented by $R^{11A}$, $R^{12A}$, $R^{13A}$, $R^{21A}$, $R^{22A}$, $R^{23A}$ or $R^{24A}$ optionally has a substituent, and when a plurality of $R^{11A}$, $R^{12A}$, $R^{13A}$, $R^{21A}$, $R^{22A}$, $R^{23A}$ and $R^{24A}$ are present, they may be the same or different at each occurrence, and $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with the atoms to which they are attached, the ring $R^{1A}$ represents a diazole ring or a triazole ring constituted of a nitrogen atom, $E^1$, $E^{11A}$, $E^{12A}$ and $E^{13A}$, the ring $R^{2A}$ represents a benzene ring, a pyridine ring or a diazine ring constituted of two carbon atoms, $E^{2A}$, $E^{22A}$, $E^{23A}$ and $E^{24A}$, and $A^1$-$G^1$-$A^2$ represents an anionic bidentate ligand, $A^1$ and $A^2$ each independently represent a carbon atom, an oxygen atom or a nitrogen atom, and these atoms each may be an atom constituting a ring, $G^1$ represents a single bond or an atomic group constituting the bidentate ligand together with $A^1$ and $A^2$, and when a plurality of $A^1$-$G^1$-$A^2$ are present, they may be the same or different.

2. The film production method according to claim 1, wherein the ink storage step is performed under the condition of 0° C. to 50° C.

3. The film production method according to claim 1, wherein the ink storage step is performed under an inert gas atmosphere.

4. The film production method according to claim 1, wherein the metal complex (1-A) is a metal complex represented by the formula (1-A1), a metal complex represented by the formula (1-A2), a metal complex represented by the formula (1-A3) or a metal complex represented by the formula (1-A4):

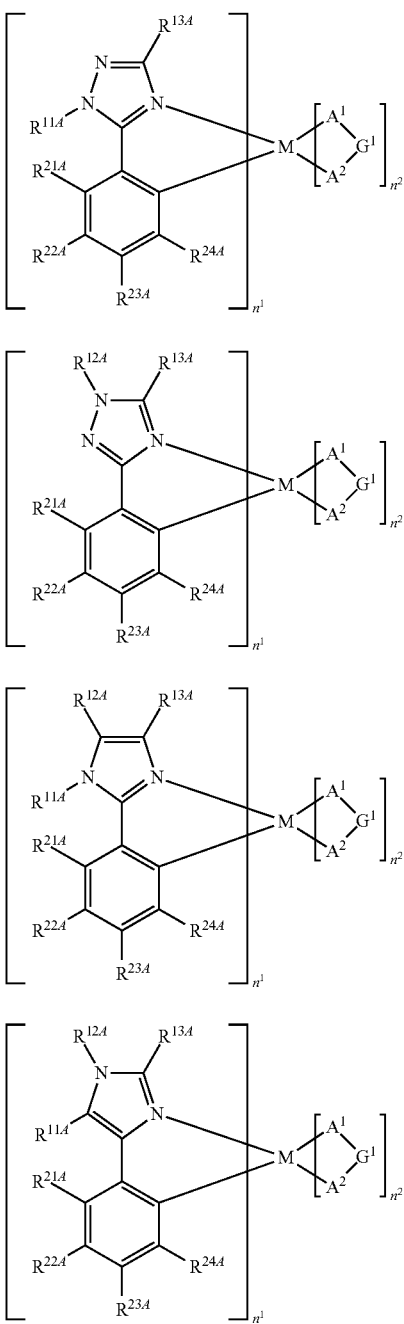

(1-A1)

(1-A2)

(1-A3)

(1-A4)

wherein
M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.

5. The film production method according to claim 1, wherein the ink further comprises a compound represented by the formula (H-1):

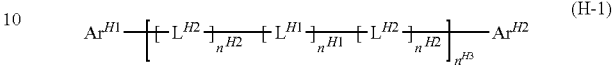

(H-1)

wherein
$Ar^{H1}$ and $Ar^{H2}$ each independently represent an aryl group or a monovalent heterocyclic group and these groups each optionally have a substituent,
$n^{H1}$ and $n^{H2}$ each independently represent 0 or 1, and when a plurality of $n^{H1}$ are present, they may be the same or different, and the plurality of $n^{H2}$ may be the same or different,
$n^{H3}$ represents an integer of 0 to 10,
$L^{H1}$ represents an arylene group, a divalent heterocyclic group or a group represented by —[C($R^{H11}$)$_2$]$n^{H11}$- and these groups each optionally have a substituent, and when a plurality of $L^{H1}$ are present, they may be the same or different,
$n^{H11}$ represents an integer of 1 to 10, and $R^{H11}$ represents a hydrogen atom, an alkyl group, a cycloalkyl group, an alkoxy group, a cycloalkoxy group, an aryl group or a monovalent heterocyclic group and these groups each optionally have a substituent, and the plurality of $R^{H11}$ may be the same or different and may be combined together to form a ring together with the carbon atoms to which they are attached,
$L^{H2}$ represents a group represented by —N(-$L^{H21}$-$R^{H21}$), and when a plurality of $L^{H2}$ are present, they may be the same or different, and
$L^{H21}$ represents a single bond, an arylene group or a divalent heterocyclic group and these groups each optionally have a substituent, and $R^{H21}$ represents a hydrogen atom, an alkyl group, a cycloalkyl group, an aryl group or a monovalent heterocyclic group and these groups each optionally have a substituent.

6. The film production method according to claim 1, wherein the ink further comprises a polymer compound comprising a constitutional unit represented by the formula (Y):

(Y)

wherein $Ar^{Y1}$ represents an arylene group, a divalent heterocyclic group or a divalent group in which at least one arylene group and at least one divalent heterocyclic group are bonded directly to each other, and these groups each optionally have a substituent.

* * * * *